US009287098B2

(12) United States Patent
Finley

(10) Patent No.: US 9,287,098 B2
(45) Date of Patent: Mar. 15, 2016

(54) CHARGE REMOVAL FROM ELECTRODES IN UNIPOLAR SPUTTERING SYSTEM

(71) Applicant: Advanced Energy Industries, Inc., Fort Collins, CO (US)

(72) Inventor: Kenneth W. Finley, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 94 days.

(21) Appl. No.: 14/184,968

(22) Filed: Feb. 20, 2014

(65) Prior Publication Data

US 2014/0231243 A1    Aug. 21, 2014

Related U.S. Application Data

(63) Continuation-in-part of application No. 13/867,907, filed on Apr. 22, 2013, now Pat. No. 9,129,776, which is a continuation-in-part of application No. 13/666,668, filed on Nov. 1, 2012.

(51) Int. Cl.
*H05B 39/00* (2006.01)
*H01J 37/34* (2006.01)
*H05H 1/46* (2006.01)

(52) U.S. Cl.
CPC .............. *H01J 37/3444* (2013.01); *H05H 1/46* (2013.01); *H05H 2001/4682* (2013.01)

(58) Field of Classification Search
CPC .............. H01J 37/3417; H01J 37/3438; H01J 37/3444; H01J 37/3467; H01J 37/3408; H01J 37/32174; H01J 37/32623; H05H 1/46
See application file for complete search history.

(56) References Cited

U.S. PATENT DOCUMENTS

| | | | |
|---|---|---|---|
| 2005/0092596 A1 | 5/2005 | Kouznetsov |
| 2008/0203070 A1 | 8/2008 | Ilic et al. |
| 2011/0011737 A1 | 1/2011 | Wu et al. |
| 2011/0075445 A1 | 3/2011 | Drummond et al. |
| 2011/0248633 A1 | 10/2011 | Nauman et al. |

FOREIGN PATENT DOCUMENTS

EP    2316123 B1    5/2014

OTHER PUBLICATIONS

Koh, Eugene, "International Search Report and Written Opninion re Application No. PCT/US2013/068033", Feb. 3, 2014, p. 17 Published in: AU.

Todd, Philip C., "Snubber Circuits: Theory, Design and Application", "Unitrode Corporation", May 1993, pp. 2-1 through 2-17, Publisher: Texas Instruments, Published in: US.

(Continued)

*Primary Examiner* — Douglas W Owens
*Assistant Examiner* — Monica C King
(74) *Attorney, Agent, or Firm* — Neugeboren O'Dowd PC

(57) ABSTRACT

This disclosure describes a non-dissipative snubber circuit configured to boost a voltage applied to a load after the load's impedance rises rapidly. The voltage boost can thereby cause more rapid current ramping after a decrease in power delivery to the load which results from the load impedance rise. In particular, the snubber can comprise a combination of a unidirectional switch, a voltage multiplier, and a current limiter. In some cases, these components can be a diode, voltage doubler, and an inductor, respectively.

21 Claims, 43 Drawing Sheets

(56) References Cited

OTHER PUBLICATIONS

Belkind, et al, "Characterization of pulsed do magnetron sputtering plasmas", Apr. 6, 2005, p. 19 Publisher: 10P Science, Published in: US.

Christie, et al., "High performance pulsed current source supplies for large area", Nov. 2, 2000, p. 12 Publisher: International Conference on Coatings on Glass, Published in: US.

Sittinger, et al., "Position and Time Resolved Optical Emission Spectroscopy and Film Properties of", 2007, p. 6, Publisher: Society of Vacuum Coaters, Published in: US.

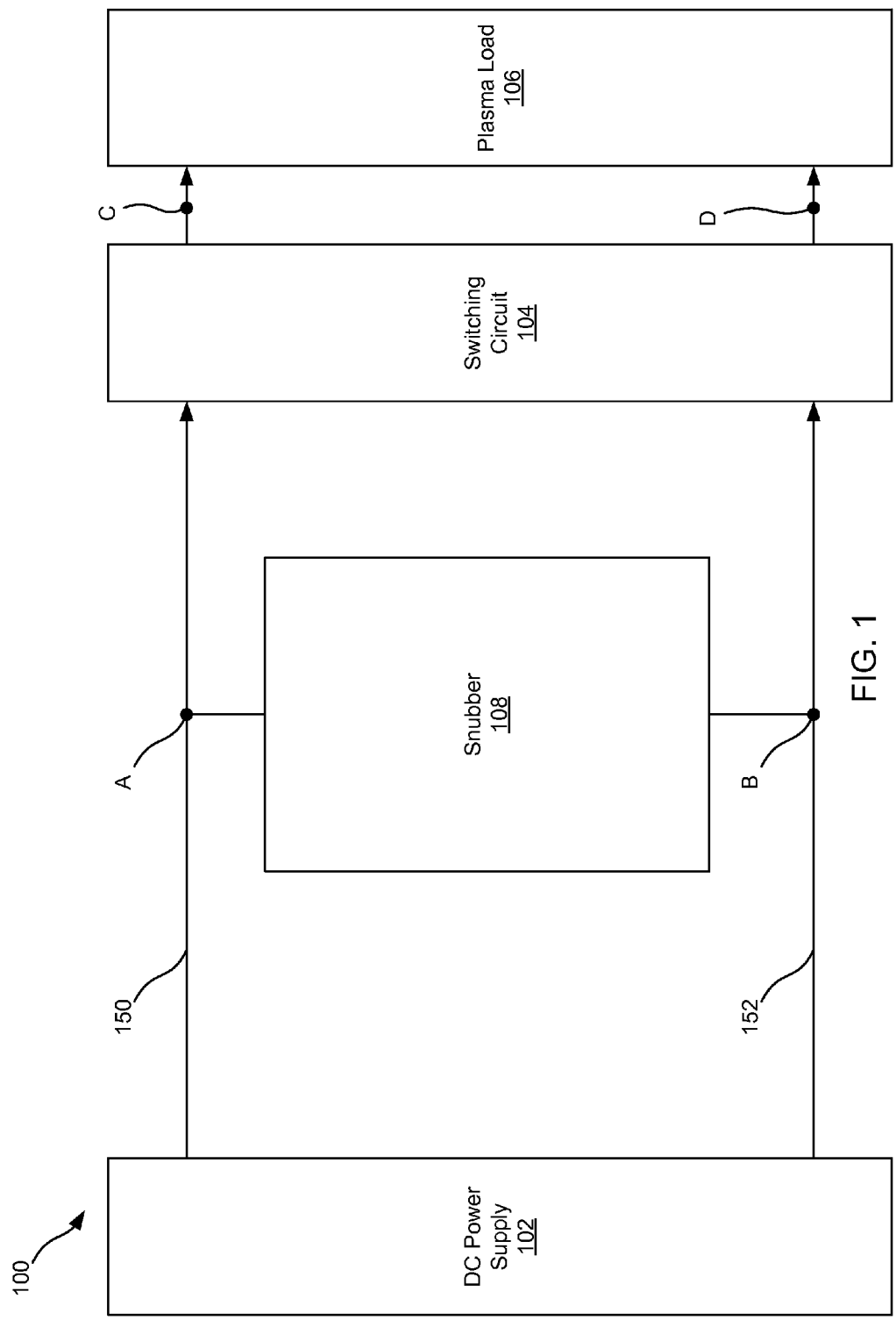

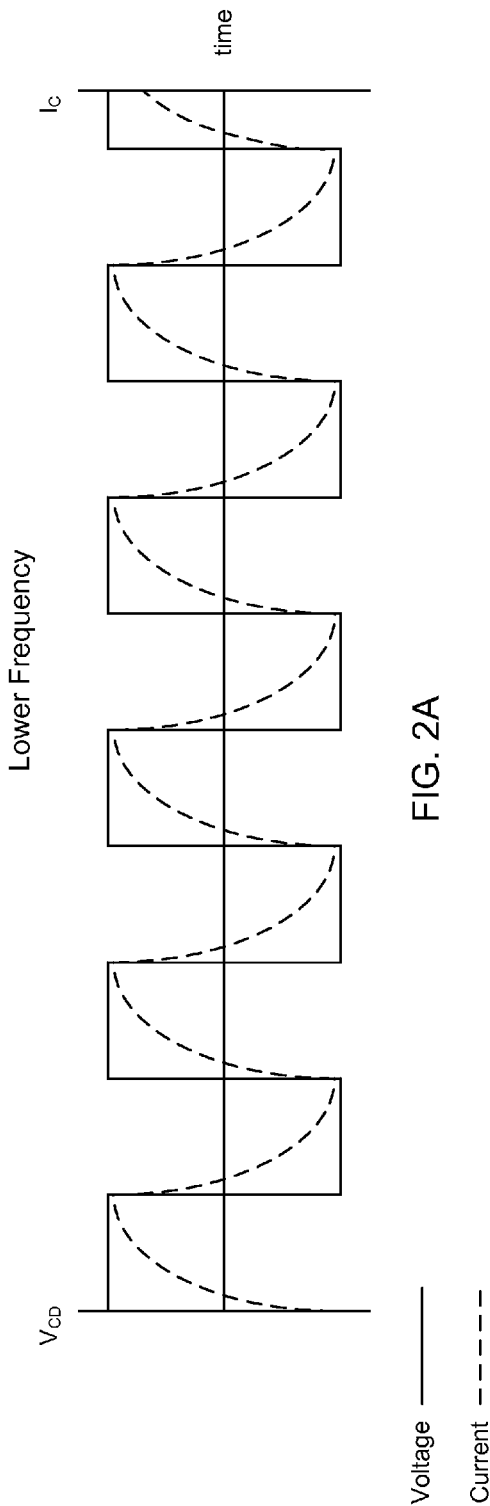
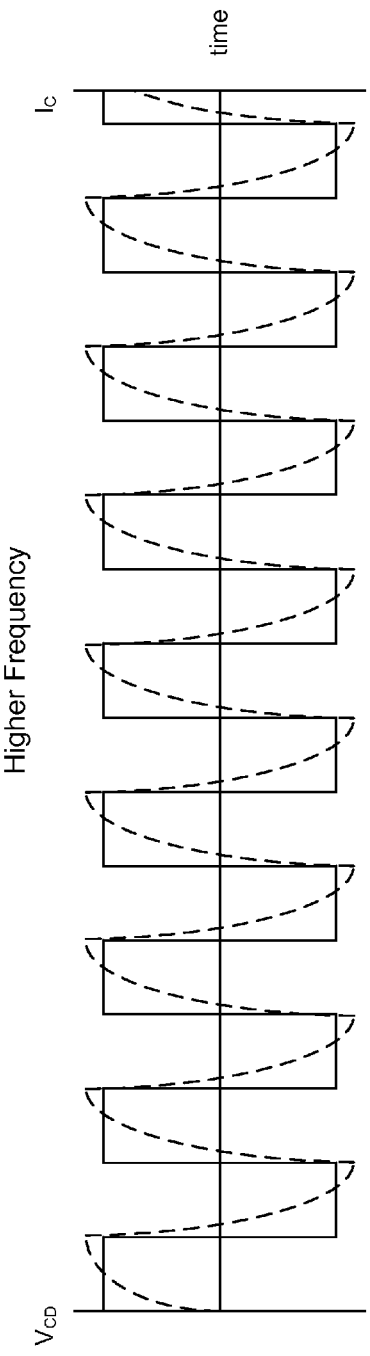
FIG. 2A — Lower Frequency
FIG. 2B — Higher Frequency
Voltage ——
Current - - -

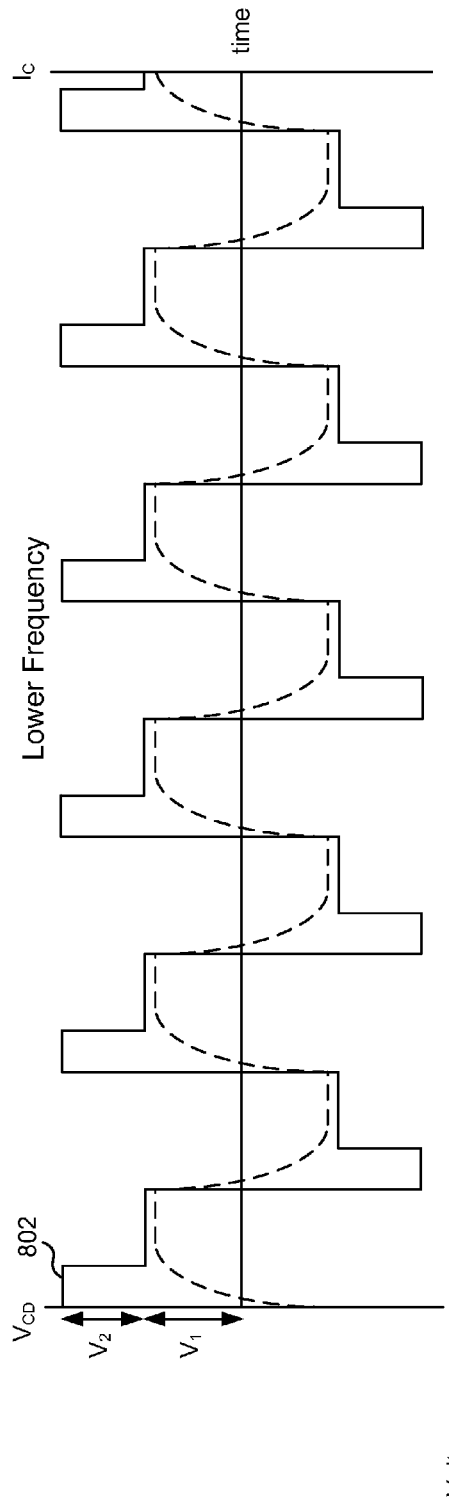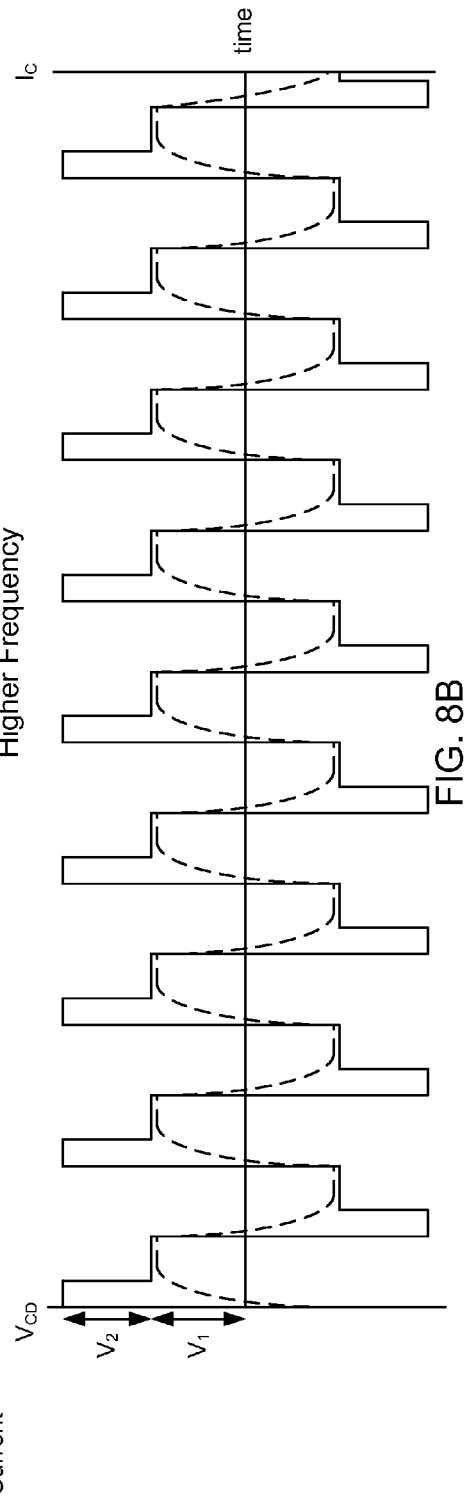

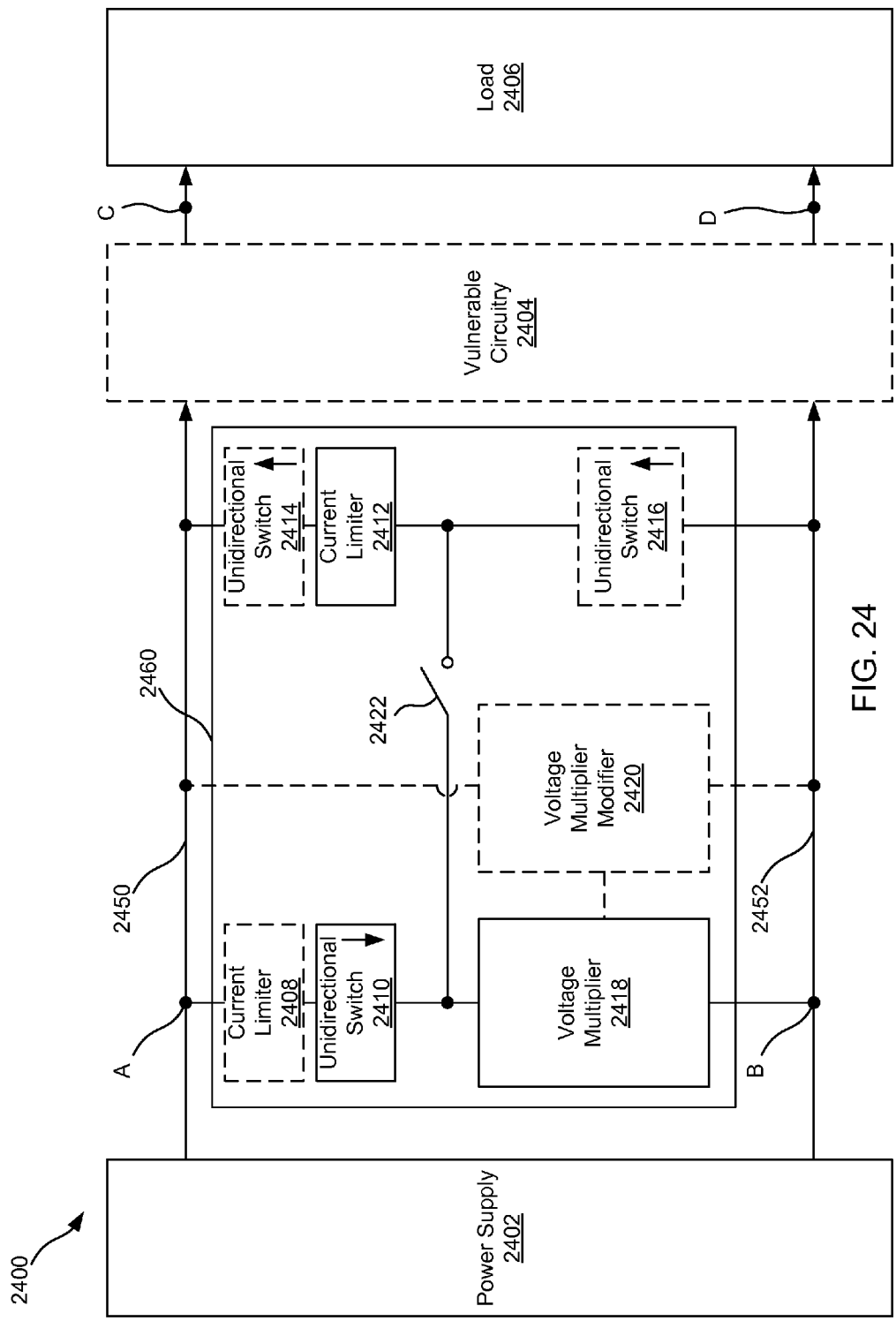

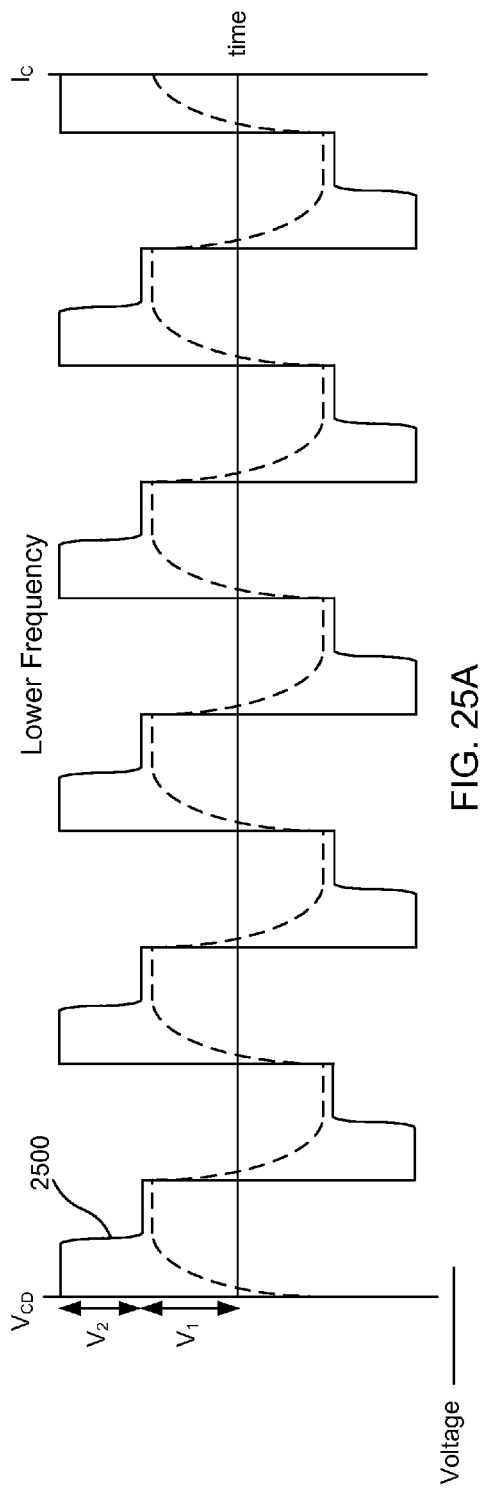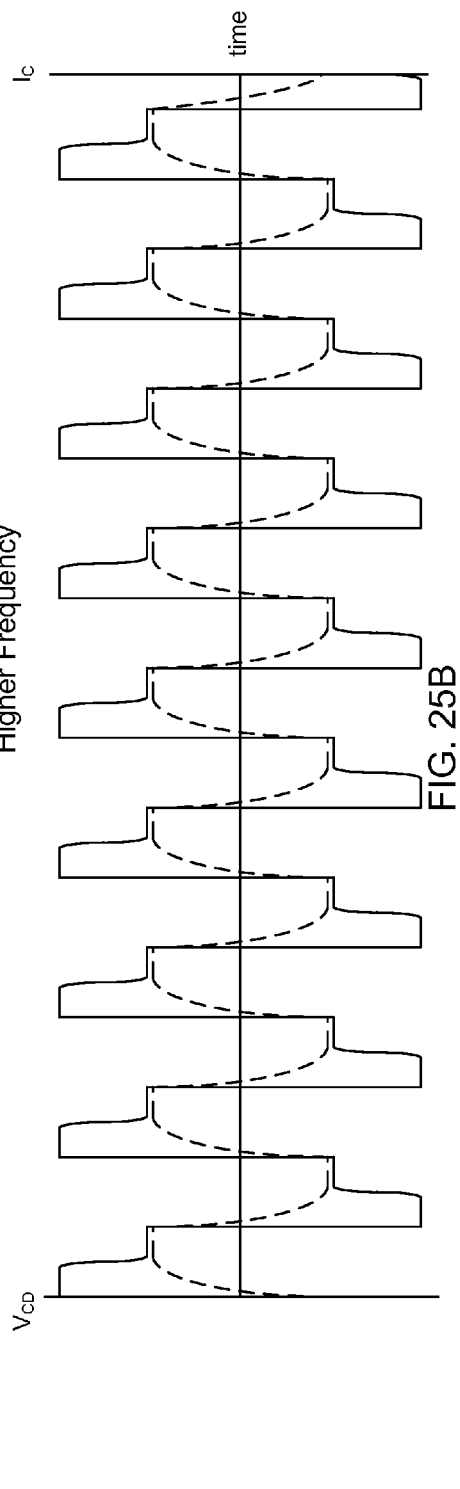

CHARGE REMOVAL FROM ELECTRODES IN UNIPOLAR SPUTTERING SYSTEM

CLAIM OF PRIORITY UNDER 35 U.S.C. §120

The present Application for Patent is a Continuation in Part of patent application Ser. No. 13/867,907 entitled "DIFFERENCE BOOST VOLTAGES APPLIED TO TWO OR MORE ANODELESS ELECTRODES FOR PLASMA PROCESSING," filed Apr. 22, 2013, which is a Continuation in Part of patent application Ser. No. 13/666,668 entitled "ADJUSTABLE NON-DISSIPATIVE VOLTAGE BOOSTING SNUBBER NETWORK" filed Nov. 1, 2012, all pending, and assigned to the assignee hereof and hereby expressly incorporated by reference herein.

FIELD OF THE DISCLOSURE

The present disclosure relates generally to power supplies. In particular, but not by way of limitation, the present disclosure relates to systems, methods and apparatuses for limiting voltage and current spikes in a power supply.

BACKGROUND

FIG. 1 illustrates one example of a typical power supply system 100 used for plasma processing. The power supply system 100 includes a DC power supply 102 providing DC power to a switching circuit 104 that converts the DC power into pulsed DC and provides the pulsed DC to a plasma load 106. When switching, the potential between nodes C and D passes through a potential of zero, and the plasma can be extinguished or can dim to an extent that it becomes highly resistive and acts like an unfluxed inductor or an open circuit for a short time after this transition. Immediately after this transition, the DC power supply 102 continues to provide power to the switching circuit 104, but most of that power can no longer be delivered to the plasma load 106. Instead, the power predominantly passes through the switching circuit 104 potentially damaging the switching circuit 104.

A snubber 108 can be used to mitigate damage to the switching circuit 104 by absorbing power from the DC power supply 102 during the period after the switching circuit 104 transitions through 0 V. However, existing snubbers are typically dissipative snubbers and/or dissipate significant power.

Additional challenges to known power supply systems include slow processing throughput and further inefficiencies from power dissipation. For instance, and as seen in FIG. 2A, while voltage between nodes C and D can switch with negligible ramp time, current ramps at a much slower pace thus providing an average power that is significantly lower than the power output from the DC power supply 102. This leads to longer processing periods and decreased throughput, since many processes can only end when a predetermined total power has been delivered.

There is also a desire to increase DC pulse frequency provided to the plasma load 106 since this reduces arcing. However, the above-noted problems become more acute at higher frequencies, as illustrated in FIG. 2B. Furthermore, since each pulse is shorter at higher frequency, the current at high frequency may end up larger (in a power-regulated system) than at lower frequency. Since power dissipation is proportional to $I^2$, these larger currents lead to larger power losses. Additionally, switching losses, which are proportional to the current at the moment of switching, are accentuated at higher frequencies since switching current is larger.

FIG. 28 illustrates a unipolar DC plasma processing system 2800 well known to those of skill in the art. The system 2800 includes a DC power source 2802, a sputtering cathode 2804, an anode 2806, and a substrate 2808. These elements can reside wholly or partially within a plasma sputtering chamber 2810. The sputtering cathode 2804 can act as an electrode, but can also be made of sputtering target material that is sputtered onto the substrate when a voltage is applied from the anode to the cathode. The anode 2806 can be a discrete electrode within the plasma sputtering chamber 2810, can in part comprise the substrate 2808 or a substrate holder (e.g., a wafer chuck), can in part comprise an inner surface of the plasma sputtering chamber 2810, or any combination of the above.

This system 2800 can cause unwanted arcing when a dielectric layer forms on the cathode. The presence of the dielectric within the electric field between the sputtering cathode 2804 and the anode 2806 can cause charge to buildup on the outside of the dielectric leading to voltages that cause arcing. There is thus a need for a plasma sputtering system that reduces or avoids charge buildup on the sputtering cathode 2804.

SUMMARY OF THE DISCLOSURE

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

Some embodiments of the disclosure may be characterized as a power system comprising a DC power supply, a switching circuit, and a snubber circuit. The DC power supply can supply DC power to first and second rails having a voltage between the first and second rails. The switching circuit can receive the DC power via the first and second rails and converting the DC power to a pulsed DC voltage, the pulsed DC voltage configured for application to a plasma load. The snubber circuit can be coupled to the first and second rails such that the voltage between the first and second rails falls across the snubber circuit. Furthermore, the snubber circuit can comprise a first unidirectional switch, a voltage multiplier, an electrical node, and a current limiter. The first unidirectional switch can be configured to allow current to pass from the first rail. The voltage multiplier can be coupled between the first unidirectional switch and the second rail. The voltage multiplier can be configured to absorb and store energy from the DC power supply via the first unidirectional switch when an impedance seen by the switching circuit increases. It can also be configured to boost the voltage between the first and second rails by virtue of absorbing and storing the energy from the DC power supply. It can further be configured to then apply at least a portion of the stored energy to the switching circuit when the impedance seen by the switching circuit decreases and thereby decrease the voltage between the first and second rails. The electrical node can be arranged between the first unidirectional switch and the voltage multiplier. The current limiter can be coupled between the electrical node and the first rail and can limit rises in current that the voltage multiplier discharges to the switching circuit Other embodiments of the disclosure may also be characterized as a snubber circuit comprising a voltage multiplier, a first unidirectional switch, and a first current-limiter. The voltage multiplier can be coupled between a first power rail and a second power rail and it can absorb and store energy from the first rail and consequently boost a voltage between the first and second rail, and then discharge at least some of the energy and consequently reduce the voltage between the first and second rail. The first unidirectional switch can allow current to pass from the first power rail to the voltage multiplier, but can block current attempting to pass back to the first power rail through the first unidirectional switch. The first current-limiter can be coupled between the first power rail and the voltage multiplier. The first current-limiter can provide a low-resistance current path from the voltage multiplier to the first power rail and can limit a rate of change of current that the voltage multiplier discharges to the first power rail.

Other embodiments of the disclosure can be characterized as a method comprising passing power from a power supply to a load having an impedance. The method can also include absorbing at least some of the power when the impedance of the load substantially increases and thereby increasing a voltage and a current reaching the load. The method finally includes discharging at least some of the absorbed power into the load when the impedance of the load decreases, such that the discharge is substantially non-dissipative.

BRIEF DESCRIPTION OF THE DRAWINGS

Various objects and advantages and a more complete understanding of the present invention are apparent and more readily appreciated by referring to the following detailed description and to the appended claims when taken in conjunction with the accompanying drawings:

FIG. 1 illustrates one example of a typical power supply system used for plasma processing;

FIGS. 2A and 2B illustrate plots of voltage and current for a traditional power supply system;

FIGS. 8A and 8B illustrate plots of voltage and current for a power supply system according to one embodiment of this disclosure;

FIG. 24 illustrates yet a further power supply system;

FIGS. 25A and 25B illustrate plots of voltage and current for a power supply system according to one embodiment of this disclosure;

DETAILED DESCRIPTION

Figure 3:
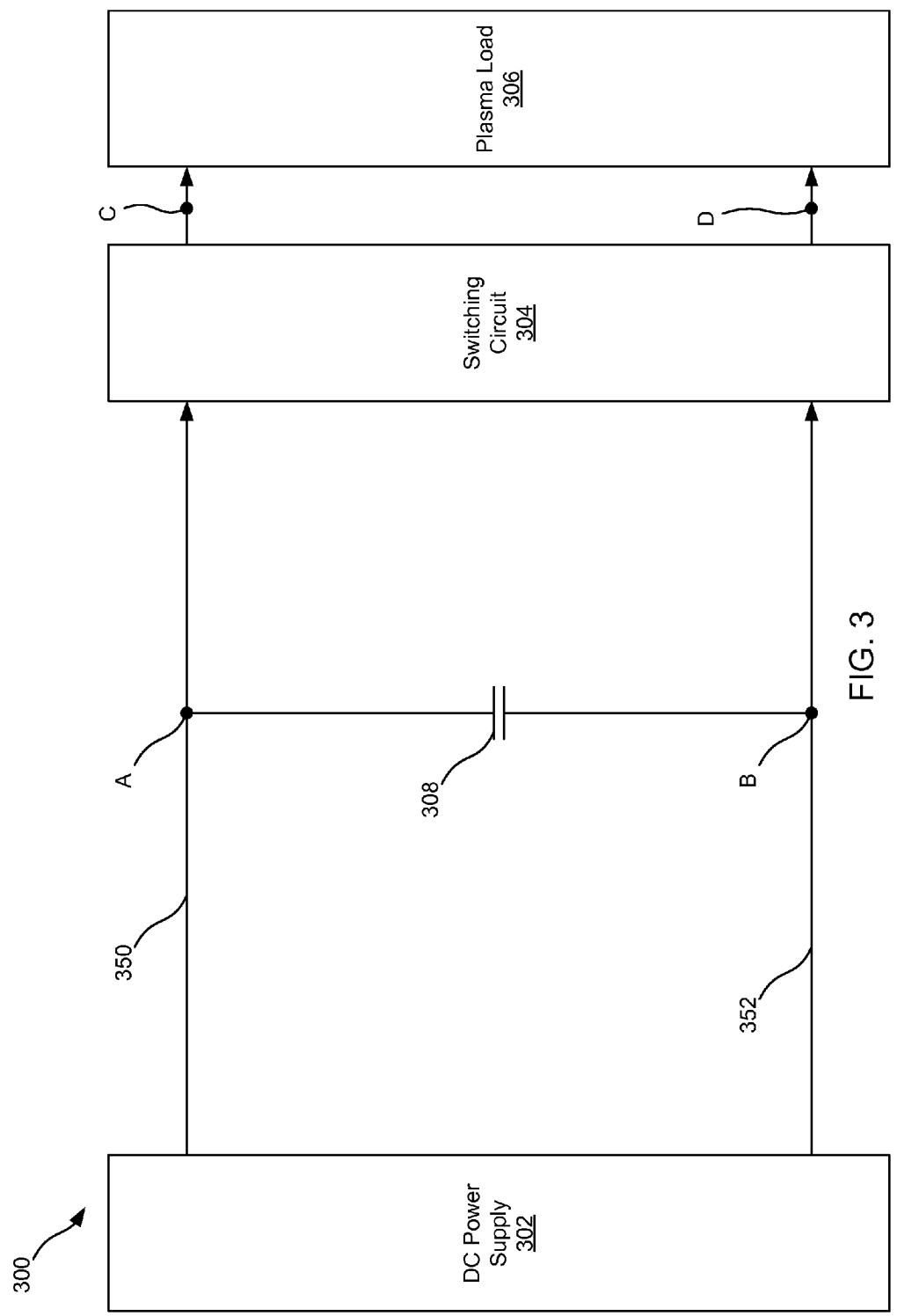
FIG. 3 illustrates a power supply system including a DC power supply, a switching circuit, a plasma load, and an embodiment of a non-dissipative snubber circuit.

The present disclosure relates generally to power supply systems. More specifically, but without limitation, the present disclosure relates to a non-dissipative snubber for use in a power supply system.

The word "exemplary" is used herein to mean "serving as an example, instance, or illustration." Any embodiment described herein as "exemplary" is not necessarily to be construed as preferred or advantageous over other embodiments.

For the purposes of this disclosure, a current limiter is any device or circuit that limits a current that can pass through the current limiter or that limits a rate at which current passing through the current limiter can rise or fall. In some embodiments, a current limiter can limit both the rate of increase and an upper bound of the current passing through the current limiter. An inductor, resistor, JFET, MOSFET, and IGBT are all examples of current-limiting elements since each are able to limit the rate of change of and amount of current.

For the purposes of this disclosure, a switch includes any circuit or device that stops the passage of current when in an off or open state. For instance, transistors (e.g., MOSFET, BJT, IGBT) can be a switch, and in some cases, where a current limiter is operated so as to reduce current to 0 A, a current limiter can be a switch.

For the purposes of this disclosure, a unidirectional switch includes any device or circuit that only passes current in a single direction. For instance, both a diode and a transistor can be considered a unidirectional switch, depending on operation.

The challenges noted in the background can be dealt with via use of a non-dissipative snubber 2460 as illustrated in FIG. 24, comprising a first unidirectional switch 2410, a voltage multiplier 2418, and a first current limiter 2412. The snubber 2460 can be arranged between a first power rail 2450 and a second power rail 2452, wherein the power rails 2450 and 2452 transfer power from a power supply 2402 to a load 2406 (e.g., a plasma of a plasma processing chamber), and optionally transfer said power through vulnerable circuitry 2404 (e.g., a switching circuit). The first unidirectional switch 2410 can be arranged between a first power rail 2450 and the voltage multiplier 2418 and allows current to pass from the first power rail 2450 to the voltage multiplier 2418 (optionally through a current limiter 2408), but prevents current from traveling a reverse path through the unidirectional switch 2410. The first current limiter 2412 can couple the voltage multiplier 2418 to the first power rail 2450 in parallel to the unidirectional switch 2410 and provides a low-loss current path from the voltage multiplier 2418 to the first power rail 2450. The snubber 2460 may further include a switch 2422 between the voltage multiplier 2418 and the first current limiter 2412, wherein the switch 2422 remains closed during most operations, but is opened when a current in the current limiter 2412 reaches a threshold, and then closes when the current in the current limiter 2412 falls below the threshold.

One advantage of the snubber 2460 is its ability to absorb energy in a non-dissipative fashion from the power supply 2402 when an impedance of the load 2406 increases, or substantially increases. For instance, where the load 2406 is a plasma, and the plasma dims or is extinguished, the plasma impedance increases substantially. When the load 2406 impedance increases substantially, the power supply 2402 continues to deliver the same power, and this power would dissipate largely in the vulnerable circuitry 2404. However, the snubber 2460, and in particular, the voltage multiplier 2418, absorbs a large portion of this energy, thus protecting the vulnerable circuitry 2404.

Another advantage of the snubber 2460 is to avoid rapid discharges of the stored energy in the voltage multiplier 2418 when the load 2406 impedance suddenly drops. For instance, where the load 2406 is a plasma, and an arc in the plasma occurs, the arc creates a low impedance current path for the energy in the voltage multiplier 2418. However, the current limiter 2412 prevents rapid discharge of the voltage multiplier 2418. In the case of plasma arcs, this aspect helps prevent the snubber 2460 from exacerbating arcs.

A third advantage of the snubber 2460 is an ability to boost a voltage that the power supply 2402 provides to the load 2406, and consequently boosts a current ramp rate provided to the load 2406. When the voltage multiplier 2418 absorbs energy from the power supply 2402, a voltage across the voltage multiplier 2418 can be raised to some multiple of a voltage between nodes A and B, $V_{AB}$, generated by the power supply 2402. In this way, the voltage multiplier 2418 can boost a voltage, and thus a current ramp rate, provided to the load 2406 after the load 2406 impedance rises. Where there is a desire to control or limit the multiplying effect of the voltage multiplier 2418, (e.g., where one or more devices have a voltage threshold that can be exceeded if the voltage multiplier's full effect is enabled) an optional voltage multiplier modifier 2420 may be utilized (see FIGS. 11-14). The voltage multiplier modifier acts as a 'control knob' over the voltage boost provided by the voltage multiplier 2418.

The power supply 2402 can be embodied by a current source or other current-regulating power supply. In one embodiment, the power supply 2402 can be any power supply having an output current that is limited to slow changes in current. For instance, the power supply 2402 can be any power supply having an inductive output behavior. The power supply 2402 may be able to raise its compliance voltage, and hence the voltage $V_{AB}$. The ability to raise the compliance voltage, and hence, $V_{AB}$, can further enable turn-on of the unidirectional switch 2410.

Figure 7:
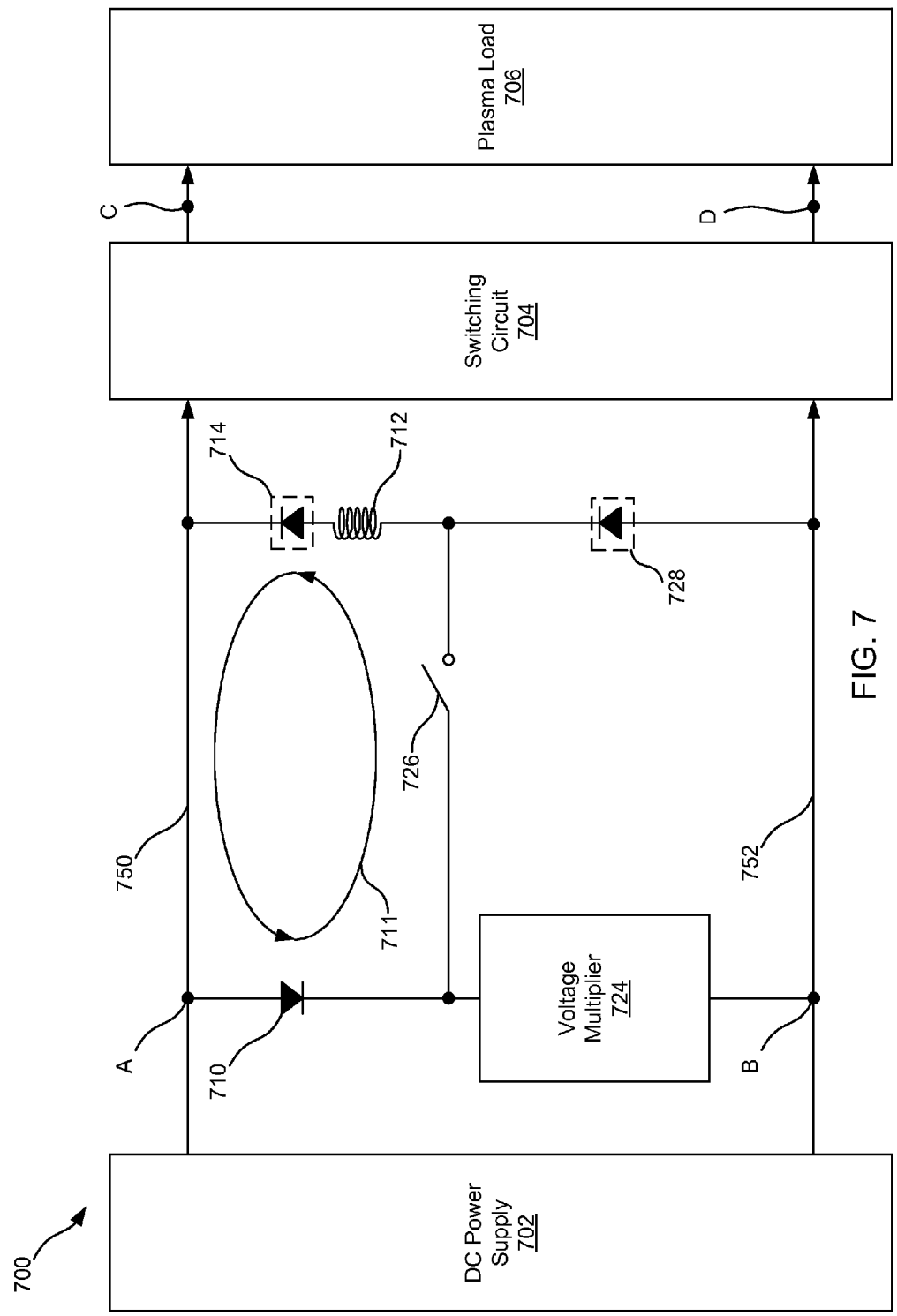
FIG. 7 illustrates a power supply system including a DC power supply, a switching circuit, a plasma load, and yet another embodiment of a non-dissipative snubber circuit.

The snubber 2460 has particular application to pulsed DC power systems providing pulsed DC power to a plasma load during plasma processing. For instance, and as illustrated in FIG. 7, a non-dissipative snubber can be arranged between a DC power supply 702 (e.g., power supply 2402) and a switching circuit 704 (e.g., vulnerable circuitry 2404) providing pulsed DC voltage to a plasma load 706 (e.g., load 2406). In this application, the non-dissipative snubber absorbs power from the DC power supply 702 when the plasma load 706 impedance rises such that power would otherwise damage the switching circuit 704 (e.g., immediately after the switching circuit voltage transitions through 0 V), avoids excessive current discharge during arc events in the plasma, and increases a ramp rate of current provided to the plasma load

706 during each voltage pulse. These advantages can be especially beneficial for high frequency pulsing and high power applications.

The non-dissipative snubber includes a voltage multiplier 724 that temporarily boosts a voltage $V_{AB}$ and thus a current provided to the switching circuit 704 in order to increase an average power delivered to the plasma load 706, thereby increasing throughput, and decreasing losses from excessive currents. The non-dissipative snubber can also include an inductor 712 to prevent the voltage multiplier 724 from rapidly discharging stored energy into the switching circuit 704 and the plasma load 706 when the plasma load 706 drops (e.g., during an arc). The snubber circuit may further include a switch 726 between the voltage multiplier 724 and the inductor 712 to help stop runaway current ramping in the inductor 712 caused by high-frequency multiple arc events in the plasma (e.g., rapid succession of arcs). Various diodes 710, 714, and 728 and capacitors can be interleaved with the above-noted components in order to control the direction of currents in the non-dissipative snubber and various capacitors can be used to store energy.

Figure 6:
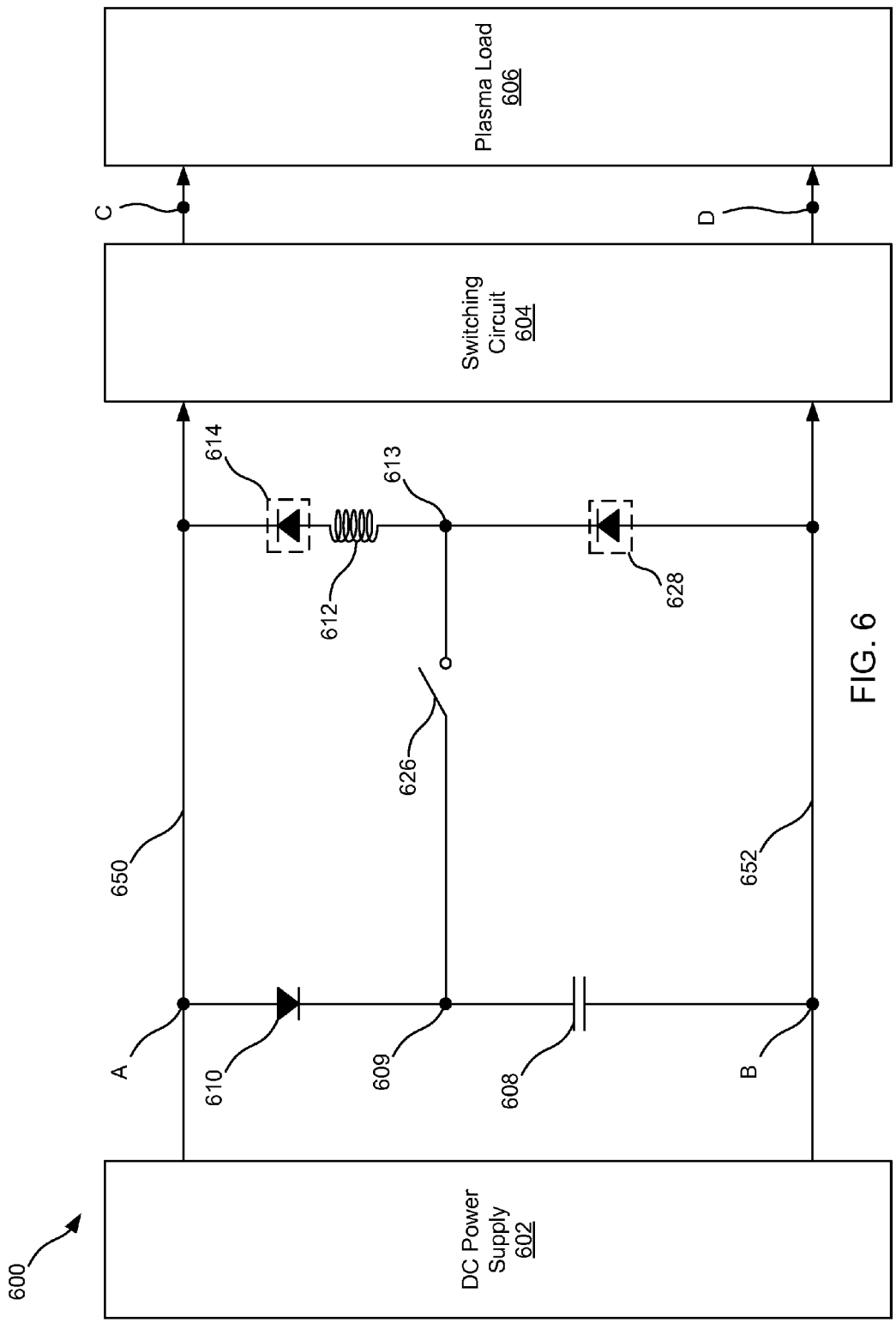
FIG. 6 illustrates a power supply system including a DC power supply, a switching circuit, a plasma load, and yet another embodiment of a non-dissipative snubber circuit.

In one embodiment, a capacitor can replace the voltage multiplier 724 (see FIG. 6). In one embodiment, the voltage multiplier 724 can be a voltage doubler (see FIG. 9), a voltage tripler (see FIG. 10), or any other multiplier having an integer or fractional multiplying effect.

Before delving deeper into FIGS. 7 and 24, a discussion of the development of these circuits and power systems may be helpful. FIG. 3 illustrates a power supply system 300 including a DC power supply 302, a switching circuit 304, a plasma load 306, and an embodiment of a non-dissipative snubber circuit. The DC power supply 302 provides DC power to the switching circuit 304 (e.g., a half-bridge switching circuit) which converts the DC power to pulsed DC that is then provided to the plasma load 306. In order to prevent damage to the switching circuit 304 during switching, when the plasma load 306 appears as a capacitor or open circuit, a snubber circuit including a capacitor 308 coupled between a first rail 350 (positive rail) and a second rail 352 (negative rail) can be implemented. While the capacitor 308 can limit current and/or voltage spikes in the switching circuit 304, it unfortunately also quickly discharges stored energy into arcs in the plasma, thus exacerbating such events.

Figure 4:
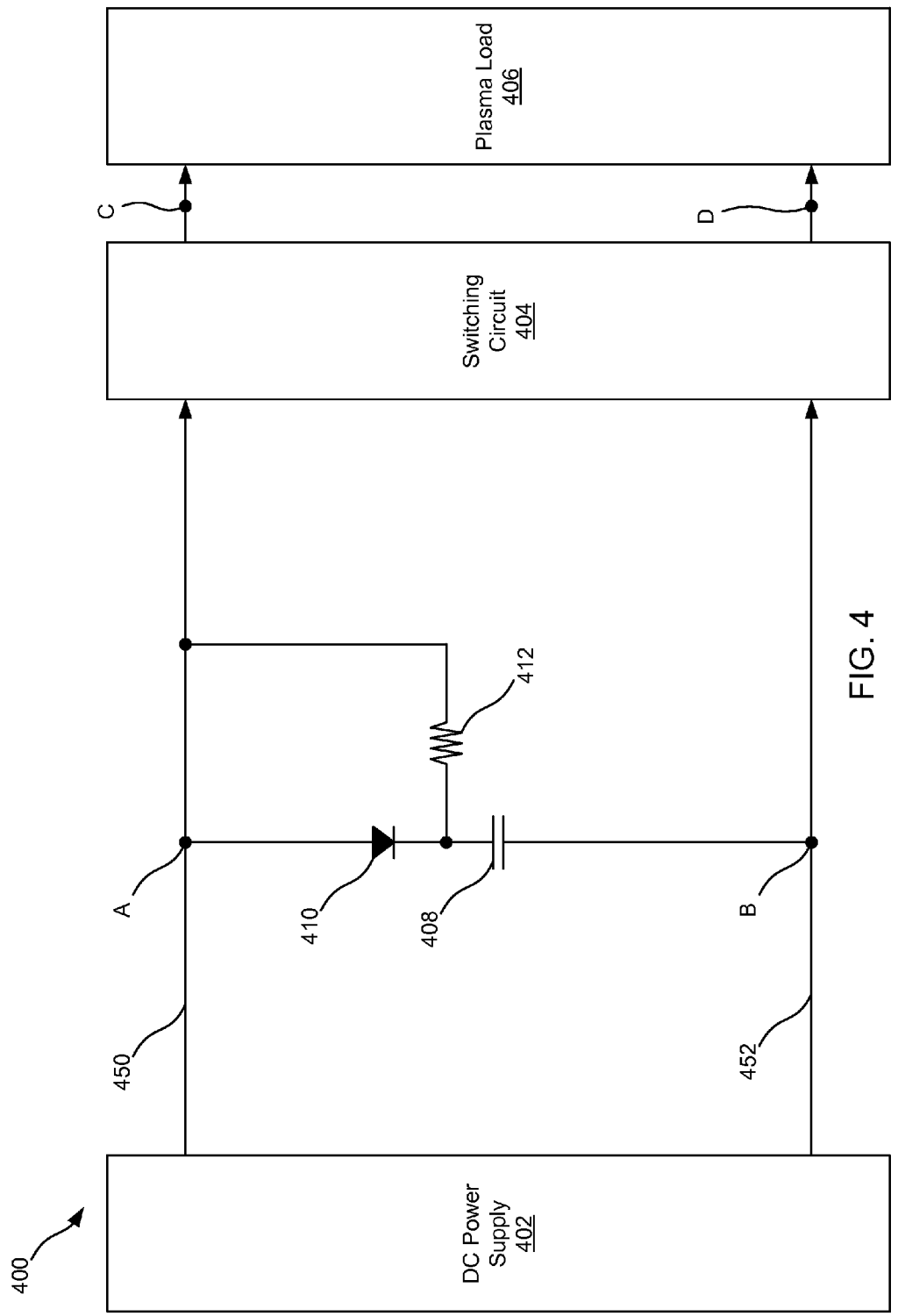
FIG. 4 illustrates a power supply system including a DC power supply, a switching circuit, a plasma load, and another embodiment of a dissipative snubber circuit.

FIG. 4 illustrates a power supply system 400 including a DC power supply 402, a switching circuit 404, a plasma load 406, and another embodiment of a dissipative snubber circuit. In this embodiment the snubber circuit includes a diode 410, a capacitor 408, and a resistor 412. During switching circuit 404 switching, when the plasma load 406 appears as a capacitor or open circuit, a majority of power from the DC power supply 402 passes through the diode 410 and charges the capacitor 408. The capacitor 408 can discharge its energy through the resistor 412 to the switching circuit 404 in the plasma load 406 when the plasma load 406 impedance returns to typical levels. Unlike the snubber illustrated in FIG. 3, the snubber of FIG. 4 limits the current that the capacitor 408 discharges to the first rail 450 via the resistor 412, whose resistance can be selected to meet a maximum current threshold. However, power is dissipated as current passes through the resistor 412, and thus this design is merely a dissipative snubber.

Figure 5:
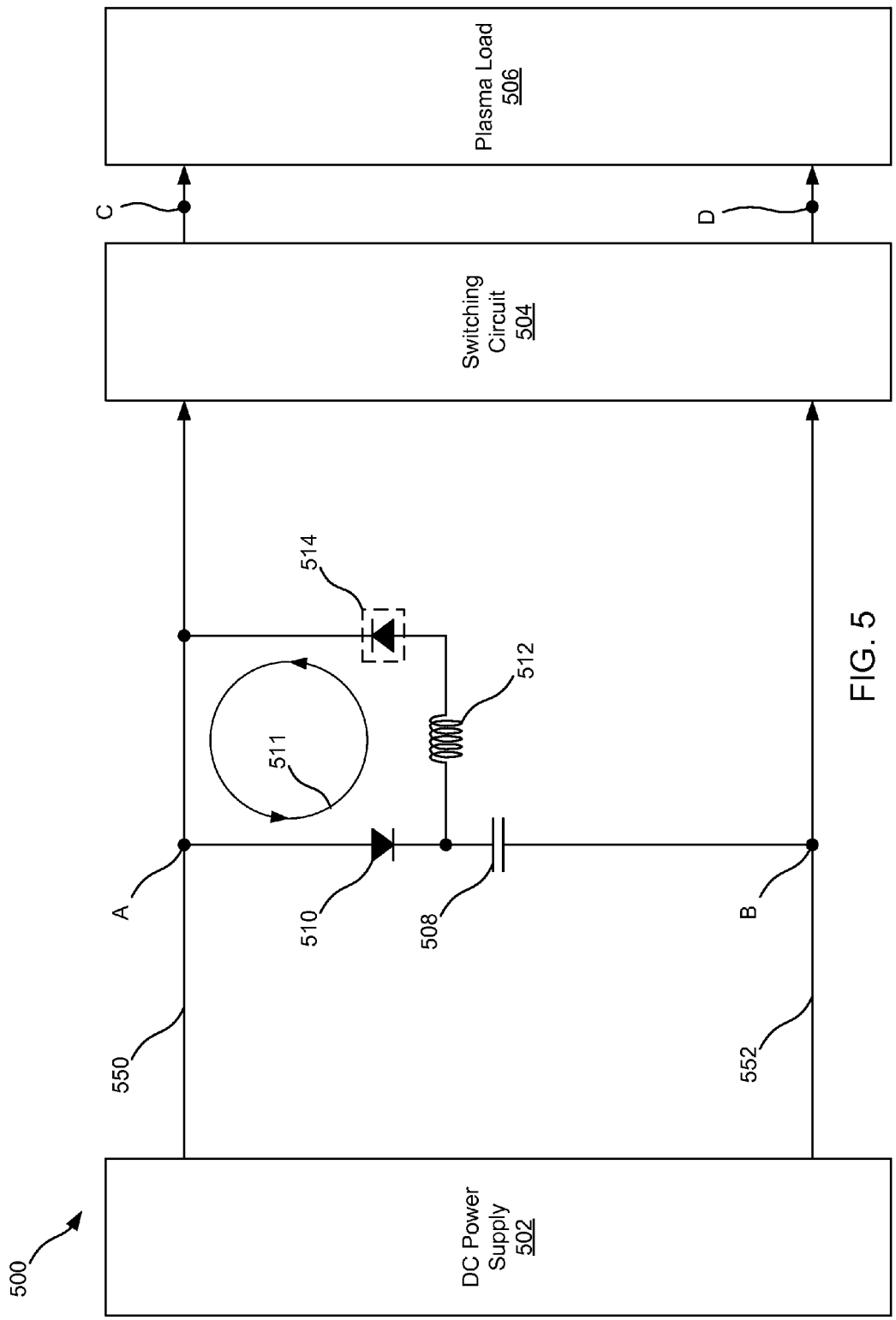
FIG. 5 illustrates a power supply system including a DC power supply, a switching circuit, a plasma load, and yet another embodiment of a non-dissipative snubber circuit.

FIG. 5 illustrates a power supply system 500 including a DC power supply 502, a switching circuit 504, a plasma load 506, and yet another embodiment of a non-dissipative snubber circuit. However this design replaces the resistor 412 in FIG. 4 with an inductor 512, thus enabling the capacitor 508 to discharge stored energy in a non-dissipative fashion. In this case, power from the DC power supply 502 can pass through the diode 510 (or any unidirectional switch) and charge the capacitor 508 (or any capacitive circuit or device, such as a capacitor) when the switching circuit 504's switching of the plasma load 506 appears as a capacitor or an open circuit. Energy stored in the capacitor 508 can be discharged through the inductor 512 (or any inductive circuit or device), the switching circuit 504, and to the plasma load 506 without the losses incurred by passing said energy through a resistor. At the same time, like the resistor 412, the inductor 512 limits the rate of increase in current thus preventing the capacitor 508 from dangerously discharging its energy during arcing events.

In an optional embodiment the snubber can include a diode 514 (or any unidirectional switch) arranged between the inductor and the first rail 550 that prevents current from charging the capacitor 508 through the inductor 512. This diode 514 may be required since the inductor 512, rather than the diode 510, is the path of least resistance from the first rail 550 to the capacitor 508. The inductor-capacitor (512, 508) combination can also lead to ringing, and thus the optional diode 514 helps to alleviate this ringing.

However, since the inductor 512 and diode 510 (and optionally the diode 514) are arranged in a near-lossless current loop 511, current in the inductor 512 continues to flow with little or no dissipation. Every time an arc occurs, the capacitor 508 discharges some energy in the form of current through the inductor 512, and then recharges after the arc. The added current builds upon the already looping current, and if the rate of arcing is high enough, then the current in the inductor 512 can step wise build in a runaway current ramp until the current in this loop 511 damages or destroys either or both of the diodes 510 and 514.

In some embodiments, a bank of capacitors can replace the capacitor 508 such that smaller and less expensive capacitors can be used to achieve a large capacitance.

FIG. 6 illustrates a power supply system 600 including a DC power supply 602, a switching circuit 604, a plasma load 606, and yet another embodiment of a non-dissipative snubber circuit. In this case, a switch 626 can be arranged between an electrical node 609 (between a diode 610 and a capacitor 608) and an inductor 612. The switch 626 can remain closed during normal processing, but be opened during arc events in order to cut the near-lossless current loop formed by the inductor 612 and the diode 610 (and optionally a diode 614). Thus, when high-frequency arc events occur, a current in the inductor 612 may stepwise rise as a result of each successive discharge from the capacitor 608. When the current reaches a threshold, the switch 626 opens, and the current passes into the capacitor 608 via diode 610 thus providing a current path for the inductor to discharge through until the energy stored in the inductor's magnetic field falls and the current in the inductor 612 drops below the threshold. This prevents the runaway current ramp in the inductor 612 that was described with reference to FIG. 5.

Optionally, the snubber can include a diode 628 (or other unidirectional switch) arranged between an electrical node 613 and the second rail 652. The electrical node 613 is arranged between the switch 626 and the inductor 612. The optional diode 628 is forward biased when the switch 626 opens, thus providing a current path from the second power rail 652 to the inductor 612 and thus enabling the inductor 612 to continue to draw current when the switch 626 opens. This avoids voltage spikes across the inductor 612. At the same time, the diode 628 is reverse biased when the switch 626 is closed, thus preventing current from passing to the second power rail 652 after passing through the switch 626.

In some embodiments, a bank of capacitors can replace the capacitor 608 such that smaller and less expensive capacitors can be used to achieve a large capacitance.

FIG. 7 illustrates a power supply system 700 including a DC power supply 702, a switching circuit 704, a plasma load 706, and yet another embodiment of a non-dissipative snubber circuit. Here, a voltage multiplier 724 replaces the capacitor seen in earlier snubber embodiments. The voltage multiplier 724 is designed to improve the efficiency of the system 700, while still enabling the snubber to absorb power from the DC power supply 702 and thus protect the switching circuit 704.

In particular, and recalling FIGS. 2A and 2B, pulsed DC power systems often suffer from slow current ramp rates during each pulse. The voltage multiplier 724 absorbs power from the DC power supply 702 after the switching circuit 704 voltage switches, but also boosts process voltage, $V_1$, to a boosted voltage, $V_1+V_2$, for a first portion 802 of each pulse so that current ramps faster as illustrated in FIG. 8A. For instance, the DC power supply 702 provides sufficient power to enable the process voltage $V_1$, but the voltage multiplier 724 boosts this voltage by $V_2$ during the first portion 802 of each pulse.

This voltage boost is actually a byproduct of the snubber circuit absorbing power from the DC power supply 702 immediately after 0 V transitions of the switching circuit 704. When the switching voltage reaches 0 V, the plasma density drops substantially and the plasma acts more like an open circuit or an unfluxed inductor than as a low resistance current path. The DC power supply 702 is current or power regulated and thus continues to drive the same current level. The snubber circuit absorbs this power, which otherwise would be directed into the switching circuit 704 and potentially damage that circuit.

As current passes into the voltage multiplier 724, energy is stored within the voltage multiplier 724 and accumulates along with a voltage that is increasingly larger than the process voltage $V_2$ until the current in the plasma has ramped sufficiently to raise the plasma density back to a level where power can again be largely provided to the plasma load 706 rather than to the snubber. This time is long enough that the voltage across the voltage multiplier 724 builds to greater than the process voltage, $V_1$, and thus for a first portion 802 of each DC pulse, there is a voltage boost of $V_2$ as seen in FIG. 8A.

This increased voltage causes the current to ramp faster than seen in the art (e.g., FIG. 2A). As a result, the current flattens out sooner in each pulse meaning that greater average power is delivered and thus less time is required for a given process. The increased current ramp rate also means that current does not rise as high as it would given a slower ramp rate, which results in less overall losses (proportional to $I^2$) and less switching losses (proportional to I at the moment of switching). These improvements in efficiency are especially noticeable at higher frequencies (see FIG. 8B and compare to FIG. 2B).

It should be noted that FIG. 8A is a simplification of the voltage and current waveforms, and in practice the vertical rises and falls may have non-infinite slopes caused by capacitive and inductive effects.

If the voltage between the first rail 750 and the second rail 752 falls below approximately the process voltage, $V_1$, then the voltage multiplier 724 can partially discharge and supplement the current provided from the DC power supply 702 at approximately the process voltage, $V_1$.

During arcs, the voltage multiplier 724 can also discharge some of its energy through the closed switch 726 and the inductor 712. A near-lossless current loop 711 may then be established through the inductor 712, the diode 710, and the closed switch 726 (and optionally the diode 714) until the switch 726 is opened, thus forcing the current to recharge the voltage multiplier 724.

In some embodiments, $V_2=V_1$ (e.g., the voltage multiplier 724 is a voltage doubler). However, in other embodiments, $V_2$ can be less than or greater than the process voltage, $V_1$. In some embodiments, $V_2$ can even be variable (see FIGS. 11-14).

In some embodiments, the first diode 710 can be arranged in series with a current limiter such as an inductor (not illustrated) so as to limit not only the direction of current into the voltage multiplier 724, but to also limit the amount and rate of change of current entering the voltage multiplier 724. Such a current limiter may be implemented to prevent current overload in the voltage multiplier 724. In embodiments, where two or more of the herein disclosed snubbers are arranged in parallel, the current limiter may limit the current entering each of the snubbers so that voltage can remain at a reasonable level while still sending current to each of the two or more snubbers.

In such an embodiment, the current limiter in series with the first diode 710 can be selected so that current is able to rapidly enter and charge the voltage multiplier 724, while the inductor 712 can be selected so that the voltage multiplier 724 discharges at a lower current. This can lead to a rapid boosting of voltage to $V_1+V_2$ at the start of each DC pulse (see the first portion 802 of FIGS. 8A and 8B) while the voltage multiplier 724 supplements the DC power supply 702 current at $V_1$ over a longer second portion of each DC pulse.

In one embodiment, the first and second rails 750 and 752 are floating, such that neither is referenced to ground.

The diode 714 can be optional where the LC time constant is long. A "long" LC time constant is one where the inductor 712 current is prevented from reversing direction. In particular, the inductor 712 is sinusoidal without the optional diode 714, and so the LC time constant is equal to the inverse resonant frequency of the inductor 712 and the capacitor of the voltage multiplier 724 and preferably an order of magnitude greater than the inverse switching frequency of the switching circuit 704. The LC time constant can be calculated from the inductance of the inductor 712 and any capacitance of the voltage multiplier 724.

The switching circuit 704 takes either DC voltage or constant power from the DC power supply 702 and generates pulsed DC power. Two non-limiting examples of the switching circuit 704 are an H-bridge (half or full bridge) or a double-pole double-throw switch network. In one embodiment, the switching circuit 704 can include two or more half or full bridge H-bridge circuits coupled in parallel (e.g., one pair of H-bridge outputs is parallel to the next pair of H-bridge outputs).

The plasma load 706 can be part of a plasma processing chamber, such as those used in plasma sputtering. Power can be provided to the plasma load 706 via one or more electrodes such as those in dual-magnetron sputtering (one or more magnetrons can also be used).

Figure 9:
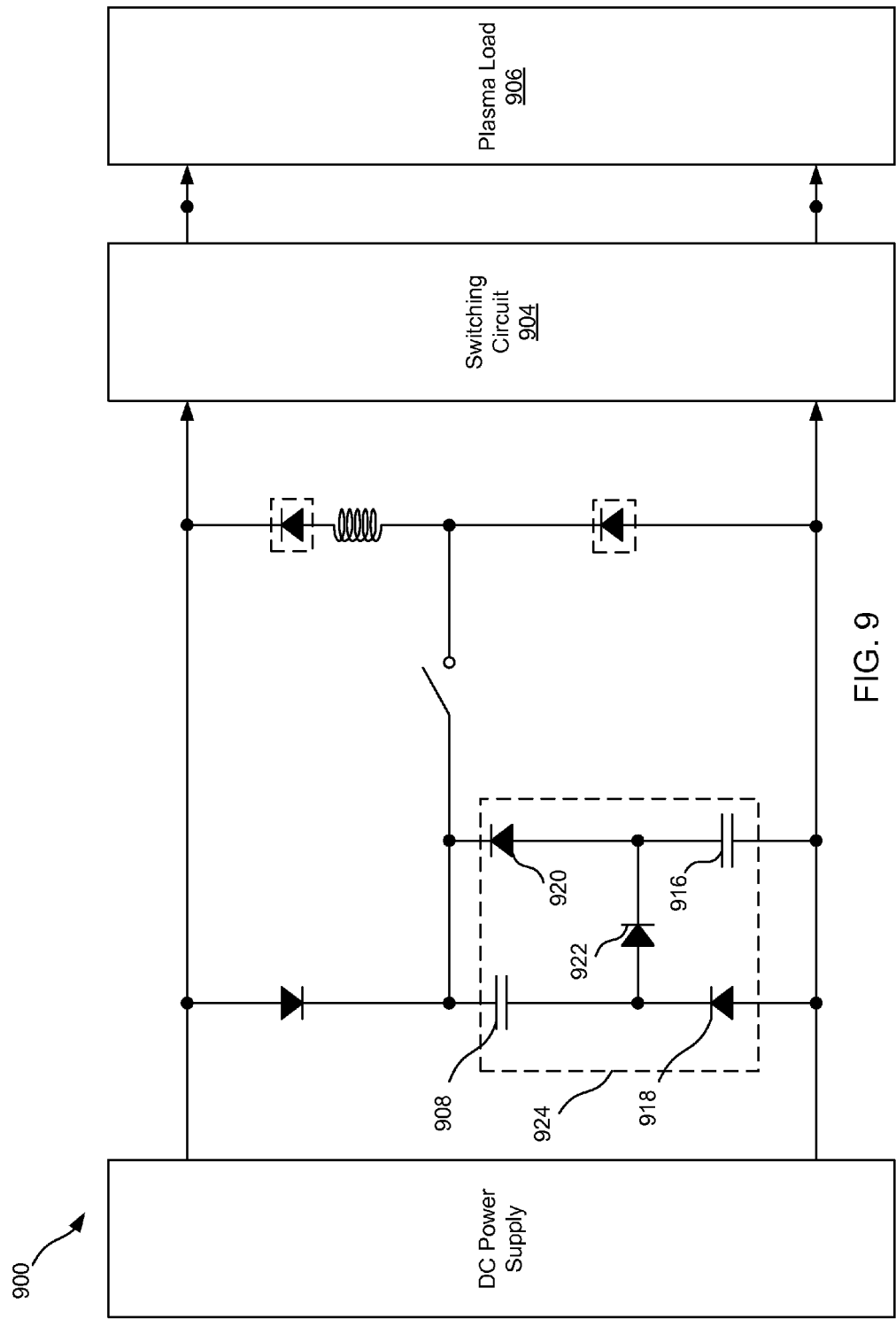
FIG. 9 illustrates an embodiment of a power supply system showing details of a voltage multiplier.

FIG. 9 illustrates an embodiment of a power supply system 900 showing details of a voltage multiplier 924. The voltage multiplier 924 includes a first capacitor 908 (or a capacitor bank or any capacitive element or system), a second capacitor 916, a first diode 918, a second diode 922, and a third diode 920. The first and second capacitors 908 and 916 can be charged in series when the second diode 922 is forward biased. The first and second capacitors 908 and 916 can then discharge in parallel when the first and third diodes 918 and 920 are forward biased, and the second diode 922 is reverse biased.

Figure 10:
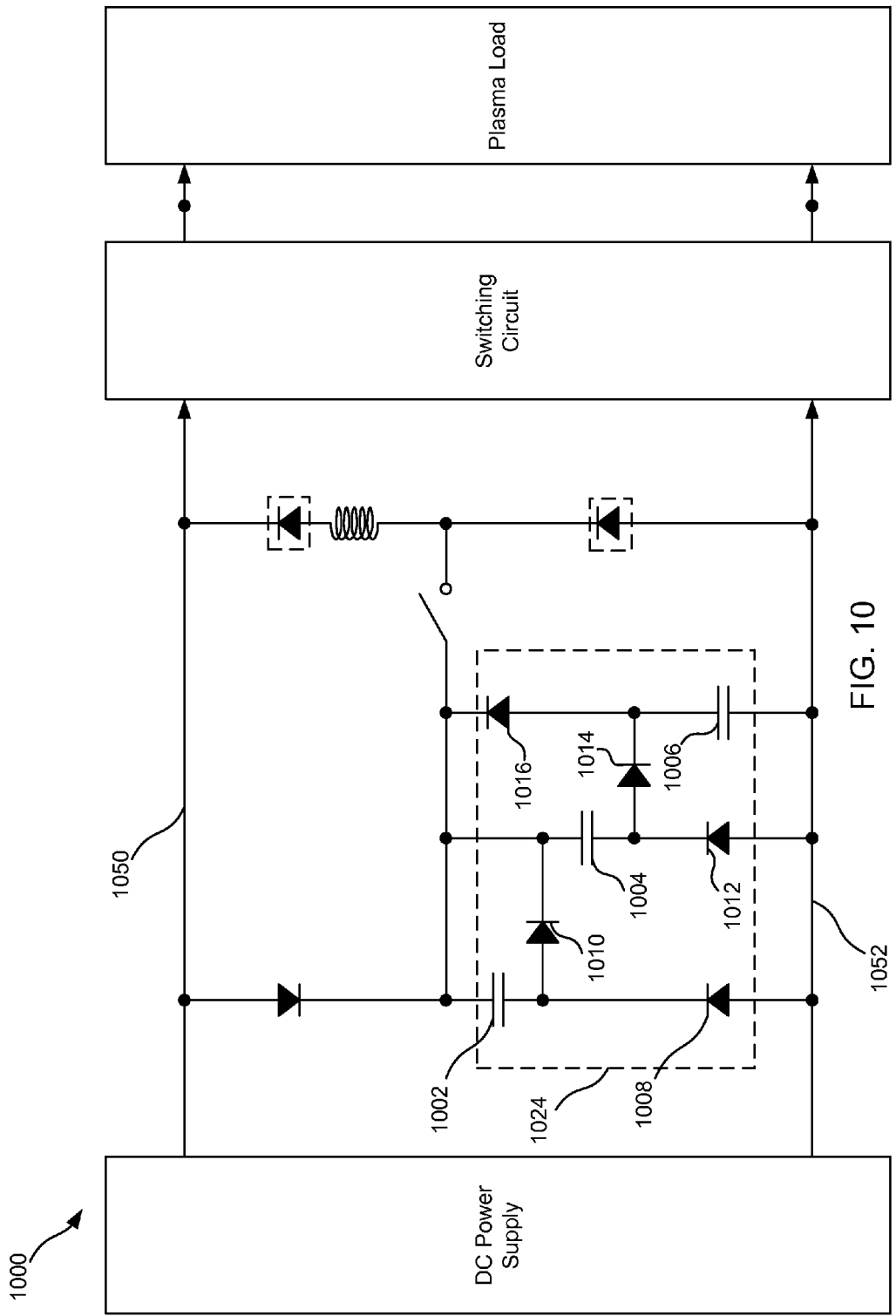
FIG. 10 illustrates an embodiment where the voltage multiplier of the snubber is a voltage tripler.

FIG. 10 illustrates an embodiment where the voltage multiplier of the snubber is a voltage tripler. The voltage multiplier 1024 includes a first capacitor 1002, a second capacitor 1004, and a third capacitor 1006. The voltage multiplier 1024 further includes a first diode 1008, a second diode 1010, a third diode 1012, a fourth diode 1014, and a fifth diode 1016. Each of the capacitors 1002, 1004, 1006 can be charged to near or greater than the process voltage, and therefore when all three are charged, a voltage drop across all three is around three times the process voltage. Thus, the voltage multiplier 1024 is able to boost the voltage across the first and second rails 1050, 1052 by a factor of about three and can therefore be referred to as a voltage tripler.

In some embodiments, a bank of capacitors can replace the capacitors 1002, 1004, and 1006 such that smaller and less expensive capacitors can be used to achieve a large capacitance.

Figure 11:
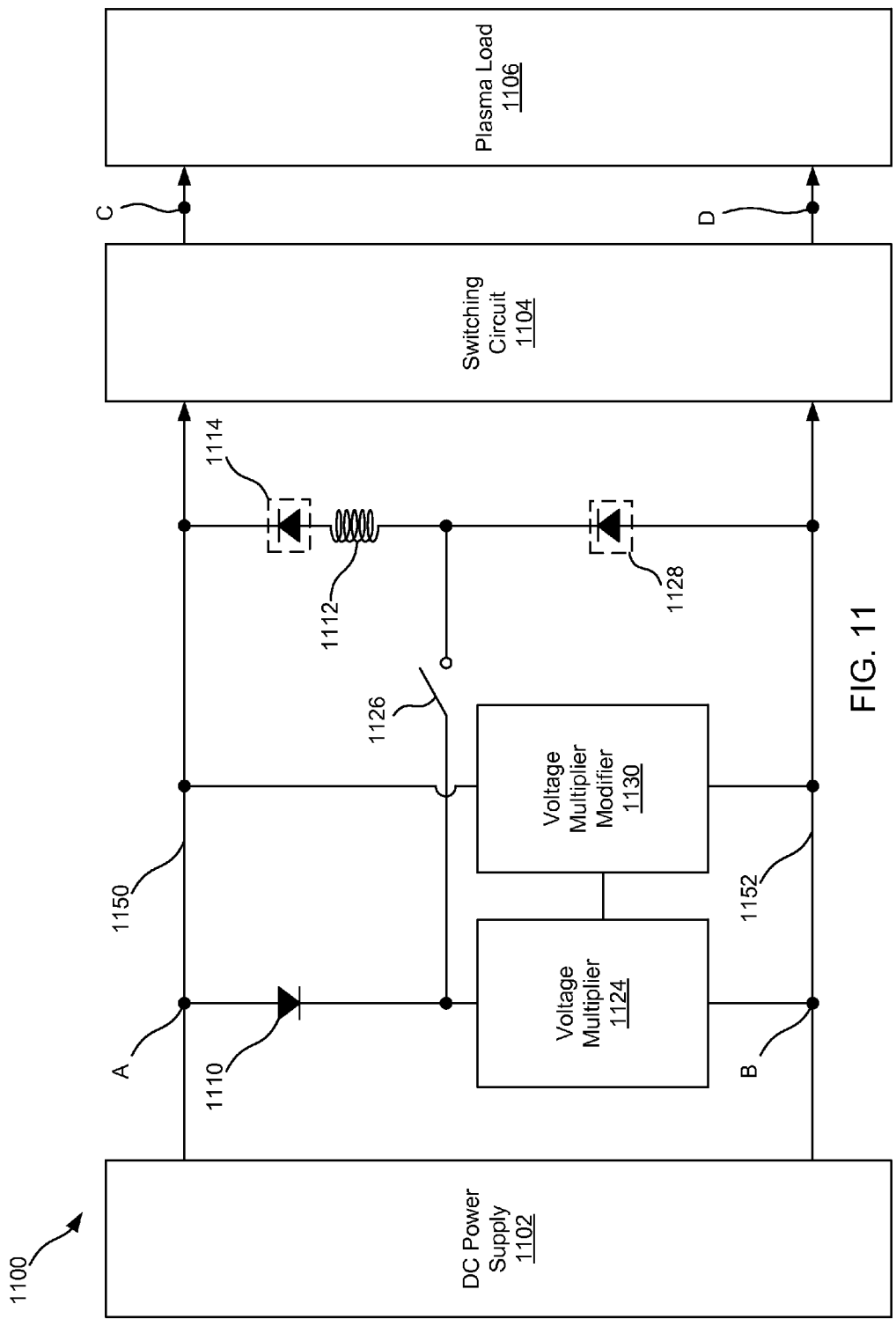
FIG. 11 illustrates a power supply system including a DC power supply, a switching circuit, a plasma load, yet another embodiment of a snubber circuit, and a voltage multiplier modifier.

FIG. 11 illustrates a power supply system 1100 including a DC power supply 1102, a switching circuit 1104, a plasma load 1106, yet another embodiment of a voltage multiplier 1124, and a voltage multiplier modifier 1130. Here, the snubber sees the addition of a voltage multiplier modifier 1130 coupled between a first and second rail 1150, 1152, and having an electrical connection to the voltage multiplier 1124. The voltage multiplier modifier 1130 can control the effect of the voltage multiplier 1124 on the voltage, $V_{AB}$, between the rails 1150 and 1152. In this way the boost voltage $V_2$ (see FIG. 12) can be tailored to a desired amplitude that is less than the maximum boost that the voltage multiplier 1124 is capable of. Furthermore, the voltage $V_2$ can be varied in time. This embodiment has particular application where the voltage multiplier 1124 has a fixed multiplying effect (e.g., a voltage doubler or a voltage tripler).

Figure 12:
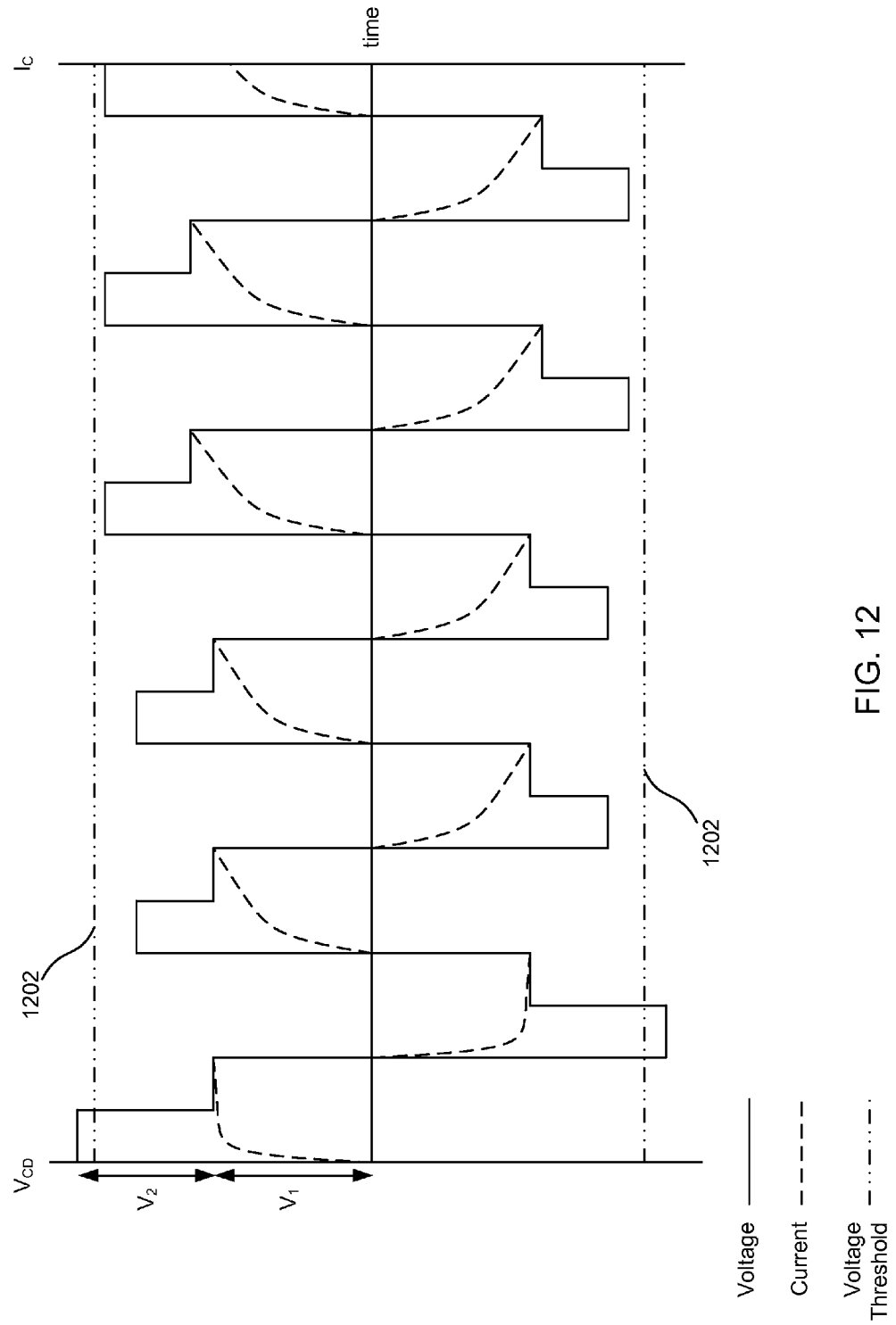
FIG. 12 illustrates a plot of voltage and current for a power supply system according to one embodiment of this disclosure.

One application of such control is illustrated in FIG. 12, where a voltage threshold 1202 shows a threshold above which circuitry in the power supply system 1100 can be damaged. As such the voltage multiplier modifier 1130 can be used to lower $V_2$ so that the total voltage ($V_2+V_1$) of the first portion 802 of the pulses remains below the voltage threshold 1202. As seen, $V_2$ can be adjusted in time so long as the sum is kept below the voltage threshold 1202.

Figure 13:
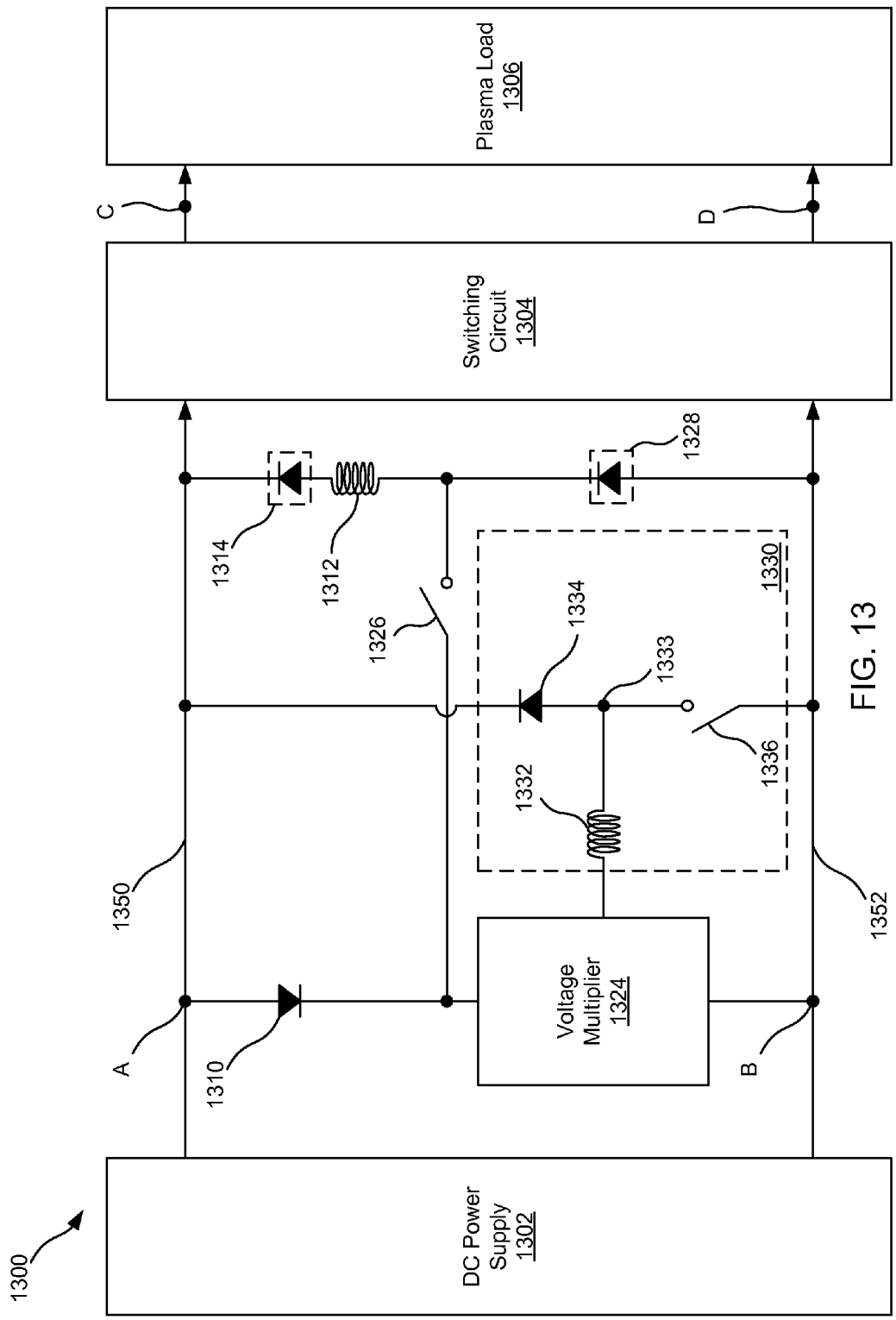
FIG. 13 illustrates a power supply system showing details of one embodiment of a voltage multiplier modifier.

FIG. 13 illustrates a power supply system showing details of one embodiment of a voltage multiplier modifier. The voltage multiplier modifier 1330 can include a diode 1334, an inductor 1332, and a switch 1336. The combination of the inductor 1332, the switch 1336, and the diode 1334 can function as a discontinuous conduction mode (DCM) boost converter, where the inductor 1332 current can fall to zero for at least a portion of operation. The combination can also function as a continuous conduction mode (CCM) boost converter, where the inductor 1332 current never falls to zero.

The inductor 1332 can be arranged between the voltage multiplier 1324 and an electrical node 1333, where the electrical node 1333 is arranged between the diode 1334 and the switch 1336. In particular the electrical node 1333 can be arranged between an anode of the diode 1334 and the switch 1336. The switch 1336 can be arranged between the electrical node 1333 and a second rail 1352. When the switch 1336 closes, stored energy in the voltage multiplier 1324 is removed through the inductive component 1332 and the unidirectional switch 1334 to the first rail 1350, thus lowering the voltage across the voltage multiplier 1324 and hence lowering the voltage boost $V_2$ caused by energy storage in the voltage multiplier 1324.

The switch 1334 can be turned on and off according to a duty cycle, where a larger duty cycle decreases the voltage boost $V_2$ from the voltage multiplier 1324. For instance, a 0% duty cycle (the switch 1334 open 100% of the time) allows the full voltage boost $V_2$ of the voltage multiplier 1324 to reach the switching circuit 1304.

Figure 14:
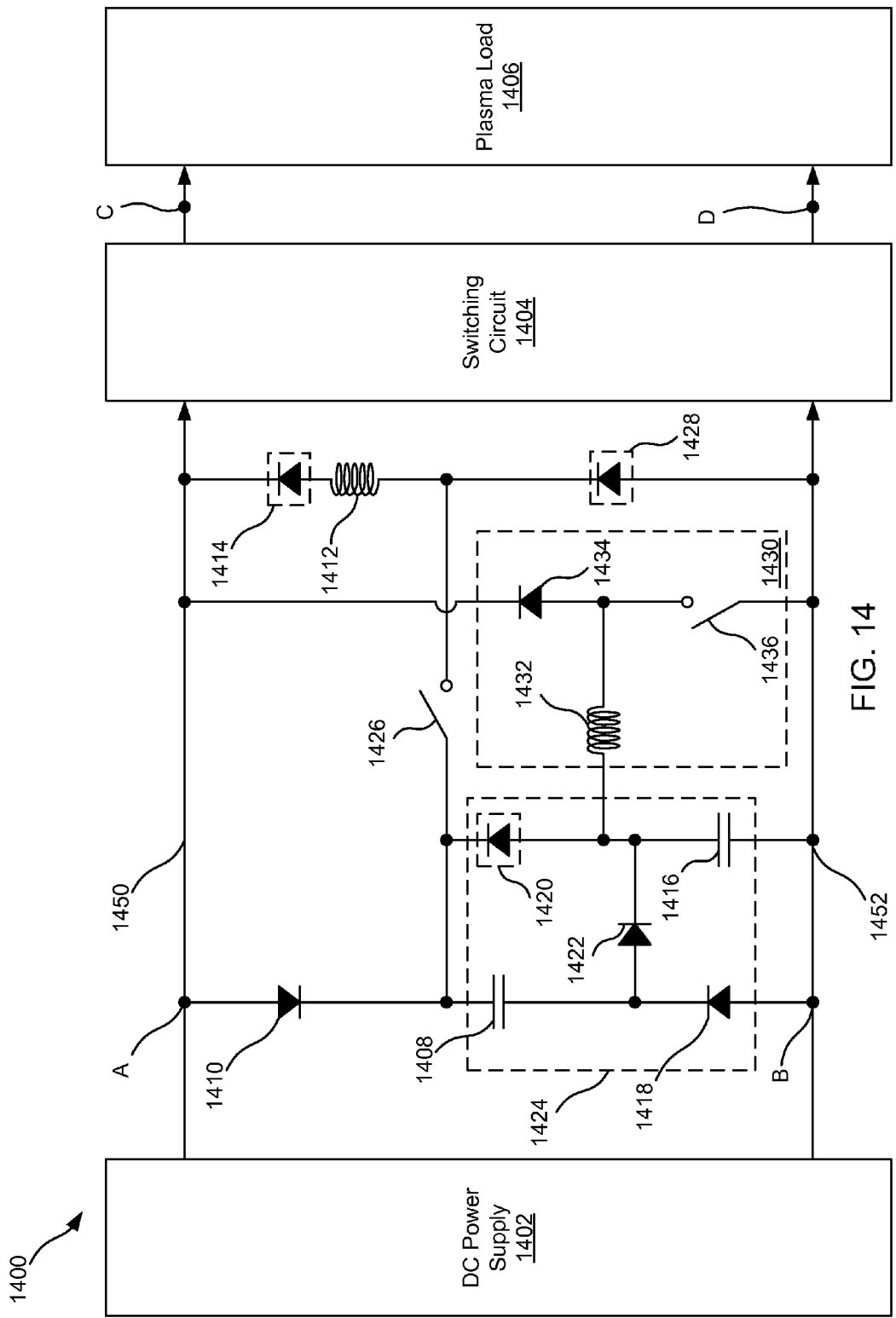
FIG. 14 illustrates a power supply system showing details of one embodiment of a voltage multiplier and of a voltage multiplier modifier.

FIG. 14 illustrates a power supply system showing details of one embodiment of a voltage multiplier 1424 and of a voltage multiplier modifier 1430. The details of the voltage multiplier modifier 1430 are the same as those illustrated in FIG. 13, and the details of the voltage multiplier 1424 are the same as those illustrated in FIG. 9. The voltage multiplier 1124 can include a first capacitor 1480, a second capacitor 1416, a first diode 1418, a second diode 1422, and an optional third diode 1420.

During switching of the switching circuit 1404 when the plasma load 1406 appears as an inductor or an open circuit, power from the DC power supply 1402 passes through the diode 1410 and into the voltage multiplier 1424. Due to the arrangement of the diodes 1418, 1422, 1420 the current charges the first capacitor 1408 and the second capacitor 1416 in series while passing through the diodes 1410 and 1422. The diode 1418 and the optional diode 1420 are reverse biased during charging of the first and second capacitors 1408, 1416.

When the voltage multiplier 1424 discharges, and the voltage multiplier module 1430 is not active, the second diode 1422 is reverse biased and the first diode 1418 and the optional third diode 1420, if implemented, are forward biased. As a result, the first and second capacitors 1408 and 1416 discharge in parallel. The voltage that the first and second capacitors 1408 and 1416 are each charged to can be equivalent to the process voltage, $V_2$, minus a forward bias voltage drop across the diode 1410. In other words, the voltage multiplier 1424 approximately doubles the voltage provided by the DC power supply 1402, and can be referred to as a voltage doubler.

The voltage multiplier modifier 1430 can control how much of the voltage doubling effect the voltage multiplier 1424 has on $V_{AB}$. For instance, where the switch 1426 has a maximum safe operating voltage threshold of 1700 V, and $V_1$ is 1000 V, the voltage multiplier module 1424 by itself would generate a 2000 V rail voltage on the first rail 1450 and thus damage the switch 1426. However, via proper control of the voltage multiplier modifier 1430 the multiplying effect of the voltage modifier 1424 can be tailored such that V is kept below 1700 V, thus avoiding damage to the switch 1426.

In particular, when the switch 1436 is closed, energy from the capacitor 1416 is removed to the second rail 1452 via the inductor 1432 and the closed switch 1436. As such, the more often the switch 1436 is closed (e.g., a higher duty cycle), the lower the voltage on the capacitor 1416. The voltage multiplier modifier 1430 does not affect the voltage on the capacitor 1408. In this fashion, the voltage multiplier modifier 1430 can control the boost voltage $V_2$ provided by the voltage multiplier 1424.

When the first and second capacitors 1408, 1416 discharge, and the voltage multiplier modifier 1430 is active, the first capacitor 1408 discharges via the switch 1426, the inductor 1412, and the optional diode 1414. Because charge has been removed from the second capacitor 1416, the optional diode 1420 is reverse biased, and can be removed from the circuit when the voltage multiplier modifier 1430 is used. The second capacitor 1416 discharges through the voltage multiplier modifier 1430, and in particular through the inductor 1432 and the diode 1434.

Figure 17:
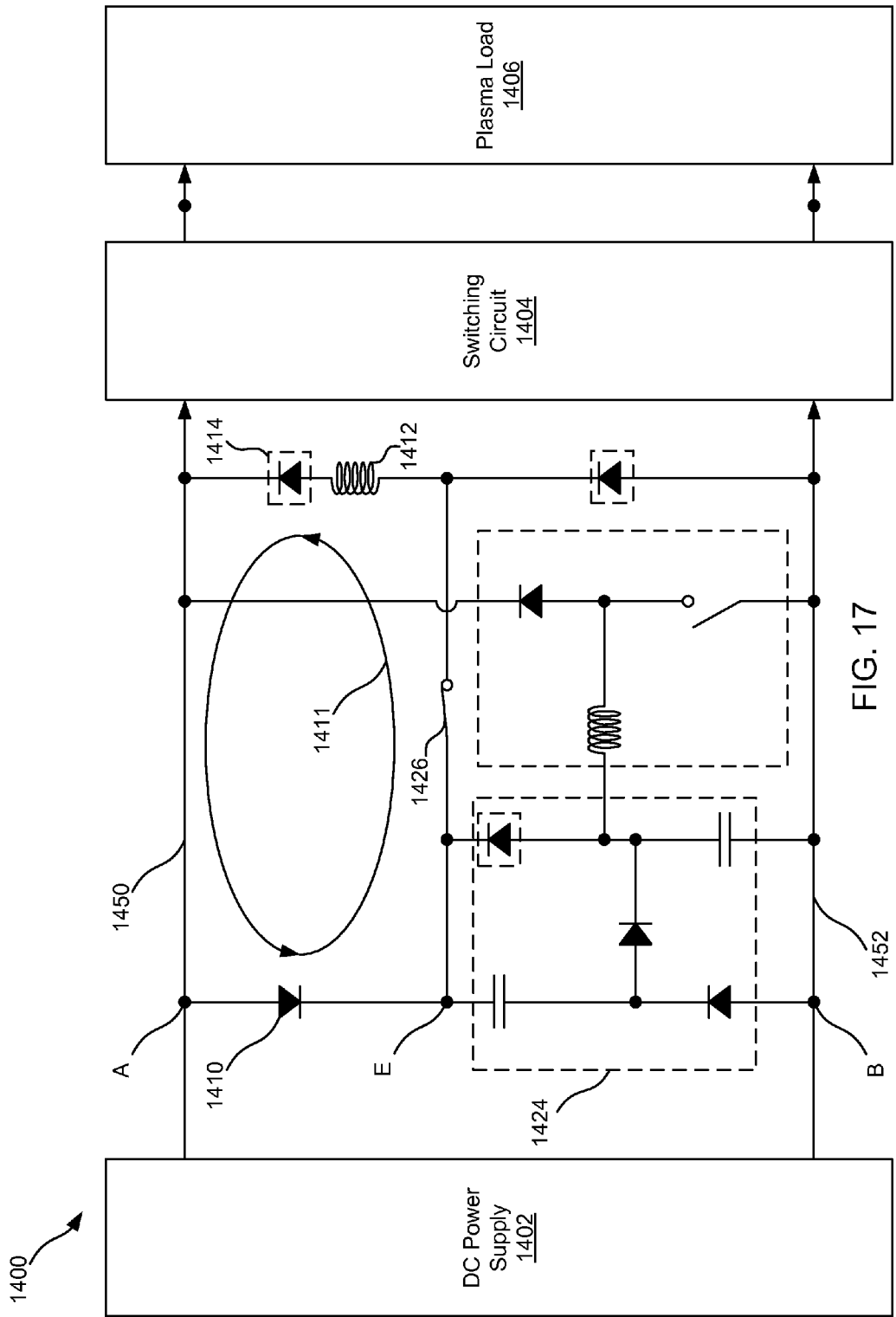
FIG. 17 illustrates a power supply system including a DC power supply providing power to a switching circuit, which then provides pulsed DC power to a plasma load.

Discussion will now be directed to current paths, voltages, and forward or reverse biases existing on the various components illustrated in FIG. 14 during different phases of operation of one embodiment of a power supply system. The DC power supply 1402 can be power or current-regulated. During non-arcing conditions, current passes along first rail 1450 from the DC power supply 1402 to the switching circuit 1404. The switch 1426 is closed (or on), and the diodes 1410 and 1414 are also on, and thus current also passes in a near-lossless loop 1411 (see FIG. 17) through the inductor 1412, the diode 1410, the closed switch 1426, and the diode 1414 (optional). A voltage, $V_{AB}$, is equal to a process voltage during this phase of operation. The process voltage is a voltage across the plasma load 1406 given a steady state plasma impedance. This occurs when the plasma is ignited and sustained and thus is conducting, but can vary to some extent depending on plasma stability and process conditions (e.g., when reactive gas flow enters the plasma processing chamber). A voltage, $V_{EB}$, as measured from electrical node E to electrical node B is equal to the process voltage minus the forward conduction voltage drop across diode 1410 (e.g., $V_{EB}=V_{AB}-V_{AE}$).

The constant current loop 1411 maintains the diodes 1410 and 1414 (optional) in an on state, thus providing the first rail 1450 instant access to the voltage multiplier 1424 should the plasma load impedance 1406 rise for any reason. Thus, the voltage multiplier 1424 is ready to absorb power from the DC power supply 1402 after every 0 V transition of the switching circuit 1404 as well as after any malfunction caused by an impedance spike in the plasma load 1406. For instance, where there is a leak in the plasma chamber that suddenly extinguishes the plasma, power from the DC power supply 1402 can be shunted into the voltage multiplier 1424.

Figure 18:
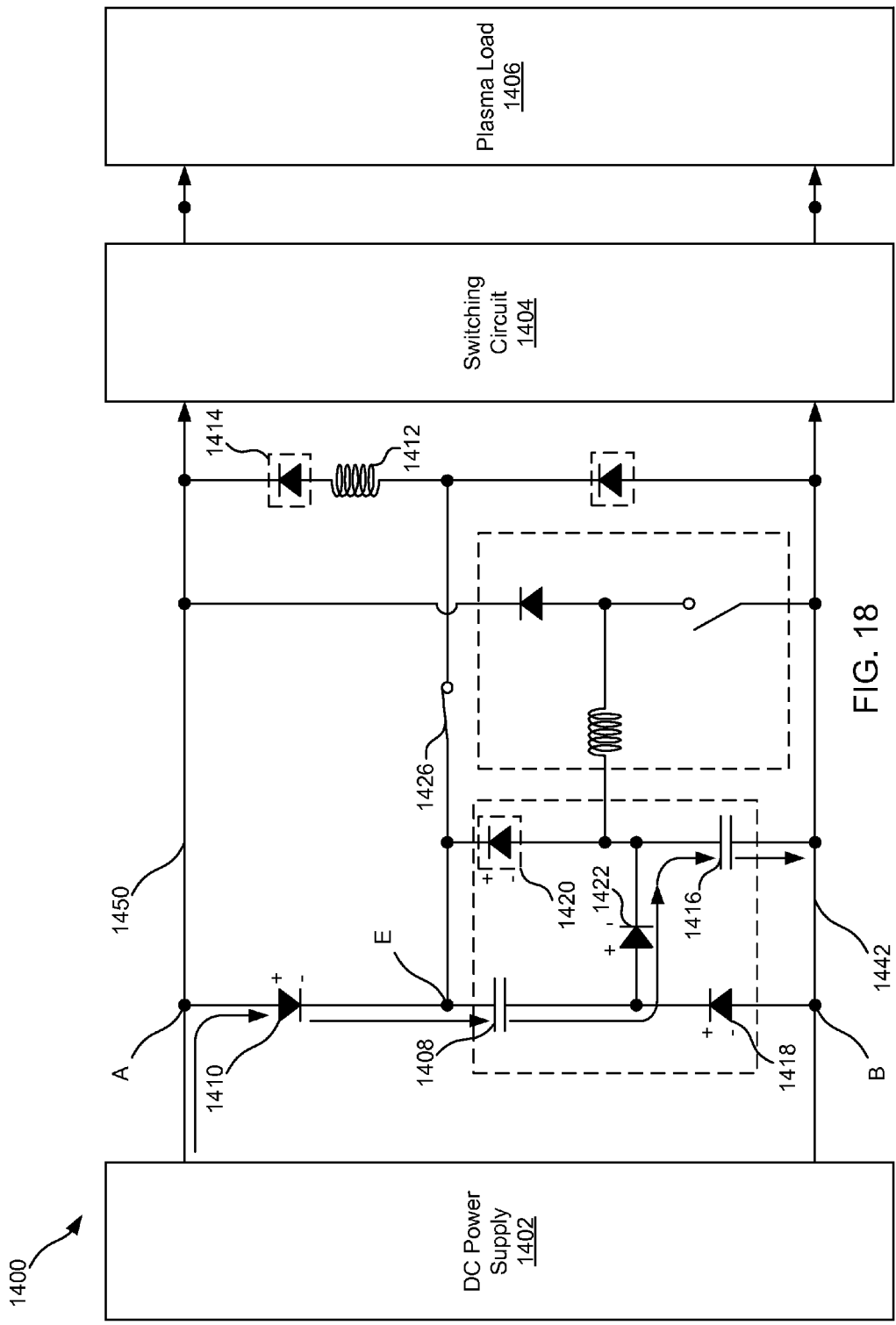
FIG. 18 illustrates the power supply system of FIG. 14 just after a 0 V transition of the switching circuit.

FIG. 18 illustrates the power supply system of FIG. 14 just after a 0 V transition of the switching circuit. After the 0 V transition, the plasma load 1406 impedance rises substantially such that the path of least resistance for most of the current is through diode 1410, first capacitor 1408, diode 1422, and capacitor 1416 to the second rail 1452. Diode 1418 is reverse biased, as is optional diode 1420 if implemented. The voltage between the rails, $V_{AB}$, when the current begins to take this route, is equal to the process voltage, $V_1$. The current charges the capacitors 1408 and 1416 and in doing so increases $V_{AB}$ above the process voltage, $V_1$. With the illustrated voltage multiplier 1424 (a voltage doubler), $V_{AB}$ can be boosted to substantially twice the processing voltage, $V_1$. In other embodiments, the voltage can be boosted to three, four, or any integer or fractional multiplier of the process voltage, $V_1$.

Figure 19:
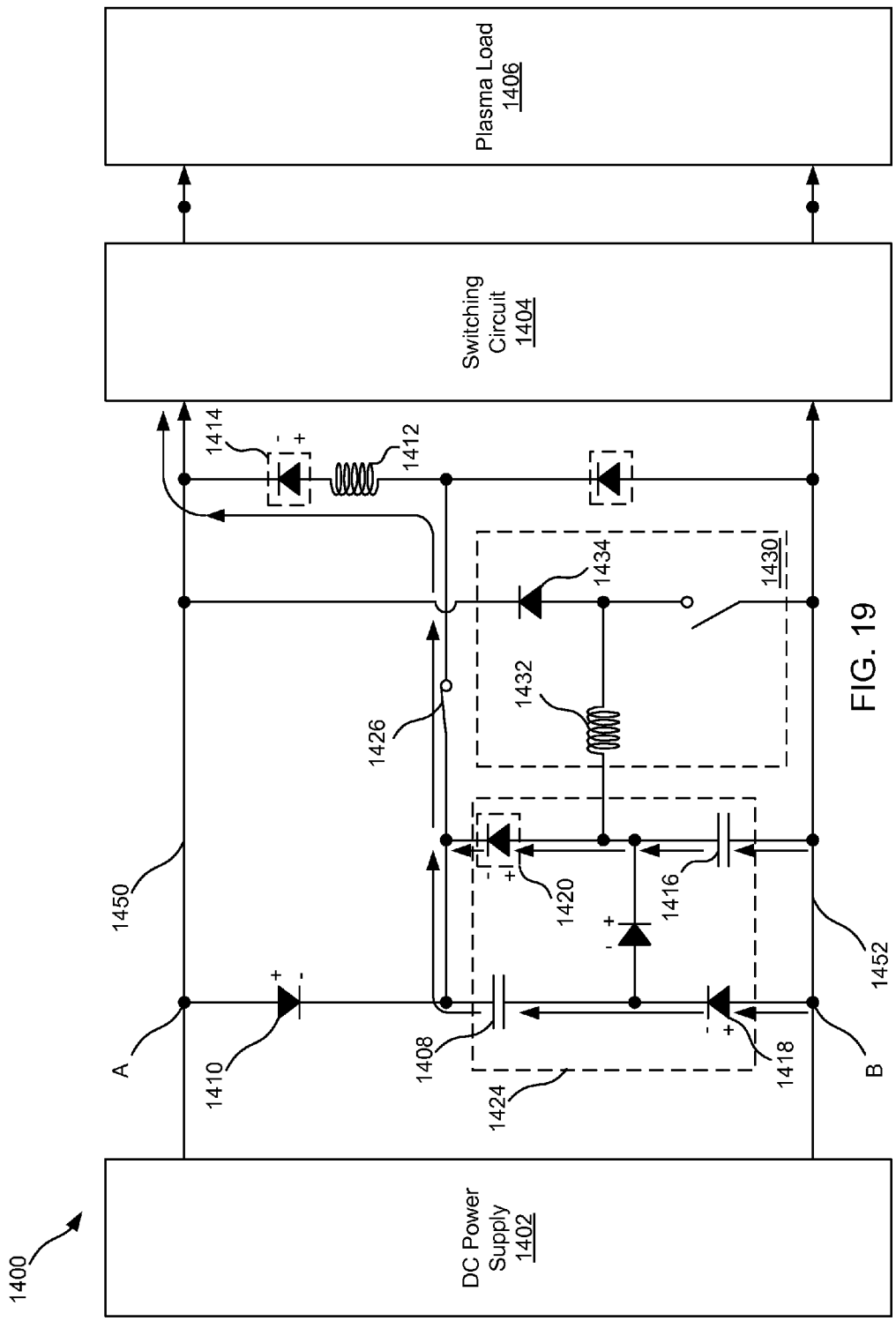
FIG. 19 illustrates the power supply system of FIG. 14 during a falling edge of a voltage boost from the snubber.

The current running along this path and the corresponding charging of the first and second capacitors 1408 and 1416 gradually falls off as the capacitors 1408 and 1416 are charged. Eventually the current flow tapers to a negligible amount or the current in the plasma ramps sufficiently to draw down the plasma load 1406 impedance to normal levels, such that power again is delivered to the plasma load 1406. When this happens, the voltage across the voltage multiplier, $V_{EB}$, is typically large enough to forward bias diode 1418 as well as optional diode 1420 if implemented, and diode 1422 turns off. The resulting current flow and diode biasing is illustrated in FIG. 19. Here, the capacitors 1408 and 1416 discharge in parallel through the closed switch 1426, the inductor 1412, and the optional diode 1414 until the capacitors 1408 and 1416 return to a voltage at which diodes 1418 and 1420 turn off (e.g., near process voltage).

In embodiments, where the voltage multiplier modifier 1430 is used to remove some portion of charge on the second capacitor 1416, optional diode 1420 is not needed, and in such embodiments the optional diode 1420 is reverse biased even if implemented. Either way, the second capacitor 1416 discharges via the inductor 1432 and diode 1434 rather than via the illustrated current path through optional diode 1420.

As the capacitors 1408 and 1416 discharge, the voltage $V_{AB}$ drops from $V_1+V_2$ to $V_1$ or the process voltage as seen in FIGS. 8A and 8B. However, this current flow can also cause the voltage fall time to be finite as illustrated in FIGS. 25A and 25B. FIGS. 25A and 25B illustrate the plots in FIGS. 8A and 8B, but include detail of the sloped voltage decrease 2500 attributable to the discharge of the capacitors 1408 and 1416 after the plasma impedance falls to normal levels.

As seen, diode 1410 is still forward biased, thus continuing to provide an instant shunt for power from the DC power supply 1402 to the voltage multiplier 1424 should it be needed. Even small amounts of power from the DC power supply 1402 can be directed into the voltage multiplier 1424, where the energy builds until the diodes 1418 and 1420 turn on and begin to discharge the capacitors 1408 and 1416. In this way, the capacitors 1408 and 1416 remain at voltages near or slightly above process voltage.

Figure 20:
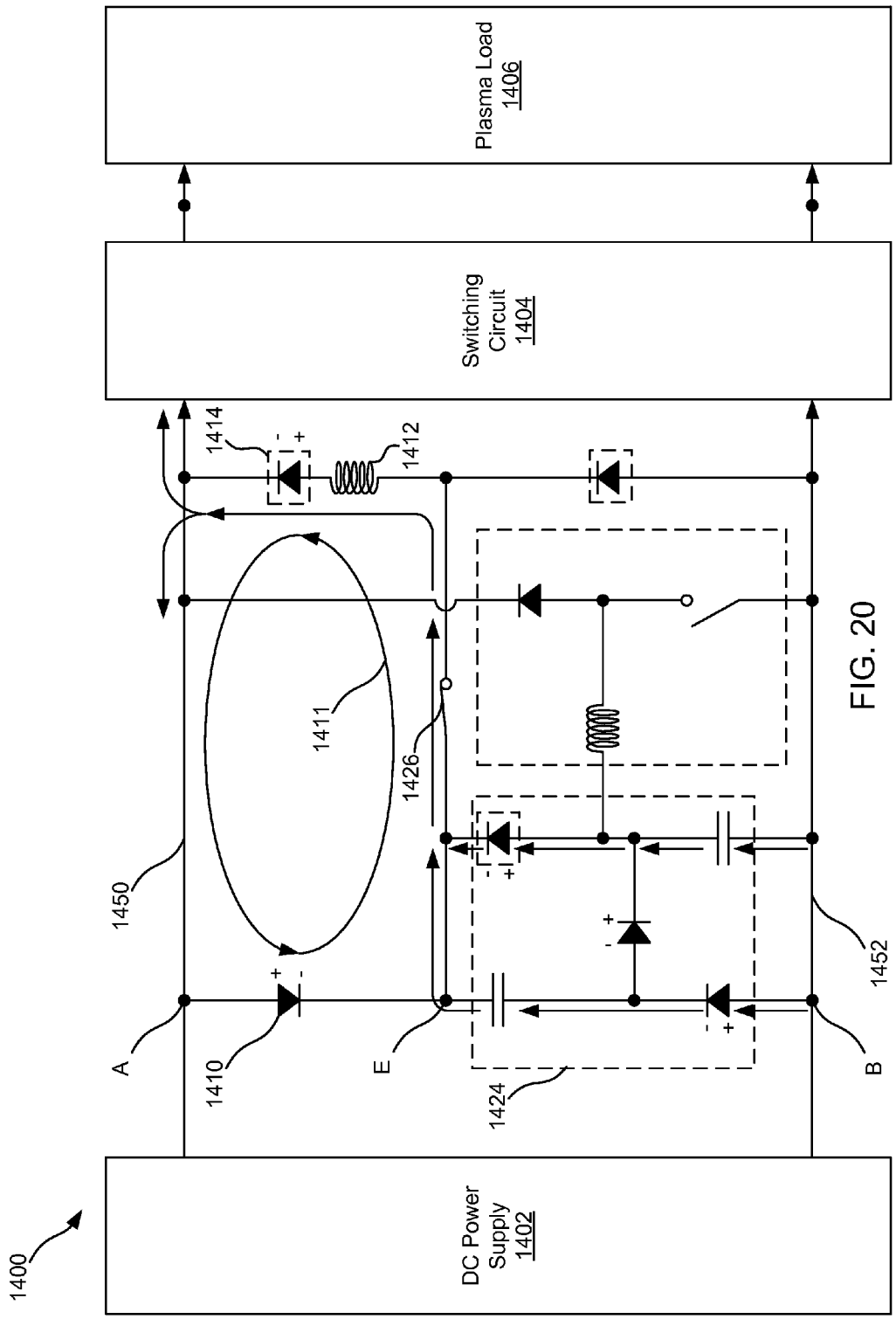
FIG. 20 illustrates the current paths and diode biases in the power supply system of FIG. 14 during a single arc event.

FIG. 20 illustrates the current paths and diode biases in the power supply system of FIG. 14 during a single arc event. During an arc, the plasma load impedance 1406 drops causing the voltage $V_{AB}$ to drop. When this happens, the voltage $V_{AB}$ typically falls below the voltage $V_{EB}$, which reverse biases the diode 1410 (illustrated as forward biased). While the voltage multiplier 1424 does discharge energy into the arc, the discharge is not large since the inductor 1412 limits the rise in current. In some cases, the inductor 1412 can be selected to be so large, that even during such an arc, the current does not appreciably rise. Thus, the voltage multiplier 1424 does not threaten to exacerbate arcs.

Figure 21:
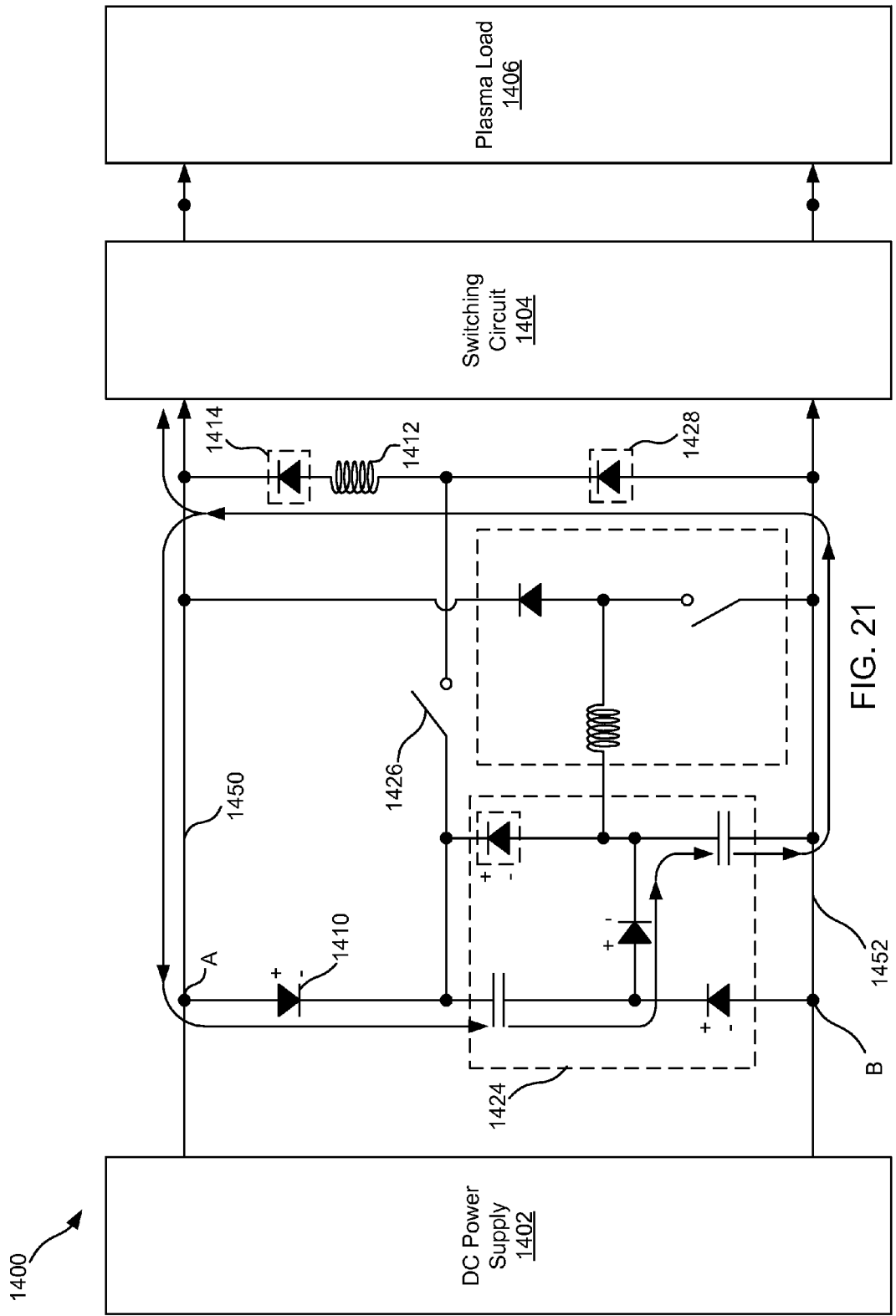
FIG. 21 illustrates the current paths and diode biases in the power supply system of FIG. 14 during a succession of high-frequency arcs.

The current leaves the snubber and heads to the switching circuit 1404 as well as back into the near-lossless loop 1411. If two arcs occur back-to-back, then the current in the inductor 1412 may step upwards due to multiple discharges from the capacitors in the voltage multiplier 1424. A series of arcs in rapid succession can stepwise increase the current to levels that could damage the diodes 1410 and 1414. Thus, when the current in the inductor 1412 reaches a threshold, the switch 1426 opens as seen in FIG. 21. The opening of the switch 1426 cuts the near-lossless loop 1411 and forces the inductor 1412 current to discharge into the voltage multiplier 1424. The inductor 1412 current ramps down and thus opening of the switch 1426 avoids runaway stepwise current ramping in the near-lossless loop 1411.

The current is illustrated as leaving the optional diode 1414 and heading either back to the diode 1410 or to the switching circuit 1404. In some cases, both current paths will be used. However, where the switching circuit 1404 is open, current does not pass to the switching circuit 1404 and instead all current passes through diode 1410 to the voltage multiplier 1424. In cases where the switching circuit 1404 is closed and there is an arc, current will prefer the path into the switching circuit 1404 and the arc. However, after the arc has ceased, or at least diminished, current may be more equally split between the two paths.

Optional diode 1428 can be included between the inductor 1412 and the second rail 1452 to provide a current path to the inductor 1412 when the switch 1426 opens, thereby avoiding voltage spikes in the inductor 1412.

Duty cycle control can be used to control the switch 1426, limiting the voltage between the rails 1450, 1452 as a protection of the snubber circuit 108 (FIG. 1) and the switching circuit 104. If the voltage increases above a set level $V_{max}$, the switch 1426 closes and the voltage across capacitors 1408 and 1416 drops towards the process voltage of the plasma. If the voltage across the rails 1450, 1452 is below set minimum voltage $V_{min}$ then switch 1426 opens. One advantage of controlling switches 1426 and 1436 is that a voltage across the capacitors 1408 and 1416 can be independently and separately controlled.

Similar control could be used to control the switch 1436 to keep the voltage across the capacitor 1416 within a range. It requires an additional measurement of that voltage to be applied. It would replace duty cycle control and allows automatic synchronization of the switching frequency of switch 1436 to the switching frequency of the circuit 1404. The value Vmax–Vmin defines the duty cycle of the switch 1436. The first and second capacitors 1408, 1416 are only charged during a first portion of each pulse from the switching circuit 1404, when the plasma has a high impedance and thus cannot draw the full current delivered from the DC power supply 1402, the inductor 1412, and the inductor 1432.

A voltage sensor (not illustrated) can monitor a voltage across the second capacitor 1416 and provide feedback to a control of the switch 1436 to control opening and closing of the switch 1436 or a duty cycle of the switch 1436. In other words, the switch 1436 can open and close, or have a duty cycle, responsive to feedback from a voltage sensor monitoring the voltage across the second capacitor 1416.

Figure 15:
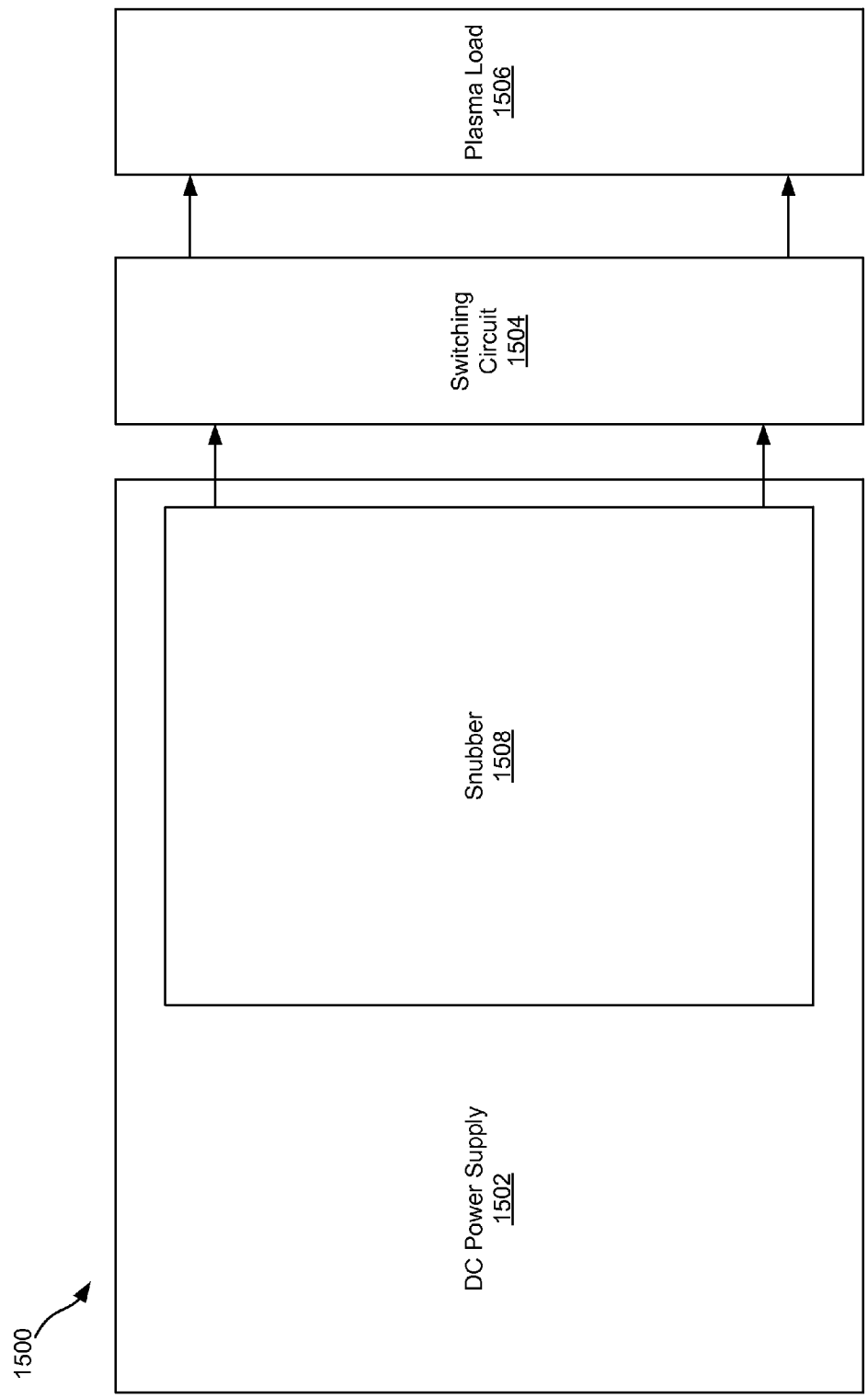
FIG. 15 illustrates a power supply system including a DC power supply providing power to a switching circuit, which then provides pulsed DC power to a plasma load.

FIG. 15 illustrates a power supply system including a DC power supply providing power to a switching circuit, which then provides pulsed DC power to a plasma load. A snubber 1508 can be incorporated into the DC power supply 1502, and power can be provided from the snubber 1508 to the switching circuit 1504.

Figure 16:
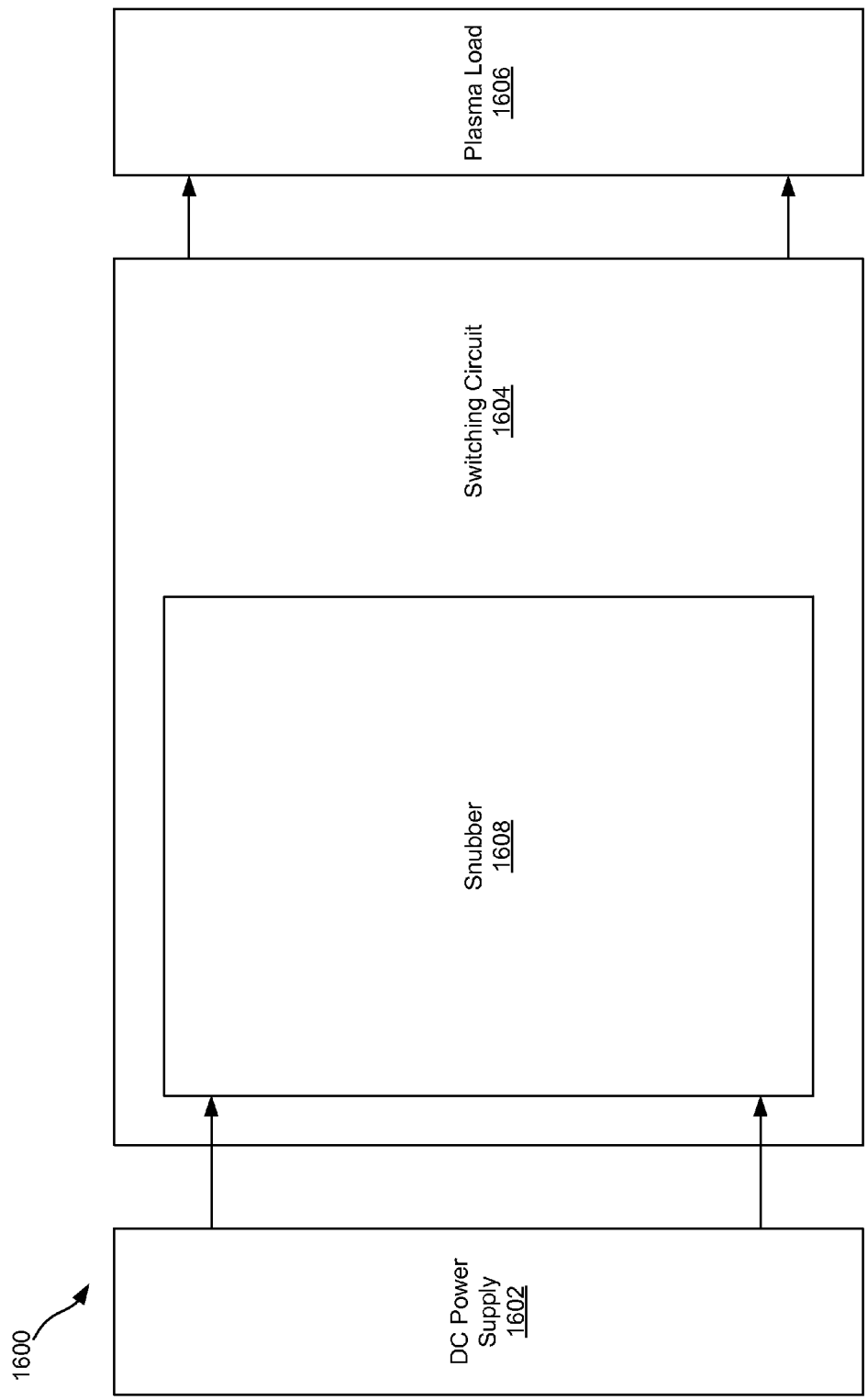
FIG. 16 illustrates a power supply system including a DC power supply providing power to a switching circuit, which then provides pulsed DC power to a plasma load.

FIG. 16 illustrates a power supply system including a DC power supply providing power to a switching circuit, which then provides pulsed DC power to a plasma load. A snubber 1608 can be incorporated into the switching circuit 1604, and power can be provided from the DC power supply 1602 to the snubber 1608.

Figure 26:
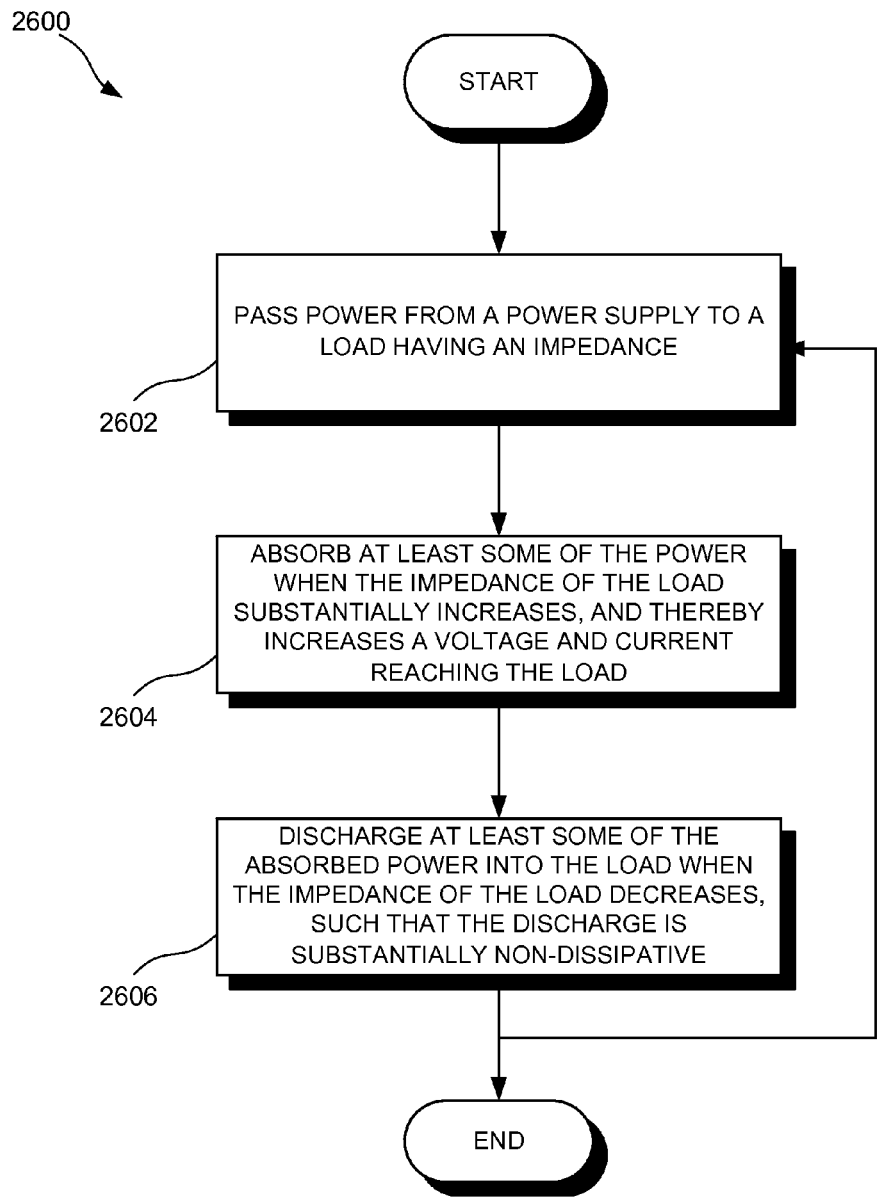
FIG. 26 illustrates a method of controlling power in a power supply system.

FIG. 26 illustrates a method of controlling power in a power supply system. The method 2600 can begin with the passage of power from a power supply (e.g., DC power supply) to a load via a pass power operation 2602. The load can have an impedance, and the impedance can change in time. When the impedance substantially increases, an absorbing at least some of the power operation 2604 can absorb at least some of the power from the power supply. Absorption of the power can cause a boost or increase to voltage and current reaching the load (e.g., 8A, 8B, 12, 25). After absorption of the power, the method 2600 can include a discharging at least some of the absorbed power operation 2606 where at least some of the absorbed power is discharged into the load. This discharge can be activated by a decrease in the load impedance and can take place in a substantially non-dissipative fashion. After the discharge operation 2606, the method 2600 can end or return to the passing power operation 2602.

Although this disclosure has focused on embodiments where snubbers are used to mitigate voltage and current spikes (or ramps) in a power supply system, and in particular for pulsed DC applications, it is envisioned that the disclosed snubber can be used in a variety of other voltage and/or current clamping situations.

Figure 22:
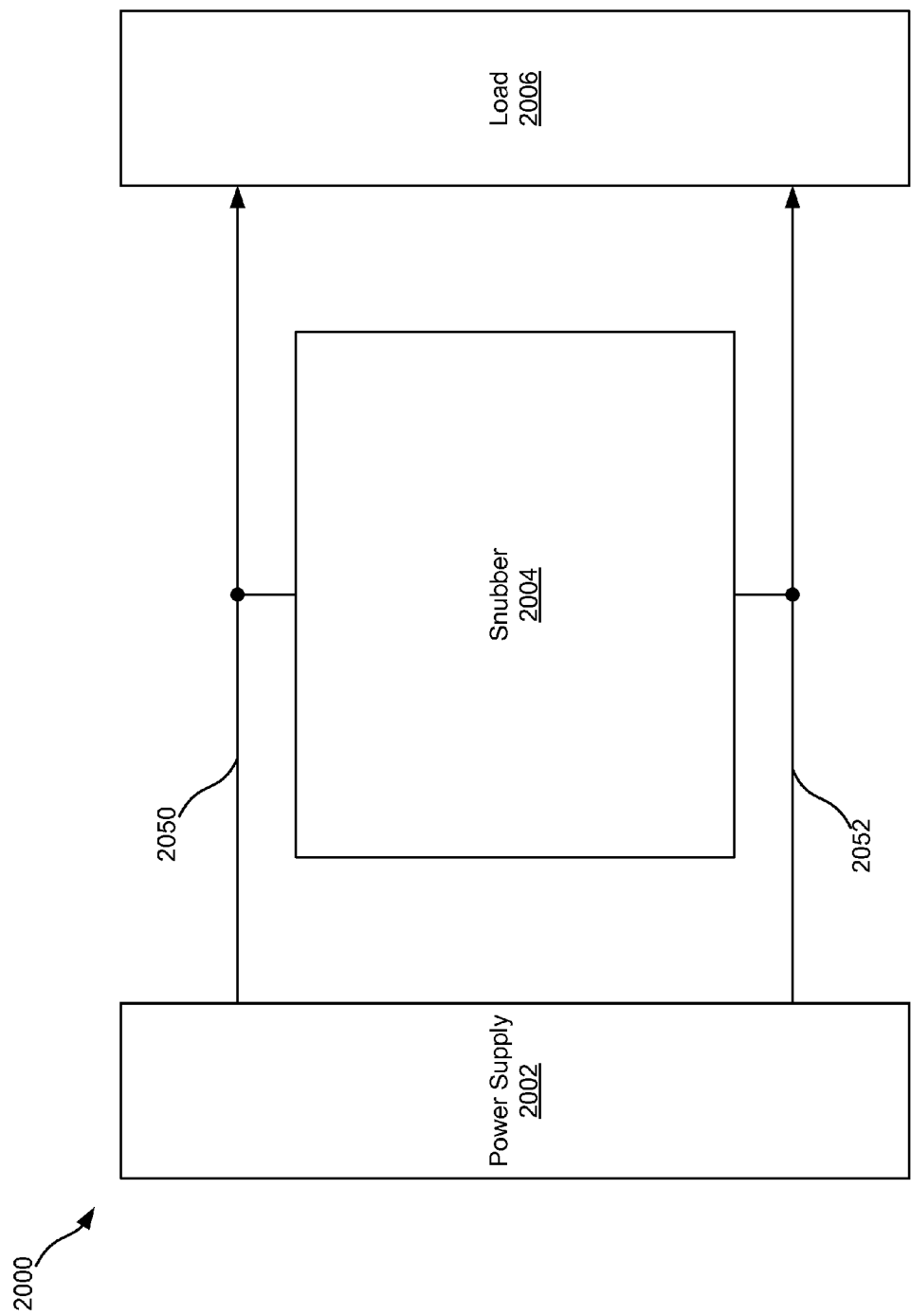
FIG. 22 illustrates another embodiment of a power supply system.

FIG. 22 illustrates another embodiment of a power supply system. A power supply (DC or AC) 2002 provides power to a load 2006 via first and second rails 2050 and 2052. The load 2006 can be a plasma load or any other type of load (e.g., a DC or AC electrical motor). A single magnetron sputtering system is one implementation of such a power supply system. A snubber 2004 can be coupled to the rails 2050 and 2052 between the power supply 2002 and the load 2006 and can be configured to absorb power from the power supply 2002 when an impedance of the load 2006 increases. As the load 2006 impedance decreases, the snubber 2004 can discharge some of its stored energy into the load 2006 to supplement power from the power supply 2002. Because little to no energy is dissipated in the snubber 2004, the snubber can be referred to as a non-dissipative snubber.

The snubber 2004 is further configured to temporarily boost a voltage as measured from the first rail 2050 to the second rail 2052, again in a non-dissipative manner. If the power supply 2002 is a power-regulated supply, then the voltage boost will result in faster current ramping when the power is first applied, or when power is reapplied in a pulsing context. This can decrease power turn on time, which can be useful in semiconductor fabrication applications, to name one example. For instance, where there is a problem with the load 2006 that drives the load 2006 impedance high (e.g., loss of plasma conductivity in a plasma processing chamber), power can be more quickly reapplied to the load 2006 after the problem has been resolved than with known snubbers.

Figure 23:
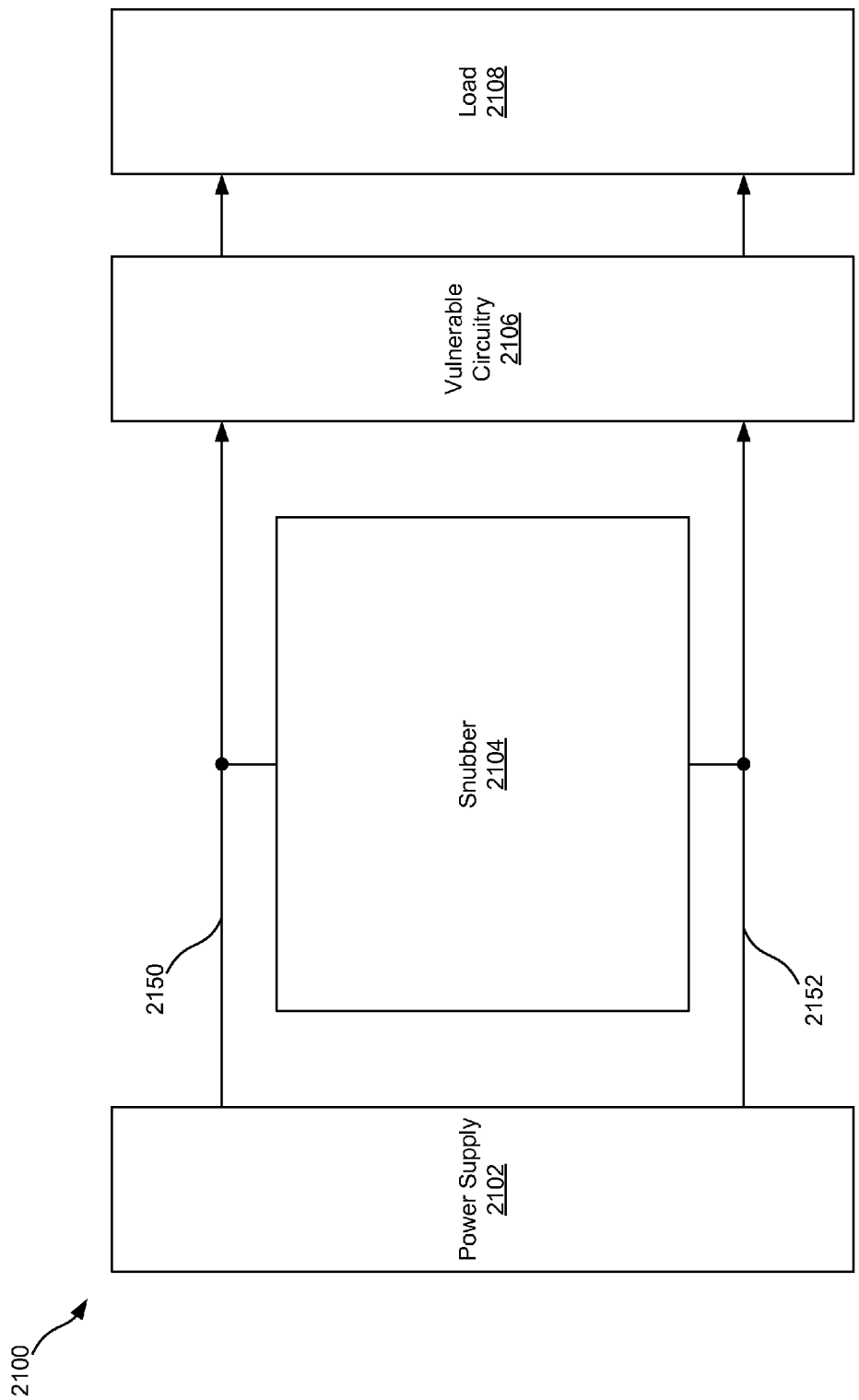
FIG. 23 illustrates yet another power supply system.

FIG. 23 illustrates yet another power supply system. A power supply (DC or AC) 2102 provides power to a load 2106 via first and second rails 2150 and 2152 and via vulnerable circuitry 2106. Vulnerable circuitry includes any circuitry that can be damaged by excessive currents or power and in particular can be damaged when an impedance of the load 2108 increases. A snubber 2104 can be coupled to the rails 2150 and 2152 between the power supply 2102 and the vulnerable circuitry 2106 and can be configured to absorb power from the power supply 2102 when an impedance of the load 2108 increases. In this way the snubber 2104 can prevent excessive power or currents from passing through the vulnerable circuitry 2106 and damaging components therein.

Returning to FIG. 24 illustrates yet a further power supply system. The power supply system 2400 can include a power supply 2402, a load 2406, a non-dissipative snubber 2460, and optionally vulnerable circuitry 2404. The snubber 2460 can be arranged between the power supply 2402 and the load 2406. The optional vulnerable circuitry 2404 can be arranged between the snubber 2460 and the load 2406.

The snubber 2460 functions much like the snubbers disclosed throughout this disclosure. However, the snubber 2460 does so using more generalized components, in order to show applications outside of the pulsed DC environment. For instance, rather than diodes, the snubber 2460 can include unidirectional switches 2410, 2414, and 2416. The snubber 2460 can also include an optional current limiter 2408 in series with the unidirectional switch 2410 as well as a current limiter 2412 in series with the unidirectional switch 2414. The snubber 2460 includes a switch 2422 and a voltage multiplier 2418. Optionally, the snubber 2460 can include a voltage multiplier modifier 2420. The snubber 2460 may further include an optional unidirectional switch 2404 arranged between the current limiter 2412 and the second rail 2452.

In some embodiments, the unidirectional switch 2410 can be arranged in series with the optional current limiter 2408, such as an inductor, so as to limit not only the direction of current into the voltage multiplier 2424, but to also limit the amount and rate of change of current entering the voltage multiplier 2424. Such an optional current limiter 2408 may be implemented to prevent current overload in the voltage multiplier 2424. In embodiments, where two or more of the herein disclosed snubbers 2460 are arranged in parallel, the optional current limiter 2408 may limit the current entering each of the snubbers so that voltage can remain at a reasonable level while still sending current to each of the two or more snubbers.

In such an embodiment, the optional current limiter 2408 in series with the first unidirectional switch 2410 can be selected so that current is able to rapidly enter and charge the voltage multiplier 2418, while the current limiter 2412 can be selected so that the voltage multiplier 2418 discharges at a lower current. This can lead to a rapid boosting of voltage to $V_1+V_2$ at the start of each DC pulse (see the first portion 802 of FIGS. 8A and 8B) while the voltage multiplier 2418 supplements the power supply 2402 current at $V_1$ over a longer second portion of each DC pulse.

In one embodiment, the first and second rails 2450 and 2452 are floating, such that neither is referenced to ground. The optional unidirectional switch 2414 can be excluded where an LC time constant is long. A "long" LC time constant is long enough to prevent the current limiter 2412 current from reversing direction. In particular, current in the current limiter 2412 would be sinusoidal without the optional unidirectional switch 2414, and so the LC time constant is preferably equal to a switching frequency of the vulnerable circuitry 2404, assuming the vulnerable circuitry 2404 includes a switching frequency. In a further preferred embodiment, the LC time constant is an order of magnitude greater than the switching frequency of the vulnerable circuitry 2404, assuming the vulnerable circuitry 2404 includes a switching frequency. The LC time constant can be calculated from the inductance of the current limiter 2412 and any capacitance of the voltage multiplier 2424. Two non-limiting examples of the vulnerable circuitry 2404 are an H-bridge (half or full bridge) and a double-pole double-throw switch network.

The load 2406 can be part of a plasma processing chamber, such as those used in plasma sputtering. Power can be provided to the load 2406 via one or more electrodes such as those in dual-magnetron sputtering (one or more magnetrons can also be used).

One of skill in the art will recognize that the plots of voltage and current (e.g., FIGS. 2A, 2B, 8A, 8B, 25A, and 25B are not necessarily drawn to scale, and that the shape and scale of different features of the waveforms can change depending on the circuits used to generate these waveforms. For instance, the pulse width of the voltage increase at the start of each pulse may vary depending on the power passing to the snubber and depending on capacitance values within the snubber (e.g., the capacitances of the first capacitor 1408 and the second capacitor 1416 in FIG. 14). As another example, vertical aspects of the voltage pulses illustrated in FIGS. 8A and 8B may have less than infinite slope in practice. For instance, the falling edge of the boosted voltage (the first portion of each pulse) can have a negative slope that is a function of inductance and capacitance. The front vertical aspect of each pulse can in practice include an exponentially increasing portion for $V_2$ where the boost voltage rises above $V_1$ as a function of charge accumulation on the capacitors 1408 and 1416 in FIG. 14. Furthermore, while the current waveforms show a flat or near flat portion during a latter portion of each pulse, in practice the slope of this portion of the current waveform can vary and be non-zero. These examples demonstrate that the plots of voltage and current in the figures are meant as illustrations and generalizations only, and that variations on these specific waveforms can be made without departing from the scope of this disclosure.

Discussion will now turn to embodiments particularly suited for, although not limited to, unipolar plasma sputtering applications. For the purposes of this disclosure, a "sputtering cathode" is an electrode that is both an electrode and a target and can therefore act as an electrode and also sputter itself onto a substrate. A sputtering cathode is typically paired with one or more anodes, which are not made from sputtering target material, and thus reversal of voltage polarity does not sputter the anode as in an 'anodeless' sputtering scheme.

The embodiments disclosed below referring to FIGS. 29-43 solve the problem of charge buildup on a sputtering cathode powered via unipolar DC pulses by periodically reversing the voltage applied between the cathode and the anode in order to remove charge from the sputtering cathode. This periodic voltage reversal can remove some or all of the charge buildup on the sputtering cathode and thus reduce or eliminate arcing caused by such charge buildup. Some embodiments utilize circuitry from the bipolar snubber embodiments, described earlier, in unipolar situations where a negative portion of the waveform is used to remove charge from the sputtering cathode.

Figure 28:
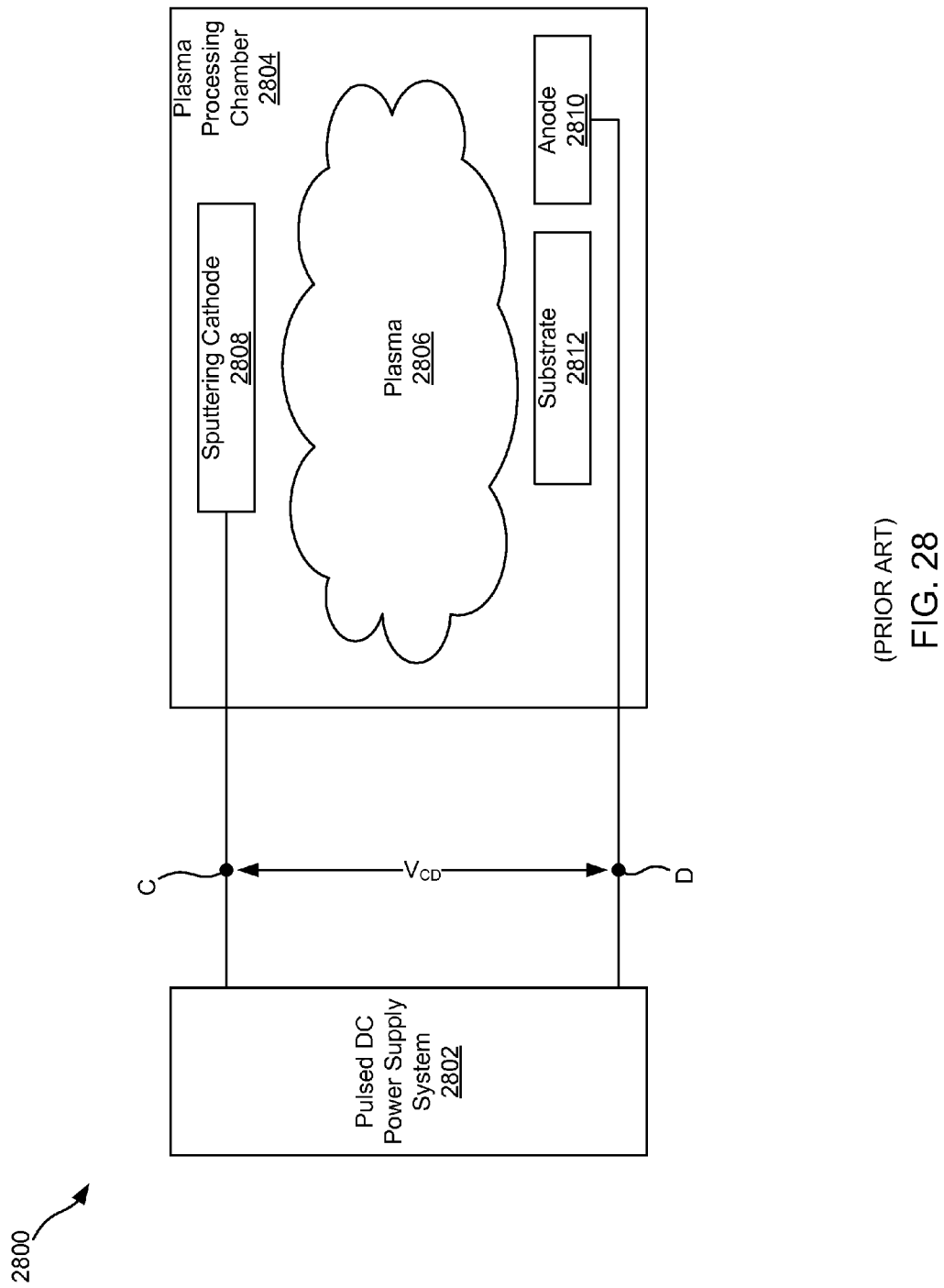
FIG. 28 illustrates a pulsed DC power supply system providing pulsed DC power to a sputtering cathode-anode pair of a plasma processing chamber.
Figure 37:
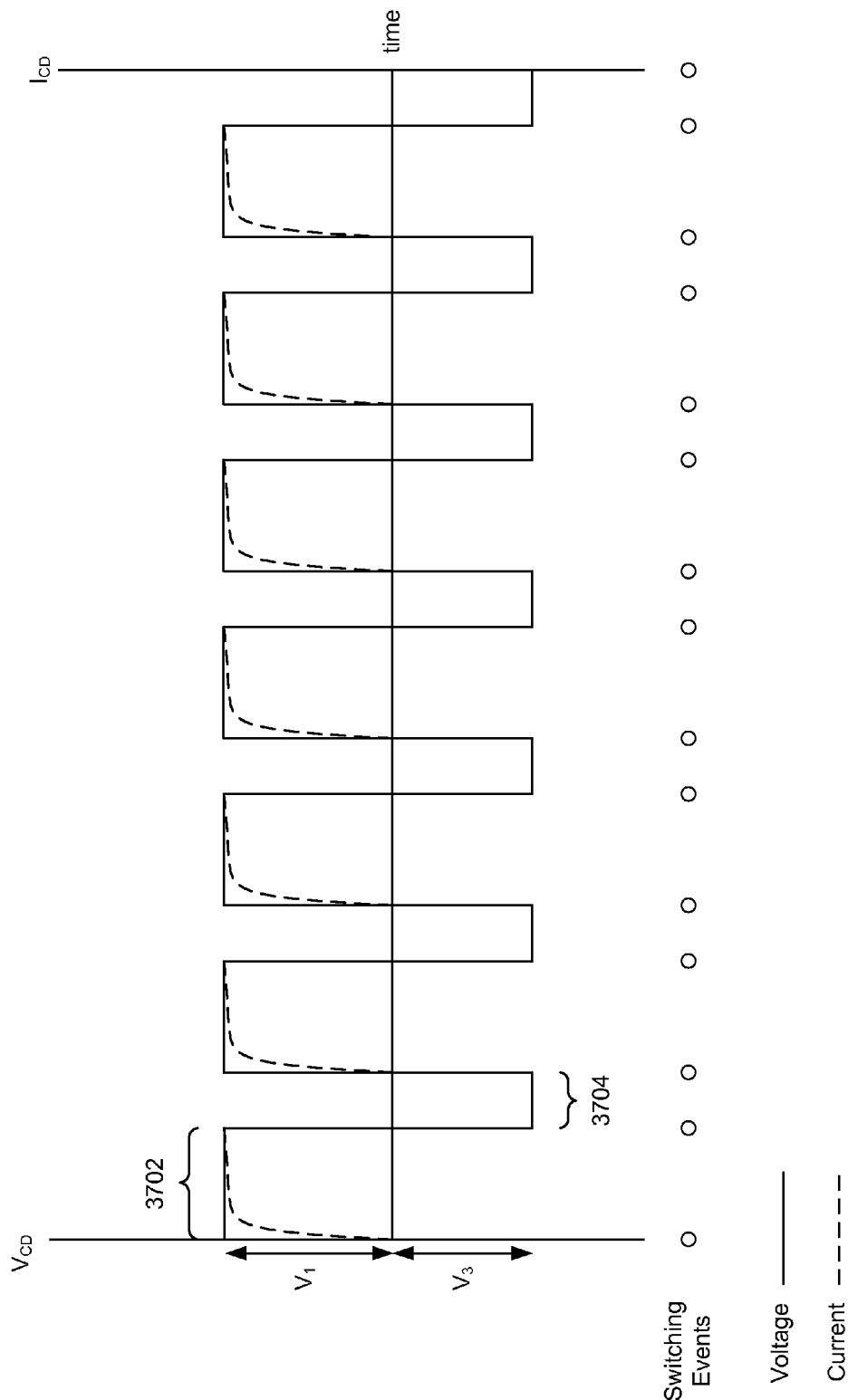
FIG. 37 illustrates a voltage versus time plot showing a first embodiment of a pulse pattern for unipolar pulsed power delivery to a cathode-anode pair along with charge removal.

FIG. 37 illustrates a voltage versus time plot showing a first embodiment of a pulse pattern for unipolar pulsed power delivery to a cathode-anode pair along with charge removal. The DC pulse pattern includes a positive portion of the waveform, when the sputtering cathode is sputtering, and a negative portion of the waveform, when charge is being removed from the cathode. A positive voltage ("power delivery voltage") is applied from the anode to the cathode during a power delivery period 3702 and a negative voltage ("charge removal voltage") is applied from the anode to the cathode during a charge removal period 3704. FIG. 37 shows voltage $V_{CD}$, which is measured across outputs from the pulsed DC power supply system and is thus referenced from the anode 2810 to the sputtering cathode 2808 of FIG. 28 (which may differ from voltages between either electrode and the substrate).

The magnitude of the charge removal voltage $|V_3|$ is not limited, although it has been found that large charge removal voltage magnitudes (e.g., where $|V_3|{\sim}|V_1|$) not only remove charge from the cathode, but also sputter anode material onto the cathode thus degrading the cathode purity as a target and degrading sputtered film characteristics. Thus, in some embodiments, the magnitude of the charge removal voltage can be less than the process voltage (e.g., $|V_3|<|V_1|$). In some embodiments, the charge removal voltage can have a magnitude that is 10%-90% or 10%-20% of the process voltage. In one in embodiment the charge removal voltage can be up to 150 V, although higher voltages are also envisioned.

The power delivery period 3702 is typically longer than the charge removal period 3704 in order to maximize sputtering time. Sputtering time decreases every time that a charge removal voltage is applied, so the charge removal period 3704 tends to be substantially shorter than the power delivery period 3702.

Although not illustrated, there may be a transition period between switching such that the voltage between the cathode and anode drops to 0 V and is maintained at 0 V or substantially 0 V for a finite period of time, a "transition time period", before being driven negative during the charge removal period 3704. During the transition time period, no power, or substantially no power, is delivered to the cathode-anode pair. The transition time period may be referred to as an off-time period, and in some embodiments, the off-time period is shorter than an arc detection time period so that the off-time period is not erroneously registered by a DC power supply as an undesirable arc.

A switching circuit switches the polarity of voltage provided between the cathode and anode at the end of each power delivery period 3702 and at the end of each charge removal period 3704 as shown via the "Switching Events" indicators.

Figure 38:
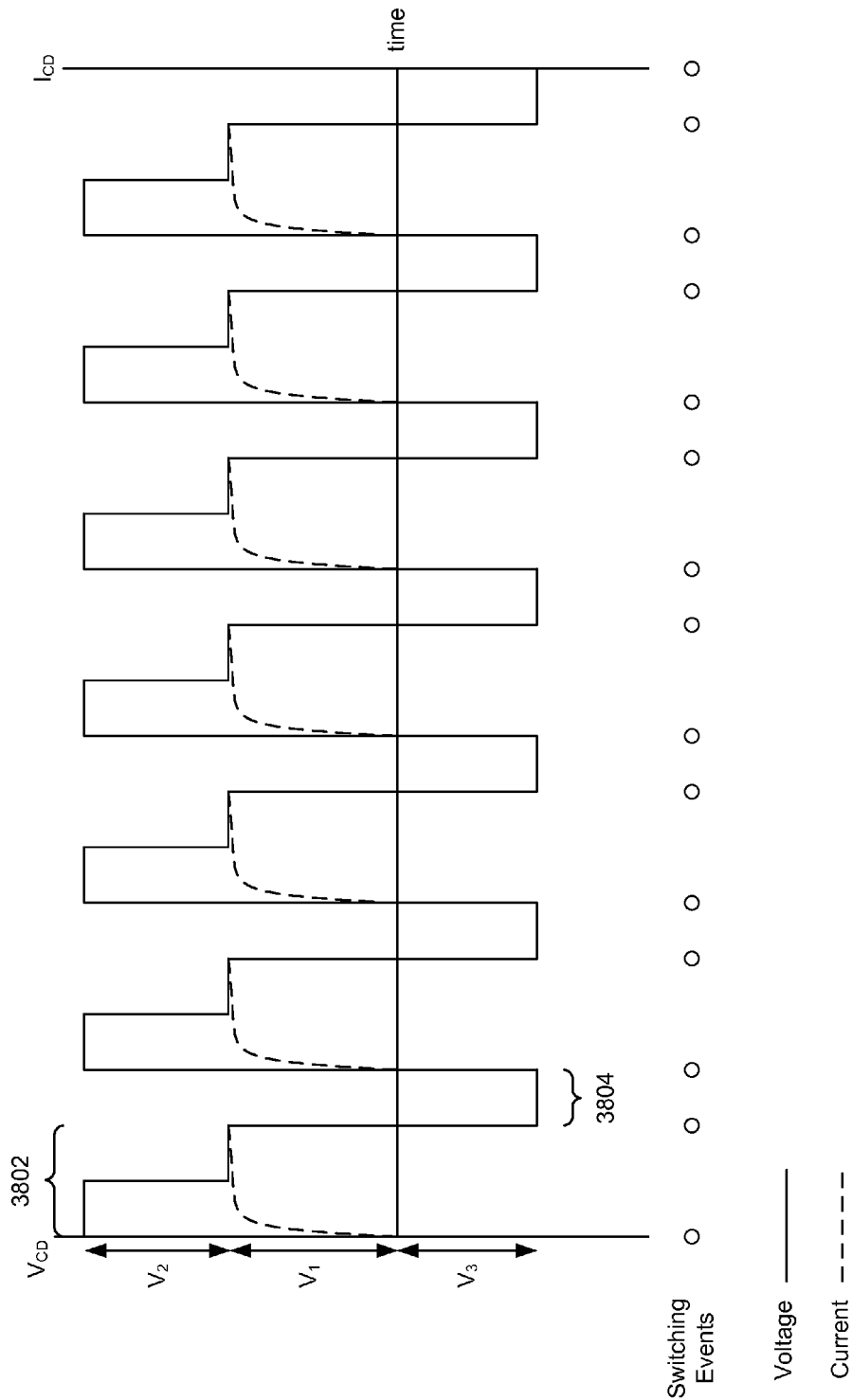
FIG. 38 illustrates a voltage versus time plot showing an embodiment of a DC pulse pattern for unipolar pulsed power delivery to a cathode-anode pair along with charge removal.

FIG. 38 illustrates a voltage versus time plot showing an embodiment of a DC pulse pattern for unipolar pulsed power delivery to a cathode-anode pair along with charge removal. The DC pulse pattern includes a positive portion of the waveform, when the sputtering cathode is sputtering, and a negative portion of the waveform, when charge is being removed from the cathode. A positive voltage (the power delivery voltage) is applied from the anode to the cathode during a power delivery period 3802 and a negative voltage (the charge removal voltage) is applied from the anode to the cathode during a charge removal period 3804. FIG. 38 shows voltage $V_{CD}$, which is measured across outputs from the pulsed DC power supply system and is thus equal to the voltage between the anode 2810 and the sputtering cathode 2808 of FIG. 28 (which may differ from the cathode to substrate or anode to substrate voltages).

The power delivery period 3802 sees a power delivery voltage similar to that described earlier in this application having a "boosted voltage" ($V_1+V_2$) during a first portion of the power delivery period 3802 and a constant (or substantially constant) process voltage ($V_1$) during a remainder of the power delivery period 3802. The boosted voltage can include a "voltage boost" ($V_2$) relative to the process voltage ($V_1$). In an embodiment, the process voltage can be 500 V and the boost voltage can be between 0-500 V. In other words, the boost voltage can raise the power delivery voltage up to twice the processing voltage (or greater, depending on the circuitry used to provide the boost voltage). The addition of the boost voltage during a first portion of each power delivery period causes current and hence power to ramp at a faster rate than without the boost voltage as described earlier in this application (e.g., see the rapidly-ramping current curve in FIG. 38).

After the power delivery period 3802, the sign of $V_{CD}$ changes, however, unlike earlier bipolar embodiments, in this unipolar embodiment, the negative portion of the waveform is not symmetric to the positive portion (e.g., compare FIG. 38 and FIG. 8A) since its primary purpose is to quickly remove charge from the cathode rather than to sputter. Thus, the negative portion of the waveform, which occurs over a charge removal period 3804, merely reaches and temporarily maintains a charge removal voltage ($V_3$) before switching back to a positive voltage and starting a next power delivery period 3802. This pattern repeats such that the cathode sputters during the power delivery periods 3802 and charge is removed from the cathode during each charge removal period 3802.

There is a desire to provide a charge removal voltage that is less than the process voltage. In some embodiments, the charge removal voltage can have a magnitude that is 10%-90% or 10%-20% of the process voltage $V_1$. In one embodiment the charge removal voltage can be up to 150 V, although higher voltages are also envisioned. In some cases the charge removal voltage can be at least partially linked or dependent on the boost voltage while in other instances it can be independent from the boost voltage and independently controlled.

Since there is a desire to maintain plasma intensity and maximize time in which sputtering is taking place, and since each charge removal period 3804 diminishes plasma intensity and reduces an amount of time that sputtering occurs, the charge removal period 3804 can be shorter than the power delivery period 3802. As illustrated, the charge removal period 3804 is half as long as the power delivery period 3802. However, this is merely illustrative, and various other ratios of the periods are envisioned.

Although not illustrated, there may be a transition period between switching such that the voltage between the cathode and anode drops to 0 V and is maintained at 0 V or substantially 0 V for a finite period of time, a "transition time period", before being driven negative during the charge removal period. During the transition time period, no power, or substantially no power, may be delivered to the cathode-anode pair. The transition time period may be referred to as an off-time period, and in some embodiments, the off-time period is shorter than an arc detection time period so that the off-time period is not erroneously registered by a DC power supply as an undesirable arc.

A switching circuit switches the polarity of voltage provided between the cathode and anode at the end of each power delivery period 3802 and at the end of each charge removal period 3804 as shown via the "Switching Events" indicators.

The DC pulse patterns of FIGS. 37 and 38 can be generated via pulsed DC power supply systems illustrated in FIGS. 29-36 and 40. These embodiments largely entail similar components to those seen and described relative to the bipolar embodiments previously described. However, a charge removal bias circuit is added that provides the voltage for the charge removal period 3804, and the switching pattern within the switching circuit is altered from the bipolar embodiments previously described.

Figure 29:
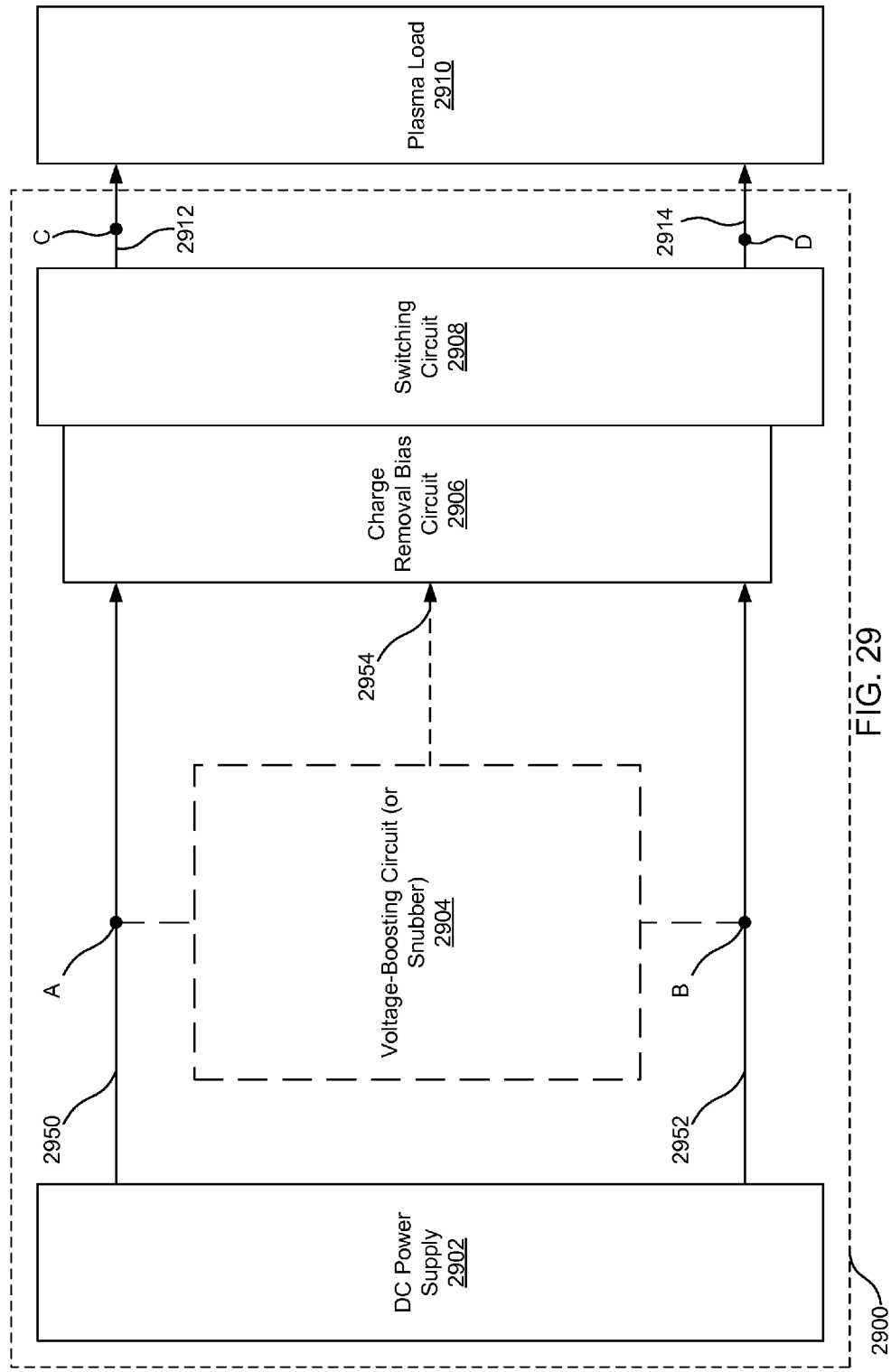
FIG. 29 illustrates one embodiment of a pulsed DC power supply system configured to provide pulsed DC power to a plasma load.

FIG. 29 illustrates one embodiment of a pulsed DC power supply system 2900 configured to provide pulsed DC power to a plasma load. In this embodiment, and those that follow, sputtering and other plasma processing is achieved via unipolar power delivered to one or more sputtering cathodes in a plasma processing chamber along with a negative charge removal voltage pulse being applied in between each power delivery pulse (e.g., see FIGS. 37 and 38). In this sense, sputtering is achieved via unipolar power delivery, though some may consider the overall waveform to be bipolar. Although pulsed DC power can be delivered to multiple sputtering cathodes from either one or more pulsed DC power supply systems 2900, for clarity and simplicity, this and subsequent embodiments will only discuss a single pulsed DC power supply system 2900.

The pulsed DC power supply system 2900 can include a DC power supply 2902 configured to provide power to a first and second rail 2950, 2952 at a rail voltage $V_{AB}$ that varies depending on an impedance of the plasma load 2910. A switching circuit 2908 can be coupled to the first and second rails and can provide the pulsed DC voltage between the first cathode and the first anode. A charge removal bias circuit 2906 can be configured to provide a magnitude of the charge removal voltage $V_3$ to the switching circuit 2908. The switching circuit 2908 thus receives voltages from the first and second rails 2950, 2952 and from the charge removal bias circuit 2906, selectively applies the rail voltage $V_{AB}$ and the charge removal voltage $V_3$ (inverse polarity to the voltage provided by the charge removal bias circuit) to the plasma load 2910.

The rail voltage $V_{AB}$ can optionally be further controlled via an optional voltage-boosting circuit 2904, which in some cases can be a snubber or include snubber functionality (e.g., the ability to absorb power from the DC power supply 2902 when the plasma load impedance 2910 rises). In some embodiments, the voltage-boosting circuit 2904 can include components and functionality of the snubber circuits previously described. The voltage-boosting circuit 2904 can be coupled between the first and second rails 2950, 2952 and can be configured to boost the rail voltage $V_{AB}$ by a boost voltage ($V_2$) during a first portion of each power delivery period. The rail voltage or boosted voltage is thus equal to $V_1+V_2$.

For instance, during the power delivery period, the rail voltage $V_{AB}$ is the process voltage ($V_1$) for the entirety of the power delivery period where the voltage-boosting circuit 2904 is not implemented. On the other hand, where the voltage-boosting circuit 2904 is implemented, the rail voltage $V_{AB}$ is initially the boosted voltage ($V_1+V_2$) for a first portion of the power delivery period and then drops to the process voltage ($V_1$) for a remainder of the power delivery period.

These voltages are provided to the plasma load 2910 via the switching circuit 2908 during the power delivery period. The switching circuit 2908 then switches to providing the charge removal voltage to the plasma load 2910 for the charge removal period.

Figure 33:
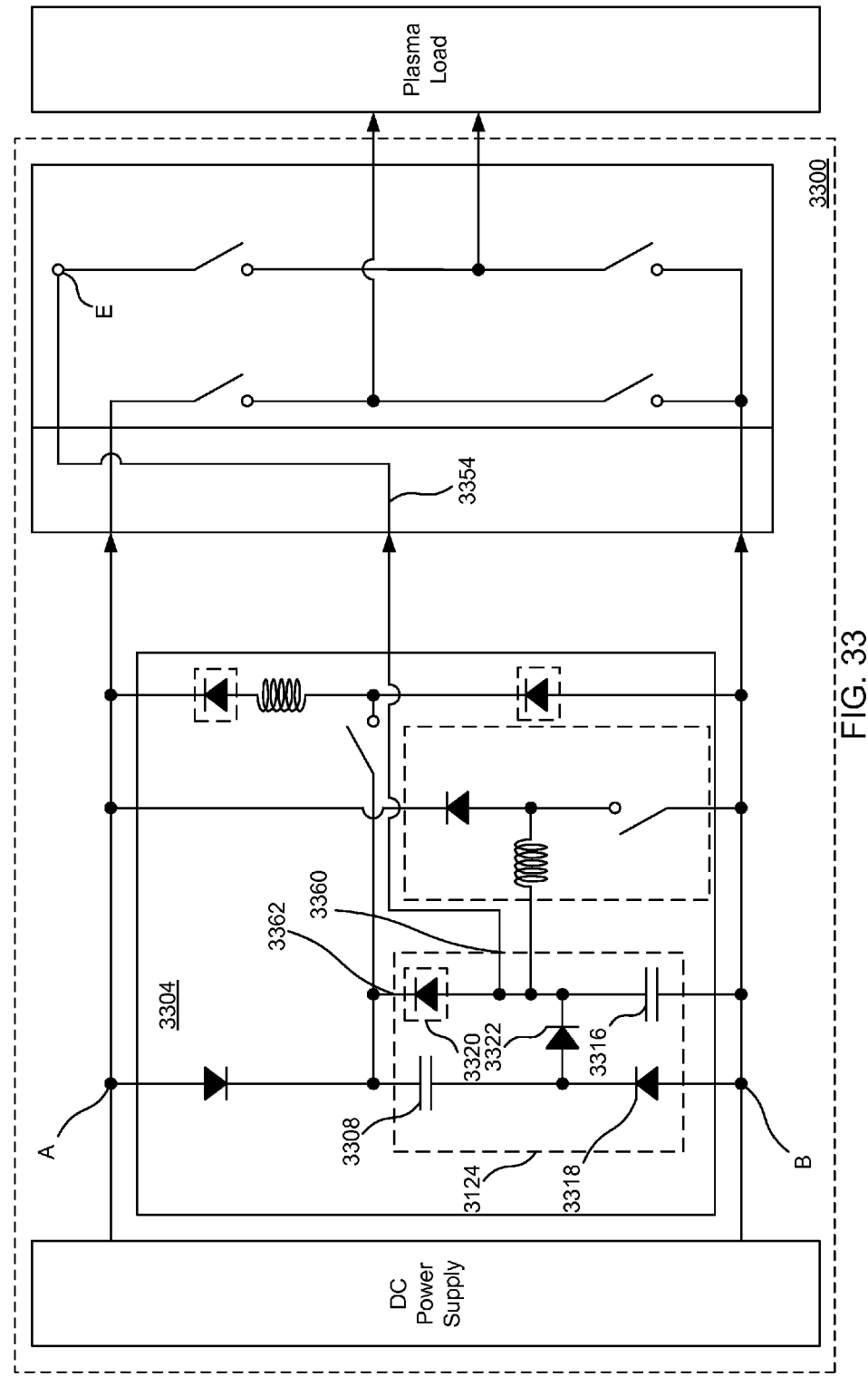
FIG. 33 illustrates details of an embodiment of the voltage multiplier of FIGS. 31 and 32.
Figure 34:
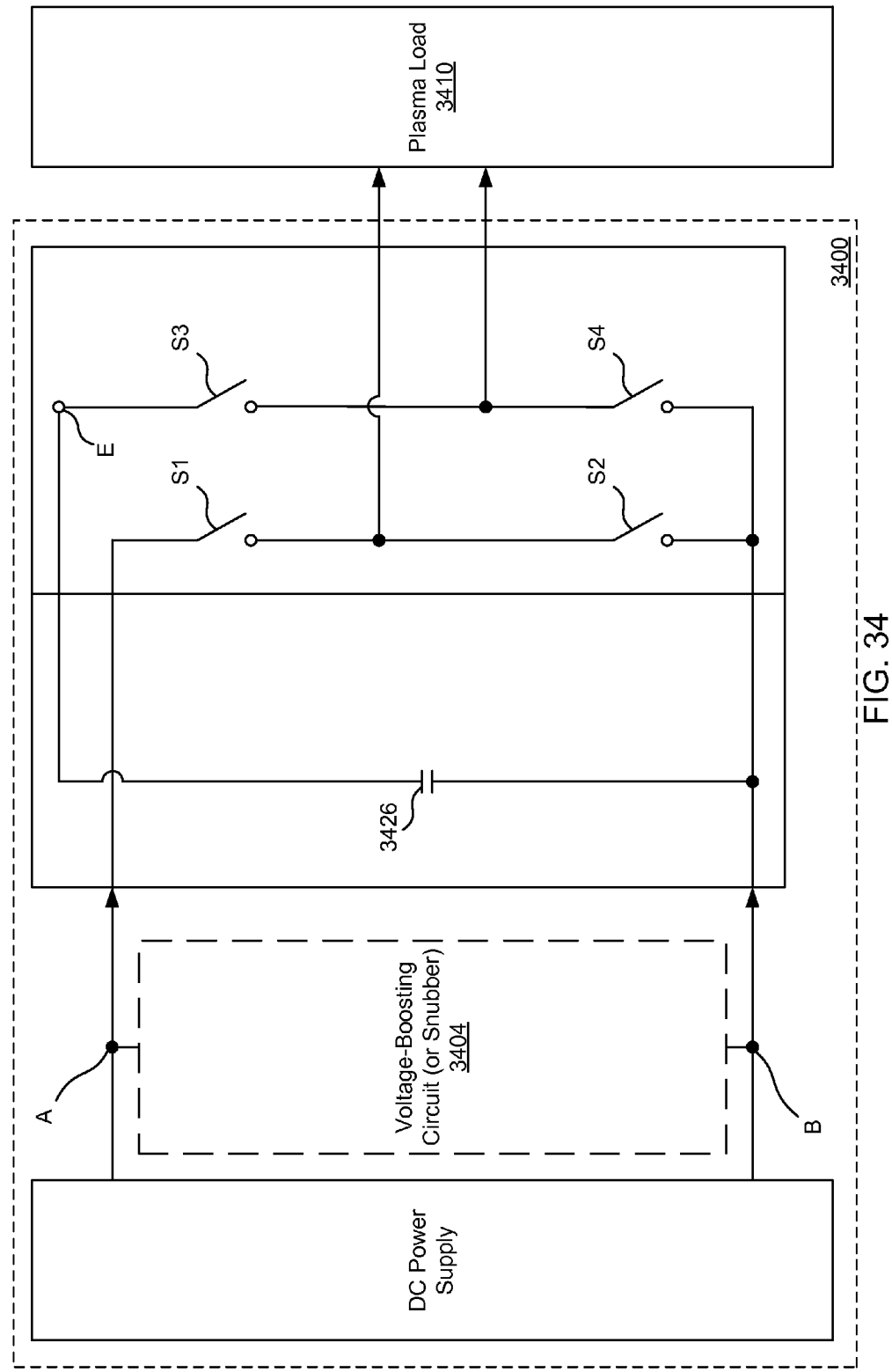
FIG. 34 illustrates another embodiment of a pulsed DC power supply system showing details of a charge removal bias circuit and a switching circuit.
Figure 35:
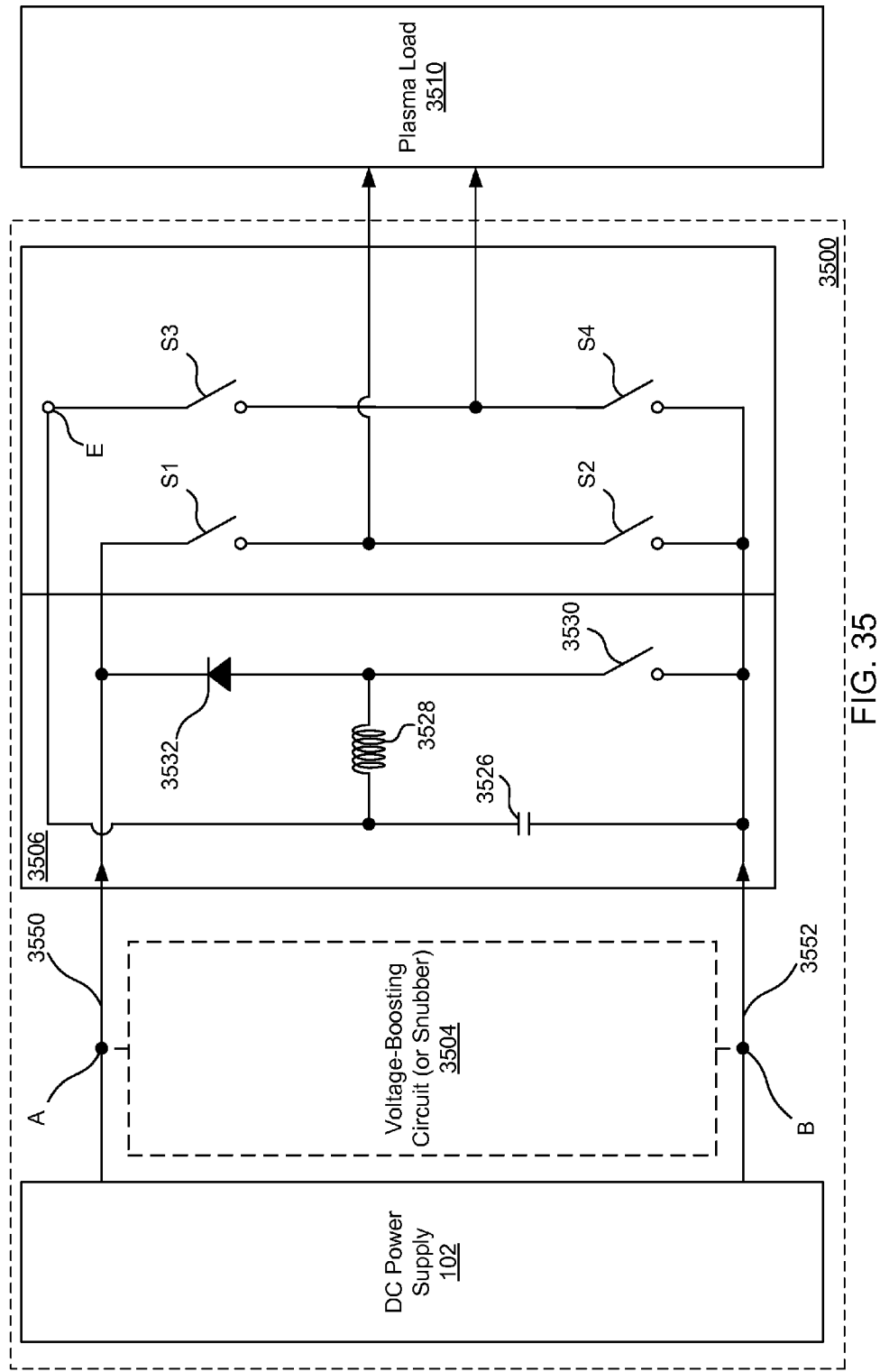
FIG. 35 illustrates a pulsed DC power supply system including a charge removal bias circuit that enables control of the charge removal voltage $V_3$.
Figure 36:
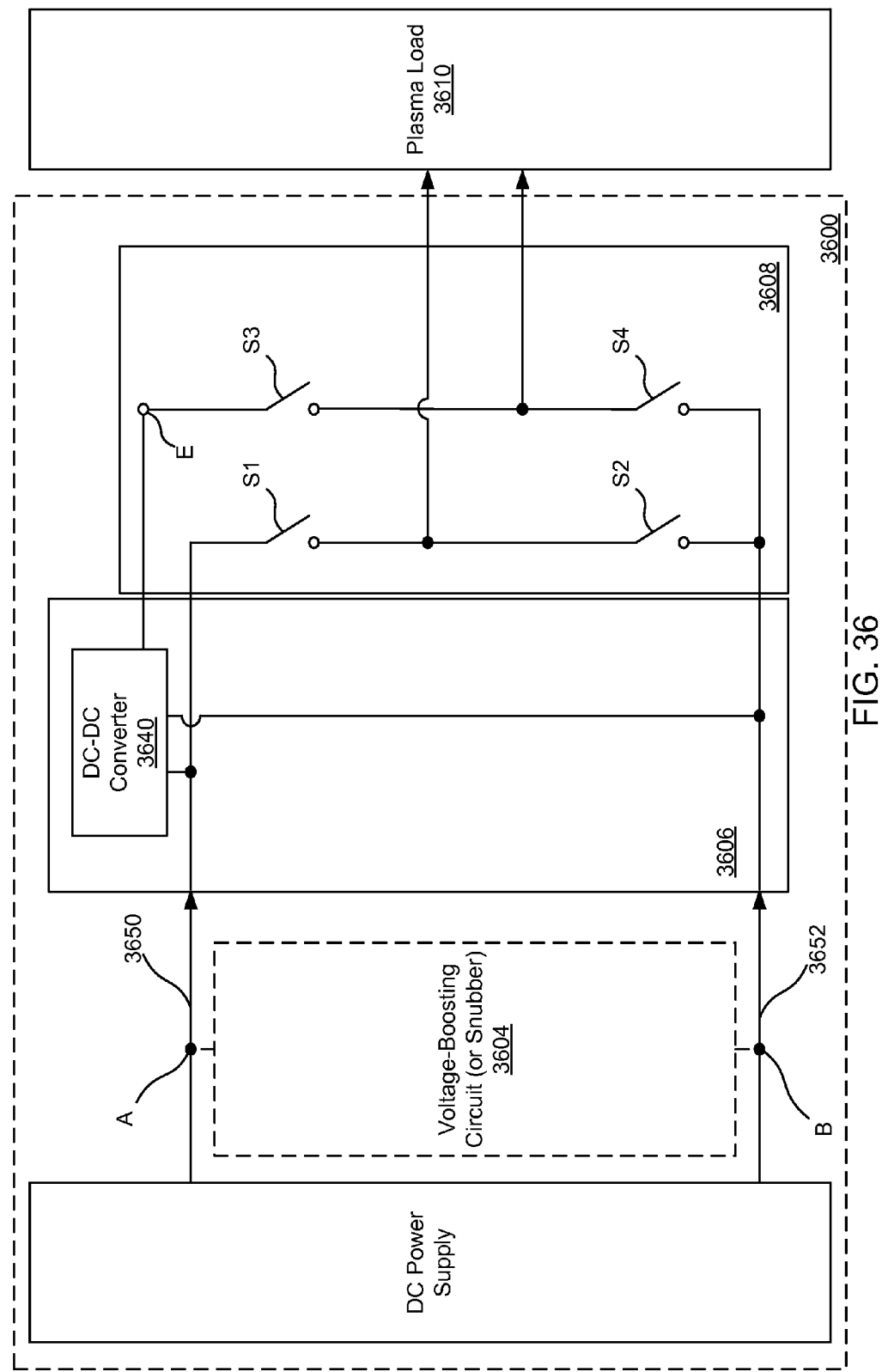
FIG. 36 illustrates an alternative pulsed DC power supply system enabling the rail voltage $V_{AB}$ to be tapped and down converted for use as the charge removal voltage.

The charge removal voltage can optionally be taken from within the voltage-boosting circuit 2904 via optional current pathway 2954 (e.g., FIGS. 30-33 and 40) or can be generated via circuitry within the charge removal bias circuit 2906 (e.g., FIGS. 34-36). For instance, a capacitive element within the charge removal bias circuit 2906 can be charged via current generated in the plasma thus generating a naturally-occurring charge removal voltage (e.g., FIG. 34). As another example, a boost converter in combination with a capacitive element can be used to generate a controlled charge removal voltage (e.g., FIG. 35). As a further example, a DC-DC converter (e.g., a buck converter) can take the rail voltage $V_{AB}$ and down-convert it to the charge removal voltage (e.g., FIG. 36).

Said another way, the switching circuit 2908 provides the rail voltage $V_{AB}$ to the plasma load 2910 during a power delivery period, where the voltage measured from the first output 2912 to the second output 2914 (or from the sputtering cathode 2808 to the anode 2810) is positive and provides a charge removal voltage $V_3$ from the charge removal bias circuit 2906 to the plasma load 2910 during a charge removal period, where the voltage measured from the first output 2912 to the second output 2914 (or from the anode 2810 to the sputtering cathode 2808) is negative.

Figure 30:
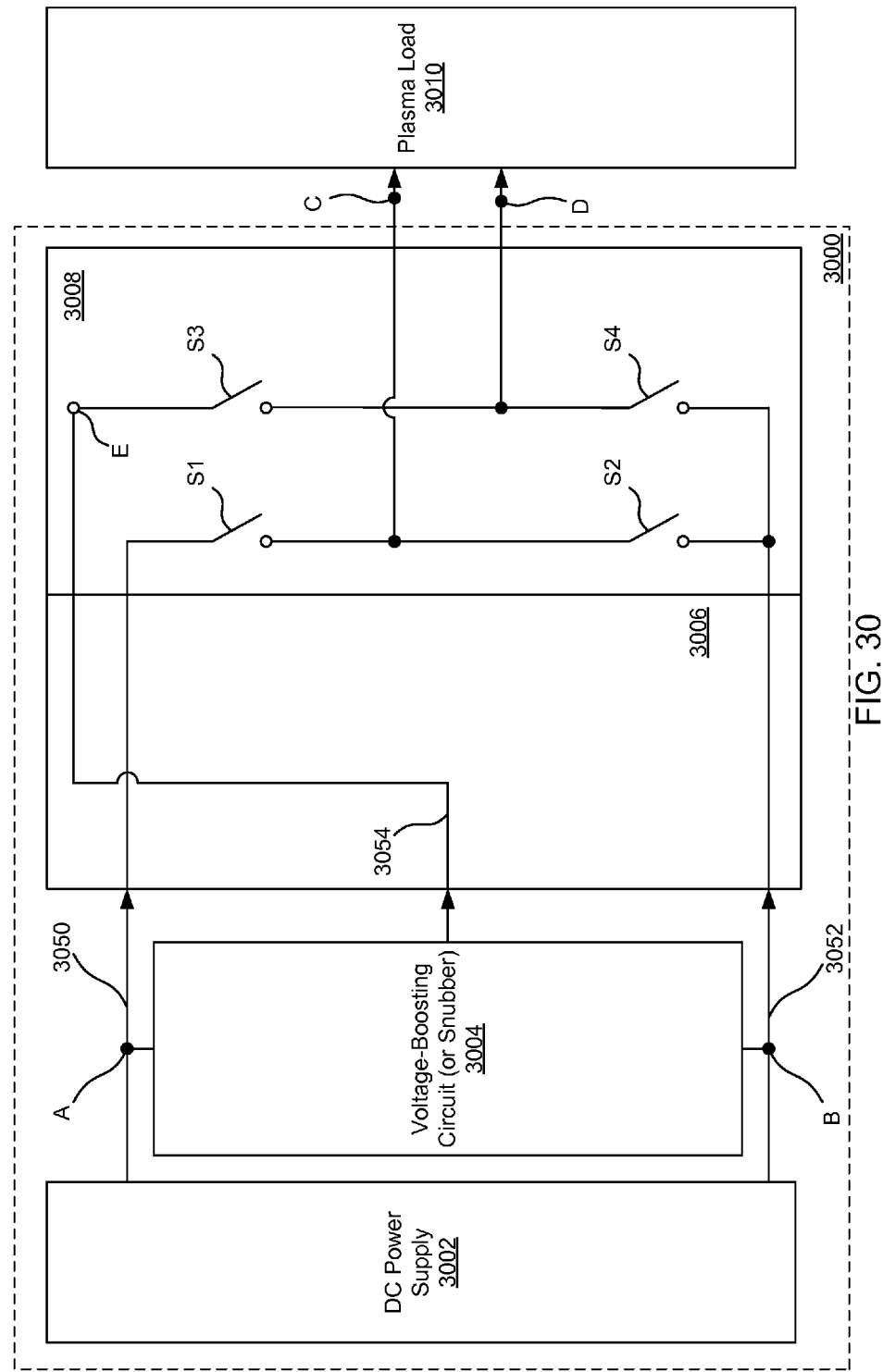
FIG. 30 illustrates an embodiment of details making up a charge removal bias circuit and a switching circuit as illustrated in FIG. 29.

FIG. 30 illustrates an embodiment of details making up a charge removal bias circuit and a switching circuit as illustrated in FIG. 29. The illustrated switching circuit 3008 comprises an h-bridge made up of a first switch (S1), a second switch (S2), a third switch (S3), and a fourth switch (S4).

The DC power supply 3002 can provide power to the switching circuit 3008 via the first and second rails 3050, 3052. The voltage provided can be the process voltage $V_1$ during steady-state (e.g., when the plasma is ignited and stable and thus providing limited impedance to the DC power supply 3002), for instance via S1 and S4. However, after the switching circuit 3008 switches, when the voltage provided to the plasma load 3010 approaches or crosses 0 V, the plasma may be extinguished or approach extinction, thus presenting a large impedance to the DC power supply 3002. Thus, after switching, current from the DC power supply 3002 is directed primarily into the voltage-boosting circuit 3004 and charges one or more components within the voltage-boosting circuit 3004 (e.g., capacitive components such as capacitors). This charging raises the rail voltage $V_{AB}$ by the boost voltage $V_2$, which in turn is provided to the plasma load 3010 via the switching circuit 3008, and in particular via S1 and S4. As the plasma ignites and returns to a steady-state ion density it presents a lower impedance to the DC power supply 3002, which in turn causes current from the DC power supply 3002 to begin ramping down into the voltage-boosting circuit 3004, and instead ramping up into the plasma load 3010. As this occurs, the rail voltage $V_{AB}$ decreases until it reaches the process voltage $V_1$. At this point, current passes primarily into the plasma load 3010 and the rail voltage $V_{AB}$ remains at the process voltage $V_1$ for the remainder of the power delivery period. The result of these changes to the rail voltage $V_{AB}$ and the fact that switch S1 and S4 are closed (or on) is that the power delivery voltage as illustrated in the power delivery period 3802 of FIG. 38 is provided to the plasma load (e.g., across the nodes C to D).

At the end of this period, the switching circuit 3008 switches (S1 and S4 open and S2 and S3 closed), thus appearing as an open circuit to the rails 3050, 3052, such that the rail voltage $V_{AB}$ remains at the process voltage $V_1$. In prior bipolar embodiments, the switching circuit 3008 would merely flip which rail was connected to each output of the switching circuit 3008, thus providing an opposite polarity pulse. Here, however, the first rail 3050 is not coupled to the third switch S3, and instead the charge removal bias circuit 3006 is coupled to the third switch S3. As a result, the charge removal voltage is provided by a voltage tapped from the voltage-boosting circuit 3004 via the voltage path 3054. In this way a charge removal voltage having less magnitude than the process voltage can be provided to the plasma load 3010.

FIGS. 31-36 and 40 will demonstrate various details of the voltage-boosting circuit 3004 embodied as a snubber.

Figure 40:
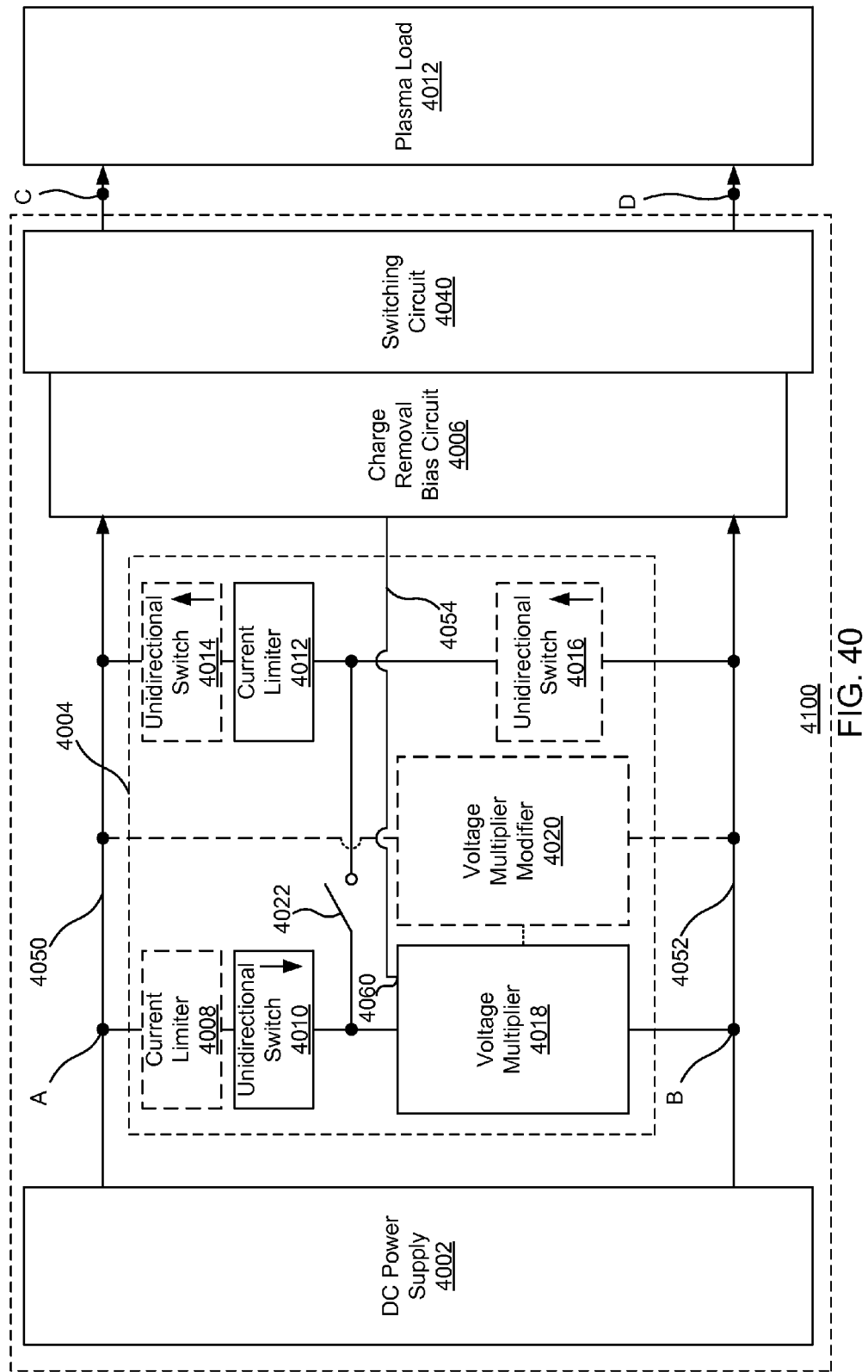
FIG. 40 illustrates an embodiment of details of a voltage-boosting circuit of a pulsed DC power supply system.

FIG. 40 illustrates an embodiment of details of a voltage-boosting circuit 4004 of a pulsed DC power supply system 4000. The voltage-boosting circuit 4004 can be embodied as a non-dissipative snubber as described relative to FIG. 24. Importantly, the voltage-boosting circuit 4004 includes a voltage path 4054 providing a voltage from an output 4060 of the voltage multiplier 4018 to the charge removal bias circuit 4006. The optional voltage multiplier modifier 4020 can be used to reduce a voltage tapped from the voltage multiplier 4018 via the voltage path 4054. The charge removal bias circuit 4006 then uses this voltage to supply the switching circuit 4040. The switching circuit 4040 then flips the polarity of this voltage and passes it to the plasma load 4006 as the charge removal voltage (e.g., a positive voltage as measured from sputtering cathode 2808 to anode 2810).

The voltage-boosting circuit 4004 can comprise a first unidirectional switch 4010, a voltage multiplier 4018, and a first current limiter 4012. The voltage-boosting circuit 4004 can be arranged between a first power rail 4050 and a second power rail 4052, wherein the power rails 4050 and 4052 transfer power from a DC power supply 4002 to a switching circuit 4040, which then selectively provides the rail voltage $V_{AB}$, or a voltage from the charge removal bias circuit 4006, to the plasma load 4012 (e.g., a plasma of a plasma processing chamber). The first unidirectional switch 4010 can be arranged between the first power rail 4050 and the voltage multiplier 4018 and allows current to pass from the first power rail 4050 to the voltage multiplier 4018 (optionally through a current limiter 4008), but prevents current from traveling a reverse path through the unidirectional switch 4010. The first current limiter 4012 can couple the voltage multiplier 4018 to the first power rail 4050 in parallel to the unidirectional switch 4010 and provides a low-loss current path from the voltage multiplier 4018 to the first power rail 4050. The voltage-boosting circuit 4006 may further include a switch 4022 between the voltage multiplier 4018 and the first current limiter 4012, wherein the switch 4022 remains closed during most operations, but is opened when a current in the current limiter 4012 reaches a threshold, and then closes when the current in the current limiter 4012 falls below the threshold.

Figure 31:
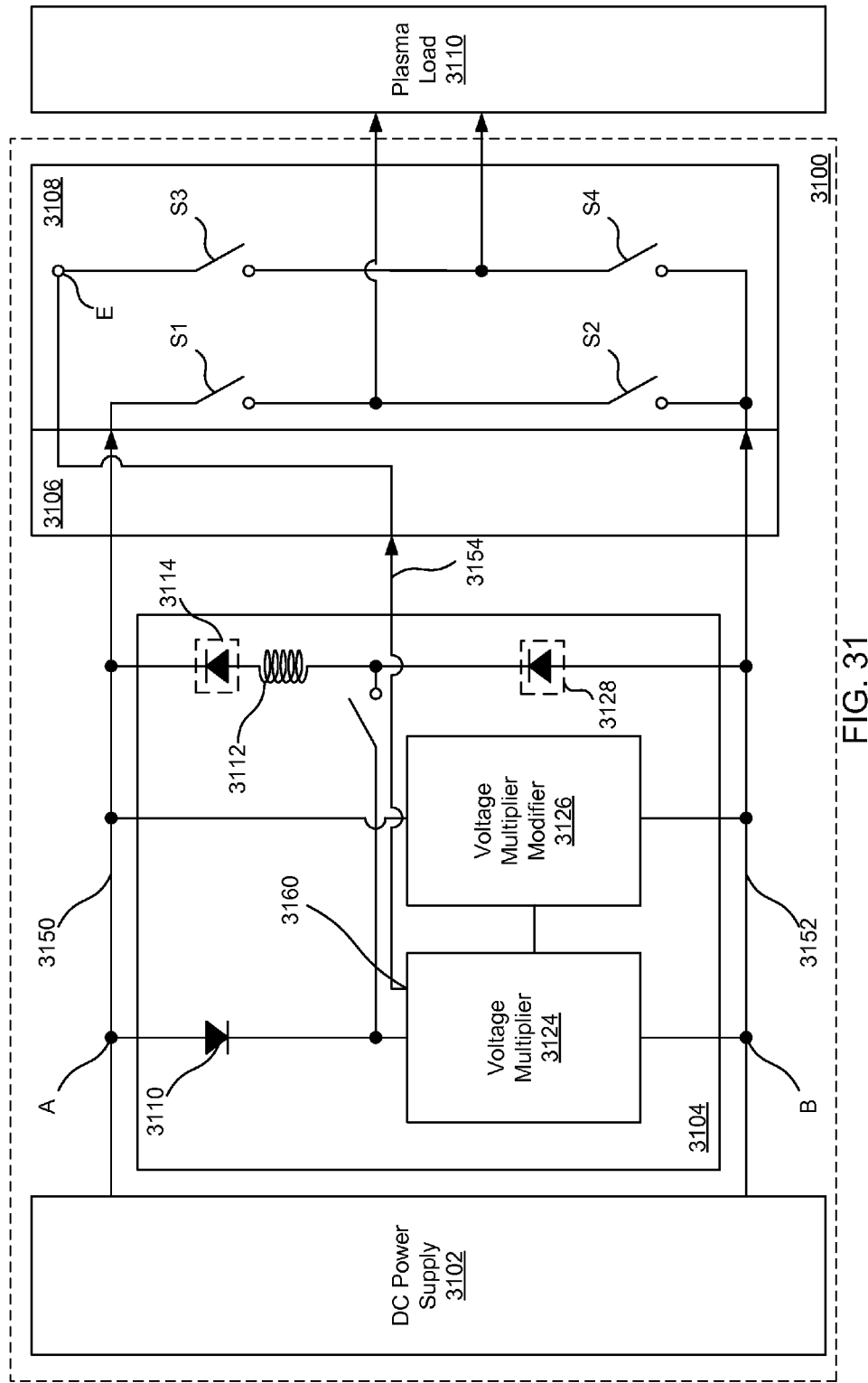
FIG. 31 illustrates one embodiment of the voltage-boosting circuit, charge removal circuit, and charge removal circuit illustrated in FIG. 40.

FIG. 31 illustrates one embodiment of the voltage-boosting circuit, charge removal circuit, and charge removal circuit illustrated in FIG. 40. The unidirectional switch 4010 can be a diode 3110. The optional unidirectional switch 4014 can be optional diode 3114. The current limiter 4012 can be the inductive device 3112 (e.g., an inductor). The optional unidirectional switch 4016 can be optional diode 3128.

The voltage-boosting circuit 3104 can also include a voltage path 3154 from an output 3160 of the voltage multiplier 3124, the voltage path 3154 providing a voltage from the voltage multiplier 3124 to the third switch S3 of the switching circuit 3108 (referenced to the second rail 3152). As seen, when S3 and S2 are closed, the pulsed DC power supply system 3100 provides a reverse of the voltage tapped from the voltage multiplier 3124 to the plasma load 3110 (e.g., the charge removal voltage). When S1 and S4 are closed, the rail voltage $V_{AB}$, comprising either a boosted voltage ($V_1+V_2$) or a process voltage ($V_1$), is provided to the plasma load 3110.

A voltage multiplier modifier 3126 can control the voltage tapped from the voltage multiplier 3124, and in particular can controllably lower the voltage tapped from the voltage multiplier 3124.

Figure 32:
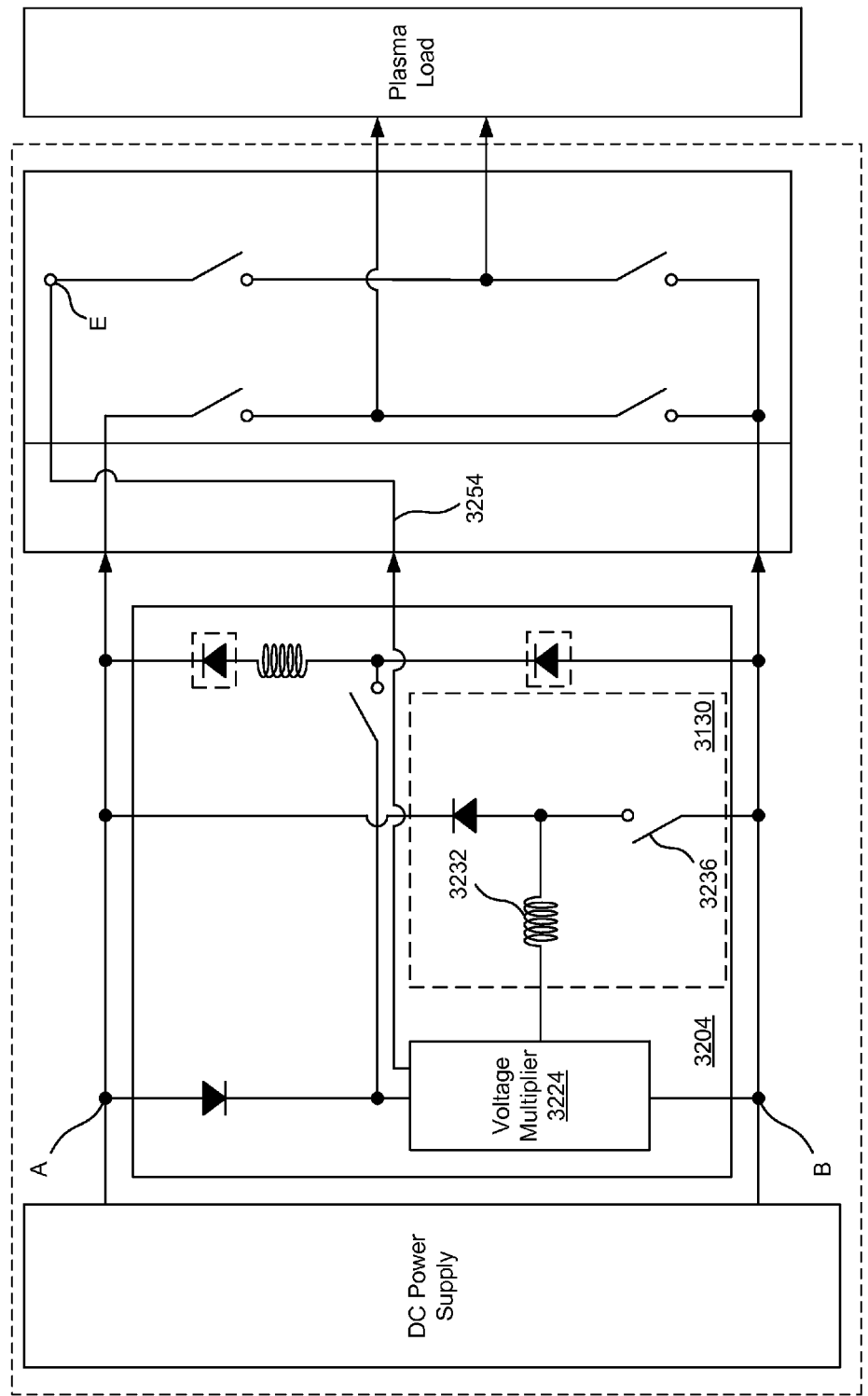
FIG. 32 illustrates details of an embodiment of the voltage multiplier modifier of FIG. 31.

FIG. 32 illustrates details of an embodiment of the voltage multiplier modifier 3126 of FIG. 31. The illustrated components enable the voltage multiplier modifier 3126 to controllably lower the voltage tapped from the voltage multiplier 3224. A duty cycle of a switch 3236 can control an amount of charge removed from the voltage multiplier 3224 (e.g., from a capacitive element) via the inductive element 3232 (e.g., an inductor) thus controlling a voltage that is seen by the voltage path 3254.

FIG. 33 illustrates details of an embodiment of the voltage multiplier 3124 of FIGS. 31 and 32. A voltage stored on the first capacitive element 3308 can be the process voltage $V_1$. A voltage stored on a second capacitive element 3316 can have the magnitude of the boost voltage $V_2$. In this case, since the boost voltage and the charge removal voltage $V_3$ are both tapped from across the second capacitive element 3316, $V_2=V_3$. The voltage multiplier 3124 can also include a first, a second, and optionally a third diode 3318, 3322, 3320. The optional third diode 3320 can have a cathode coupled out of the voltage multiplier 3124 via a second output 3362. A voltage path 3354 can tap voltage across the second capacitive element 3316, thus enabling the charge removal voltage $V_3$ to be less than the process voltage $V_1$. The voltage path 3354 taps voltage via a first output 3360 of the voltage multiplier 3124.

The embodiments shown in FIGS. 30-33 are advantageous in that a minimum number of additional components need be added to the systems described relative to FIGS. 1-27 in order to modify those systems from bipolar to unipolar operation with charge removal.

In some embodiments, there may be a desire for a charge removal voltage $V_3$ that is independent of the boost voltage $V_2$. FIGS. 34-36 present embodiments where the charge removal voltage $V_3$ can be independent of the boost voltage $V_2$. Additionally, FIGS. 34-36 can be used where the voltage-boosting circuit is not used (e.g., it is optional).

FIG. 34 illustrates another embodiment of a pulsed DC power supply system showing details of a charge removal bias circuit and a switching circuit. Here again the voltage for the power delivery period comes from the rail voltage $V_{AB}$ when S1 and S4 are closed. The charge removal voltage $V_3$ on the other hand, is provided via a self-biasing capacitive element 3426 (e.g., a capacitor). When S2 and S3 are closed, the self-biasing capacitive element 3426 is coupled across the plasma load 3410 and absorbs power as the plasma intensifies. Thus, the self-biasing capacitive element 3426 charges and an increased voltage is seen across the self-biasing capacitive element 3426, which in turn is seen across the plasma load 3410. Thus, the charge removal voltage $V_3$ can be said to be generated by the plasma itself. The voltage-boosting circuit 3404 is optional and thus either of the waveforms in FIG. 37 or 38 can be provided to the plasma load 3410.

While the charge removal voltage $V_3$ is independent of a boost voltage $V_2$ (assuming the optional voltage-boosting circuit 3404 is implemented), there is still little control over the actual charge removal voltage $V_3$. FIGS. 35-36 illustrate embodiments where there is greater control over the charge removal voltage $V_3$.

FIG. 35 illustrates a pulsed DC power supply system including a charge removal bias circuit that enables control of the charge removal voltage $V_3$. Here, elements of an embodiment of a boost converter are used along with a capacitive element 3526 in the charge removal bias circuit 3506 so as to remove charge from the capacitive element 3526 and thus control the auto-biased charge removal voltage $V_3$ seen across the plasma load 3510 when S3 and S2 are closed. The charge removal bias circuit 3506 includes an inductive element 3528 (e.g., an inductor), a switch 3530, and a unidirectional switch 3532, such as a diode.

Current in the plasma charges the capacitive element 3526, just as in the auto-biasing topology of FIG. 34. However, here voltage across the capacitive element 3526, and hence the magnitude of the charge removal voltage $|V_3|$, can be controlled via elements resembling a boost converter (although they operate to lower rather than raise a voltage). In particular, a duty cycle of the switch 3530 can control a voltage across the capacitive element 3526.

Charge can be selectively removed from the capacitive element 3526 via the inductive element 3528. An average charge removed from the capacitive element 3526, and hence an average voltage across the capacitive element 3526, is accomplished via decreasing a duty cycle of the switch 3530. Said another way, a duty cycle of the switch 3530 controls a voltage across the capacitive element 3526. When the switch 3530 is closed, current in the inductor 3528 loops through the switch 3530, into the second rail 3552, and back into the capacitive element 3526, thus maintaining charge and voltage across the capacitive element 3526. When the switch 3530 is open, current in the inductive element 3528 exits the charge removal bias circuit 3506 via the unidirectional switch 3532, thus removing charge from and decreasing a voltage across the capacitive element 3526. Again, the voltage-boosting circuit 3504 is optional.

FIG. 36 illustrates an alternative pulsed DC power supply system 3600 enabling the rail voltage $V_{AB}$ to be tapped and down converted for use as the charge removal voltage. Here, the charge removal bias circuit 3606 includes a DC-DC converter 3640 coupled to first and second rails 3650, 3652 and an output coupled to the third switch S3 such that the DC-DC converter generates the voltage $V_{EB}$, which is delivered to the plasma load 3610 as the charge removal voltage $V_3$ (with a reverse polarity to $V_{EB}$). In this way, the DC-DC converter 3640 taps voltage from the rails 3650, 3652, down converts the voltage, and provides the voltage across the plasma load 3610 via S3 and S2, with a polarity opposite to that applied via the first and fourth switches S1, S4. In this fashion, the charge removal voltage $V_3$ can be controllably selected to have any magnitude less than that of the rail voltage $V_{AB}$, and preferably any magnitude less than that of the process voltage $V_1$. The DC-DC converter 3640 can be embodied in any of numerous converter topologies able to down convert DC voltage to a lower DC voltage.

As seen in all of the embodiments illustrated in FIGS. 30-36, the charge removal bias circuits (3006, 3106, 3206, 3306, 3406, 3506, 3606) generate or facilitate delivery of a voltage $V_{EB}$ to the plasma load (3110, 3410, 3510, 3610) via the switches S3 and S2, and $V_{EB}$ constitutes a magnitude of the charge removal voltage $V_3$ applied between the anode (e.g., 2810) and the sputtering cathode (e.g., 2808).

Figure 39:
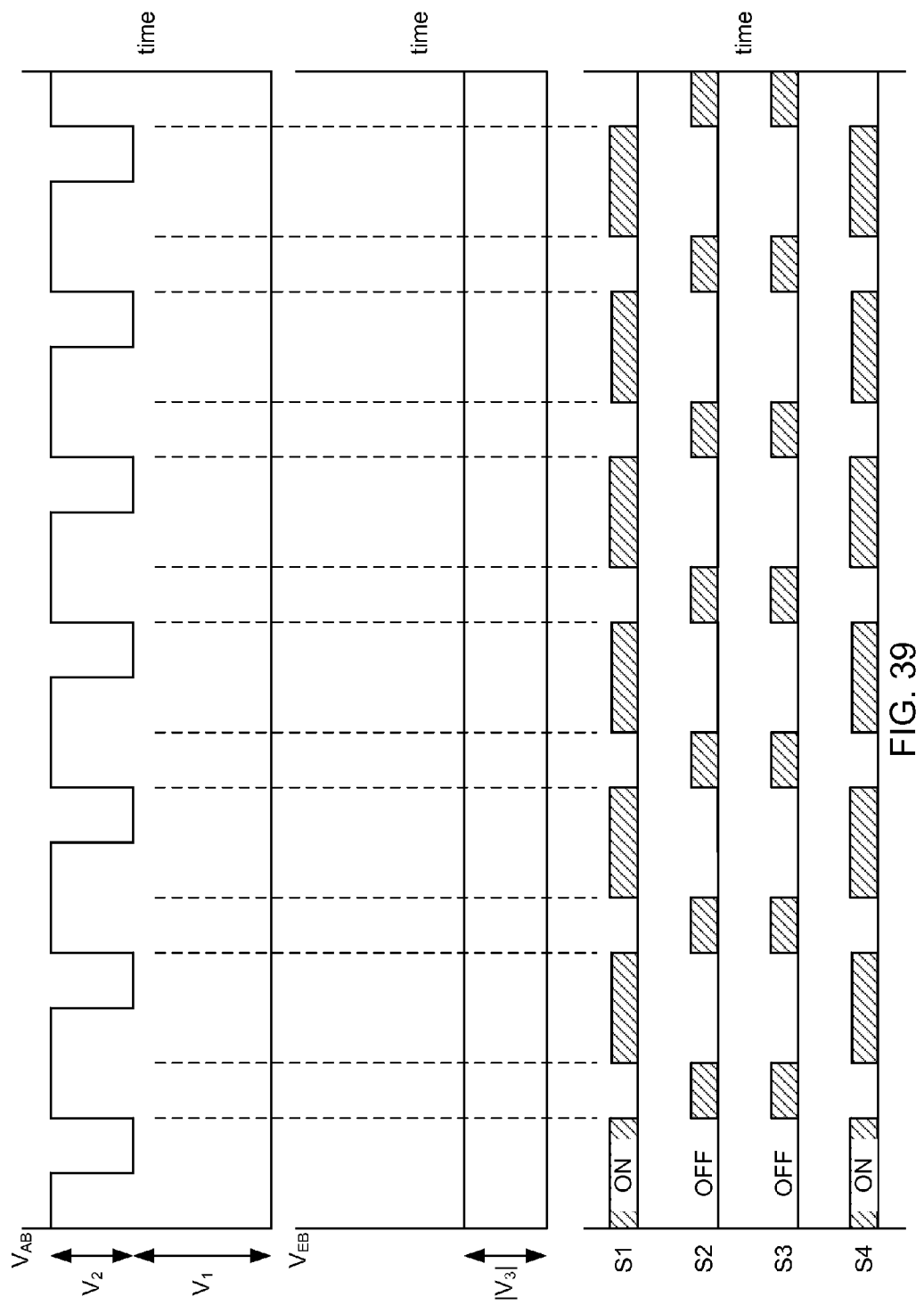
FIG. 39 illustrates waveform diagrams for the rail voltage, $V_{AB}$, and a voltage supplied by the charge removal bias circuit, $V_{EB}$, along with switching diagrams for the switching circuit in embodiments where a voltage-boosting circuit is used.
Figure 41:
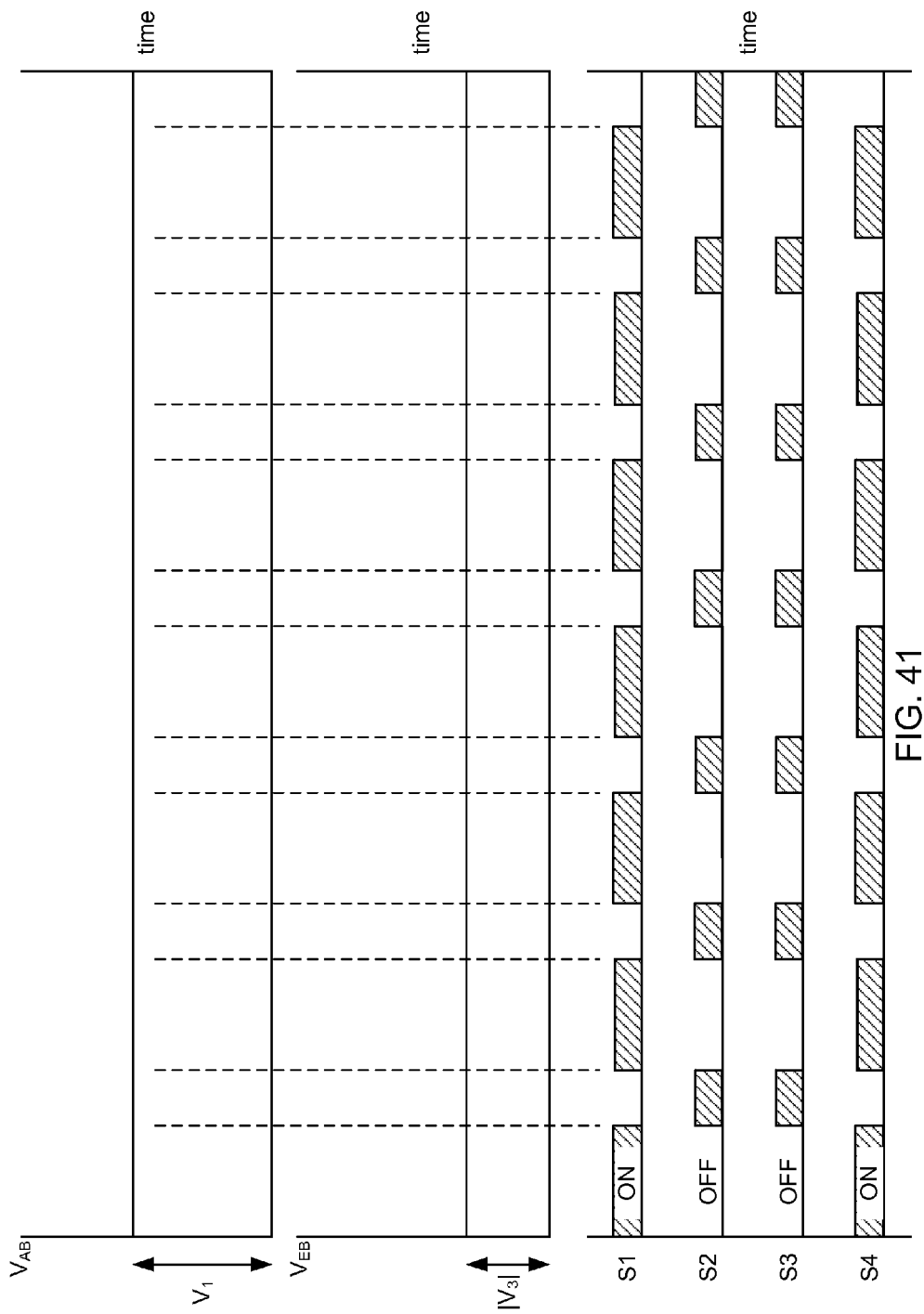
FIG. 41 illustrates waveform diagrams for the rail voltage, $V_{AB}$, and a voltage supplied by the charge removal bias circuit, $V_{EB}$, along with switching diagrams for the switching circuit in embodiments where a voltage-boosting circuit is not used.

FIG. 39 illustrates waveform diagrams for the rail voltage, $V_{AB}$, and a voltage supplied by the charge removal bias circuit, $V_{EB}$, along with switching diagrams for the switching circuit in embodiments where a voltage-boosting circuit is used. FIG. 41 illustrates waveform diagrams for the same voltages, but where a voltage-boosting circuit is not used. The primary difference between FIG. 39 and FIG. 41 is that the rail voltage $V_{AB}$ includes a boost voltage $V_2$ during the charge removal period (when S2 and S3 are on/closed) and during a first portion of the power delivery period (when S1 and S4 are on/closed). $V_{EB}$ can also be considered a positive voltage that the switching circuit applies from the cathode to the anode during the charge removal period, or alternatively, as a magnitude of the voltage applied from the anode to the cathode.

Switching diagrams for all four switches show how S1 and S4 switch in tandem as do S2 and S3. As illustrated, there is no overlap between the two pairs of switches, and there is no transition period between pairs of switches switching. However, in other embodiments, and as discussed earlier, there may be a transition period between switching where all four switches are open (off).

FIG. 39 also shows that when S1 and S4 are closed (on) the rail voltage $V_{AB}$ is applied to the plasma load. When this first happens the plasma can be extinct or nearly extinct and have a very high impedance such that current from the DC power supply charges the voltage-boosting circuit to a boosted voltage ($V_{AB}=V_1+V_2$). As the plasma increases in density, the rail voltage $V_{AB}$ drops until it reaches the processing voltage $V_1$ and then maintains the processing voltage $V_1$ until switching occurs. Upon switching, the plasma again approaches extinction or reaches extinction and current is funneled into the voltage-boosting circuit. Once again the voltage-boosting circuit charges up and raises the rail voltage $V_{AB}$ by a boost voltage $V_2$. S2 and S3 are only on for a short time before switching again occurs. In other words, S1 and S4 have a greater duty cycle than S2 and S3. Since the voltage-boosting circuit has not discharged during this short period and the plasma remains at or near extinction, the rail voltage $V_{AB}$ remains at the boosted voltage $V_1+V_2$. This pattern continues during processing.

As for the voltage provided by the charge removal circuit $V_{EB}$, it remains nearly constant throughout processing and regardless of switching. Small variations in voltage (not illustrated) can occur since switched-mode converters are sometimes used to control the voltage $V_{EB}$ (e.g., FIG. 35-37).

As noted earlier, while this discussion has focused on embodiments where a single pulsed DC power supply system powers a single sputtering cathode-anode pair, in other embodiments, multiple sputtering cathode-anode pairs can be implemented. In some cases, a single pulsed DC power supply system can provide pulsed DC power to each sputtering cathode-anode pair, while in other embodiments, there may be a separate pulsed DC power supply system for each pair.

In one embodiment, the use of a plurality of pulsed DC power supply systems each feeding one of a plurality of sputtering cathode-anode pairs, can be paired with different boost voltages $V_2$ to each electrode pair so as to effectuate a desired processing effect including a desired film property (e.g., optical characteristic, resistance, and stress) or processing characteristic (e.g., sputtering rate). For instance, an embodiment could include a first pulsed DC power supply system providing a first pulsed DC power to a first sputtering cathode and a first anode, the first pulsed DC power having a first boost voltage $V_2$, and a second pulsed DC power supply system providing a second pulsed DC power to a second sputtering cathode and a second anode, the second pulsed DC power having a second boost voltage $V_2$. In another embodiment, the first boost voltage $V_2$ can be provided to a first sputtering cathode while the second boost voltage $V_2'$ can be provided to a second sputtering cathode. The first and second sputtering cathodes can be adjacent to each other (e.g., no targets or electrodes separate the first and second sputtering cathodes). $V_2$ and $V_{2'}$ can be non-equal and thus effectuate a desired processing effect. In this way, not only can different process voltages, different duty cycles, and different frequencies be applied to different electrodes, but additional control over the boost voltages to different sputtering cathode-anode pairs is now possible.

For all of the above-noted embodiments, the duty cycle and frequency of the applied pulses may be adjusted to control film growth properties. For example, film growth can be modified by the average and peak power density on a sputtering cathode. And the off time of the plasma may also affect the growth. As another example, frequency can be adjusted in order to reduce an arc rate in the plasma processing chamber. As a consequence, the duty cycle and frequency variability enabled by this architecture can be optimized for desired film growth and properties such as stress, optical transmission, and resistance to name a few non-limiting examples.

In some embodiments, voltage and current can be sensed at nodes C and D (at the outputs 2912, 2914 of the pulsed DC power supply system 2900 in FIG. 29), and such measurements can be used to monitor changes in plasma impedance, which is indicative of various processing effects (e.g., film properties and sputtering rate). This indirect monitoring of processing effects can be utilized as an input to control the boost voltage $V_2$ to different pairs of cathodes and anodes. It can also be used to adjust the frequency and/or duty cycle of one or more sputtering cathode-anode pairs in order to arrive at one or more desired processing effects.

Figure 42:
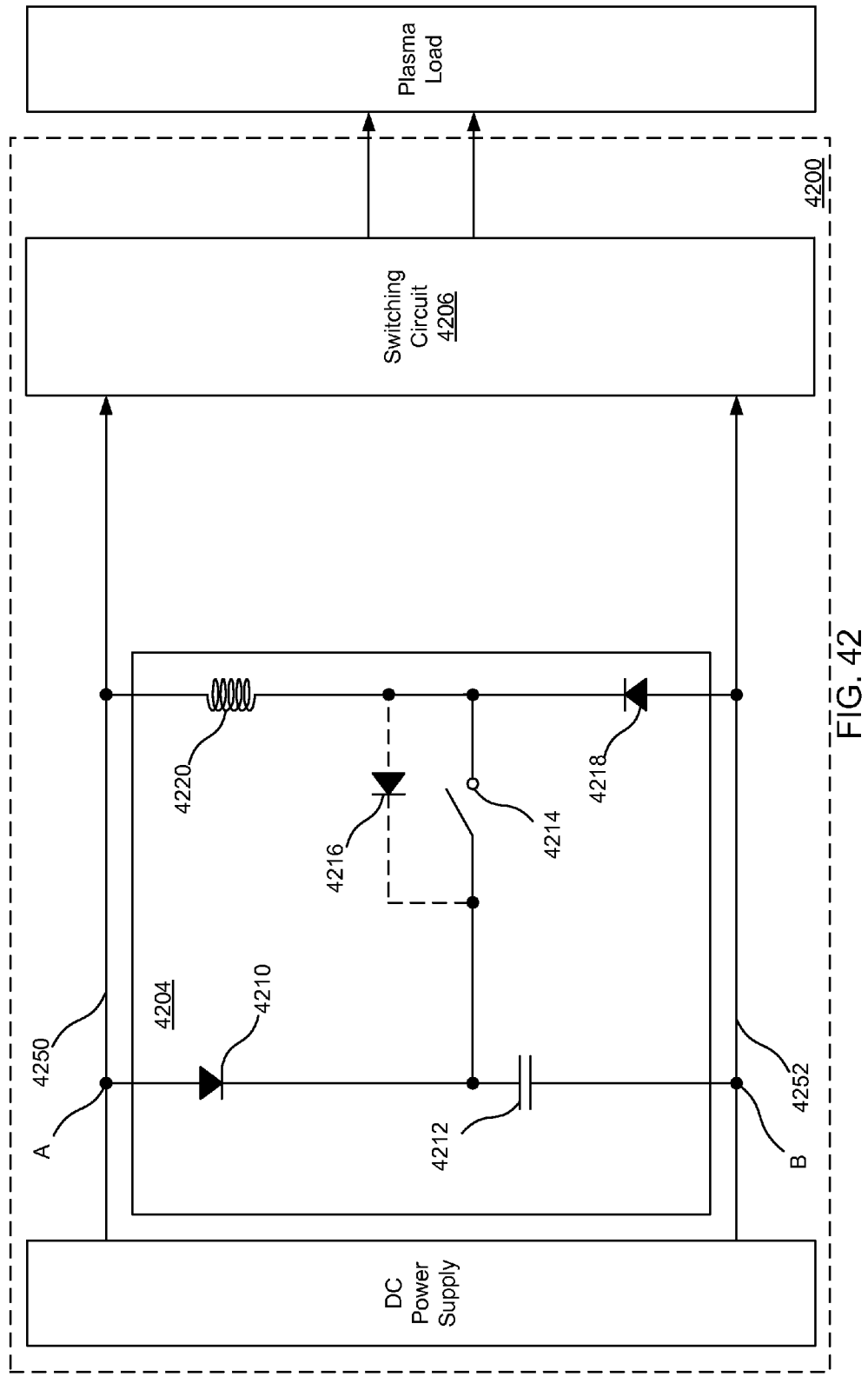
FIG. 42 illustrates an alternative topology for a voltage-boosting circuit.

FIG. 42 illustrates an alternative topology for a voltage-boosting circuit of a pulsed DC power supply system. The voltage-boosting circuit 4204 can have functionality of a snubber and can be used to both boost the rail voltage $V_{AB}$ as well as to absorb current and/or power from a DC power supply providing power to the rails 4250, 4252. The voltage-boosting circuit 4204 includes a first diode 4210, a capacitor 4212, a switch 4214, a second optional diode 4216, a third diode 4218, and an inductor 4220. Unlike other voltage-boosting circuits having snubber functionality, here the switch 4214 remains open (off) until the capacitor 4212 charges to a desired boosted voltage ($V_1+V_2$). Other voltage-boosting circuits can be limited to a boosted voltage equal to twice the process voltage ($V_1$) and greater than twice the average rail voltage $V_{AB}$. Because the switch 4214 of the illustrated voltage-boosting circuited 4204 can be left open indefinitely, the capacitor 4212 can charge to greater than twice the process voltage ($V_1$) and greater than twice the average rail voltage $V_{AB}$. Charge and voltage on the capacitor 4212 is in part a function of a duty cycle of the switch 4214. Also, a maximum voltage $V_{AB}$ is equal to an average process voltage divided by a duty cycle of the switch 4214.

When the switching circuit 4206 switches and plasma impedance rises, so does the rail voltage $V_{AB}$. This rise in rail voltage $V_{AB}$ forward biases the first diode 4210 allowing current to run into the capacitor 4212 and charge the voltage across the capacitor 4212. When the switch 4214 is open (off) the capacitor 4212 can be charged as long as the rail voltage $V_{AB}$ is greater than the capacitor 4212 voltage plus a diode voltage drop across the first diode 4210. The capacitor 4212 voltage can therefore be charged to voltages greater than twice a process voltage $V_1$ and twice an average rail voltage $V_{AB}$.

When the switch 4214 is closed (on) the capacitor 4212 discharges through inductor 4220 limiting the instantaneous rail voltage $V_{AB}$ to the average process voltage. As the capacitor 4212 discharges, the instantaneous rail voltage $V_{AB}$ decreases until the instantaneous rail voltage $V_{AB}$ is lower than a voltage across the capacitor 4212, at which point the first diode 4210 becomes reverse biased and current ceases to charge the capacitor 4212. The rail voltage $V_{AB}$ then remains at this voltage, a process voltage $V_1$, until switching occurs and the plasma impedance again rises and forward biases the first diode 4210. When the switch 4214 opens, the third diode 4218 provides a current path to the inductor 4220 to enable current to continue flowing through the inductor 4220 as the current ramps down.

One of skill in the art will recognize that the voltage-boosting circuit 4204 can be implemented for the voltage-boosting circuits and snubbers described with reference to FIGS. 1-42.

Figure 43:
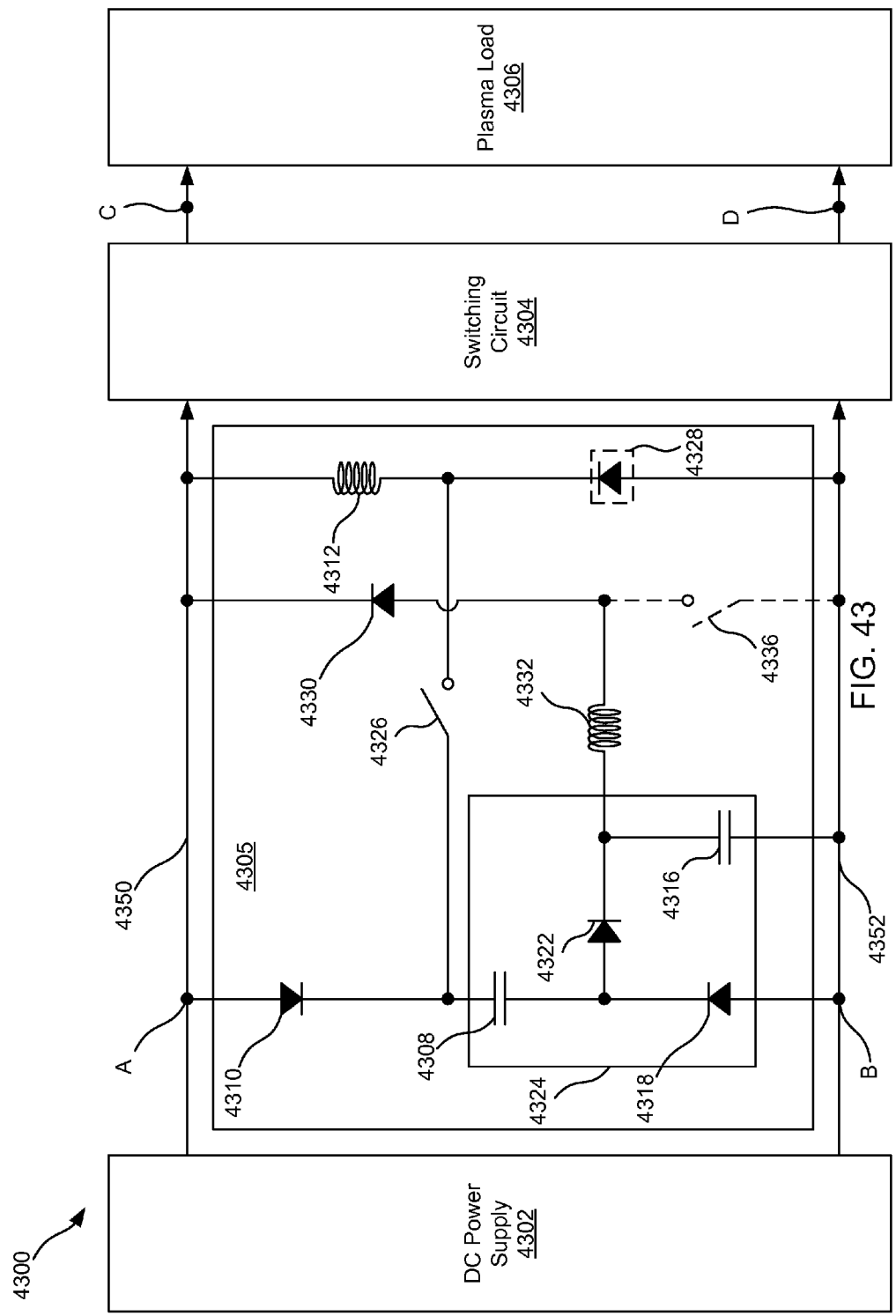
FIG. 43 illustrates another embodiment of a voltage boosting circuit having snubber functionality.

FIG. 43 illustrates another embodiment of a voltage-boosting circuit 4305 having snubber functionality. The voltage-boosting circuit 4305 includes a first diode 4310, a first switch 4326, a second and optional switch 4336, a first inductor 4312, a second inductor 4332, a second diode 4330, a third and optional diode 4328, and a voltage multiplier 4324. The voltage multiplier 4324 includes a first capacitor 4308, a second capacitor 4316, a fourth diode 4318, and a fifth diode 4322.

The optional second switch 4336 is typically open, or in its absence, the second inductor 4332 is merely coupled to a first rail 4350 via the second diode 4330. The first switch 4326 typically is closed (on).

When the switching circuit 4304 switches, the plasma impedance rises as does the rail voltage $V_{AB}$, which forward biases the first diode 4310 and sends current into the voltage multiplier 4324. In particular, the current charges the first capacitor 4308 and charges the second capacitor 4316. Both capacitors 4308, 4316 charge until an average rail voltage $V_{AB}$ is seen across each capacitor 4308, 4316.

Although the capacitors 4308, 4316 each charge to the average rail voltage $V_{AB}$, they can see instantaneous voltage in excess of the average rail voltage $V_{AB}$, and for safety, there is a desire to mitigate these overvoltages. This is where the optional second switch 4336 can be used. The optional second switch 4336 can operate according to a hysteresis control algorithm. The optional second switch 4336 can close when a voltage across the second capacitor 4316 rises above a maximum voltage threshold $V_{max}$. In an alternative, the second optional switch 4336 can begin switching at a defined duty cycle configured to lower a voltage across the second capacitor 4316. Alternatively, the second optional switch 4336 may already be switching when the voltage across the second capacitor 4316 rises above the maximum voltage threshold $V_{max}$. In this case the second optional switch 4336 can increase its duty cycle so as to lower the voltage across the second capacitor 4316.

Whichever of these methods is implemented, the second optional switch 4336 persists in operation (e.g., closed, defined duty cycle, or an increased duty cycle) until the voltage across the second capacitor 4316 falls below a minimum voltage threshold $V_{min}$. The second optional switch 4336 can then open or decrease its duty cycle. The second optional switch 4336 can remain open or maintain the decreased duty cycle until the voltage again exceeds the maximum voltage threshold $V_{max}$. This overvoltage hysteresis control prevents transient voltages from damaging the electronics or generating unwanted high energy ions in the plasma.

The value $V_{max}-V_{min}$ defines the duty cycle and/or frequency of the second optional switch 4336 as a multiple of the double of the second optional switch 4336, because the first and second capacitors 4308, 4316 are only charged during a first portion of each pulse from the switching circuit 4304, when the plasma has a high impedance and thus cannot draw the full current delivered from the DC power supply 4302, the first inductor 4312, and the second inductor 4332. The duty cycle and/or frequency can be established or determined as the average voltage as follows: $V_{AB}/((V_{max}+Vmin)/2)$.

A voltage sensor (not illustrated) can monitor a voltage across the second capacitor 4316 and provide feedback to a control of the optional second switch 4336 to control opening and closing of the optional second switch 4336 or a duty cycle of the optional second switch 4336. In other words, the optional second switch 4336 can open and close, or have a duty cycle, responsive to feedback from a voltage sensor monitoring the voltage across the second capacitor 4316.

The same control method can be used to control the switch 4326 limiting the maximum voltage $V_{AB}$ and to provide protection for snubber 4305 and switching circuit 4304.

Various switches are illustrated in FIGS. 29-36, 40, and 42-43, but controllers or other control components and connections for these switches are not illustrated in order to simplify the figures. However, the non-illustrated controllers or other control components and connections can include at least one non-transitory tangible computer readable storage medium comprising instructions for controlling switching the one or more switches. Such control can be periodic with a given duty cycle, such as that illustrated in FIG. 39 or 41, or can be less periodic and responsive to voltage, current, or other electrical characteristics, for example. Whatever, the switching scheme, the result is to effect the methods described above relative to providing pulsed DC voltage across a plasma load.

Figure 27:
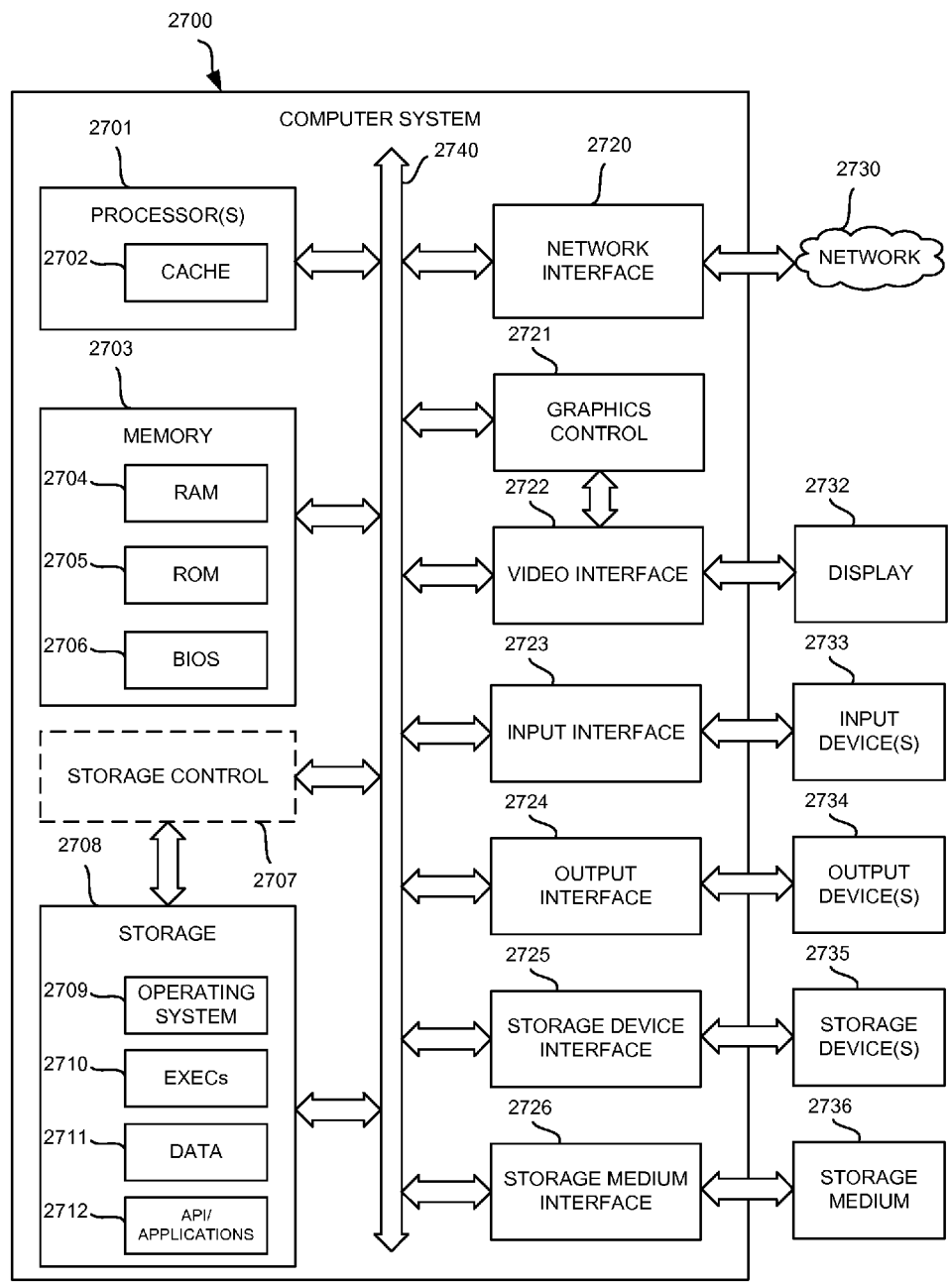
FIG. 27 shows a diagrammatic representation of one embodiment of a machine in the exemplary form of a computer system.

The systems and methods described herein can be implemented in a computer system in addition to the specific physical devices described herein. FIG. 27 shows a diagrammatic representation of one embodiment of a computer system 2700 within which a set of instructions can execute for causing a device to perform or execute any one or more of the aspects and/or methodologies of the present disclosure. The non-illustrated controllers or other control components described above are one implementation of the computer system 2700. The components in FIG. 27 are examples only and do not limit the scope of use or functionality of any hardware, software, firmware, embedded logic component, or a combination of two or more such components implementing particular embodiments of this disclosure. Some or all of the illustrated components can be part of the computer system 2700. For instance, the computer system 2700 can be a general purpose computer (e.g., a laptop computer) or an embedded logic device (e.g., an FPGA), to name just two non-limiting examples.

Computer system 2700 can include at least one processor 2701 such as a central processing unit (CPU) or an FPGA to name two non-limiting examples. The computer system 2700 may also comprise a memory 2703 and a storage 2708, both communicating with each other, and with other components, via a bus 2740. The bus 2740 may also link a display 2732, one or more input devices 2733 (which may, for example, include a keypad, a keyboard, a mouse, a stylus, etc.), one or more output devices 2734, one or more storage devices 2735, and various non-transitory, tangible computer-readable storage media 2736 with each other and with one or more of the processor 2701, the memory 2703, and the storage 2708. All of these elements may interface directly or via one or more interfaces or adaptors to the bus 2740. For instance, the various non-transitory, tangible computer-readable storage media 2736 can interface with the bus 2740 via storage medium interface 2726. Computer system 2700 may have any suitable physical form, including but not limited to one or more integrated circuits (ICs), printed circuit boards (PCBs), mobile handheld devices (such as mobile telephones or PDAs), laptop or notebook computers, distributed computer systems, computing grids, or servers.

Processor(s) 2701 (or central processing unit(s) (CPU(s))) optionally contains a cache memory unit 2702 for temporary local storage of instructions, data, or computer addresses. Processor(s) 2701 are configured to assist in execution of computer-readable instructions stored on at least one non-transitory, tangible computer-readable storage medium. Computer system 2700 may provide functionality as a result of the processor(s) 2701 executing software embodied in one or more non-transitory, tangible computer-readable storage media, such as memory 2703, storage 2708, storage devices 2735, and/or storage medium 2736 (e.g., read only memory (ROM)). For instance, methods of operating the switches and DC power supplies in FIGS. 29-36, 40, and 42-43 may be embodied in one or more non-transitory, tangible computer-readable storage media. The non-transitory, tangible computer-readable storage media may store software that implements particular embodiments, such as the methods of operating the switches and DC power supplies in FIGS. 29-36, 40, and 42-43, and processor(s) 2701 may execute the software. Memory 2703 may read the software from one or more other non-transitory, tangible computer-readable storage media (such as mass storage device(s) 2735, 2736) or from one or more other sources through a suitable interface, such as network interface 2720. For instance, the switches and DC power supplies in FIGS. 29-36, 40, and 42-43 may be remotely interfaced with via a network interface such as 2720. The software may cause processor(s) 2701 to carry out one or more processes or one or more steps of one or more processes described or illustrated herein. Carrying out such processes or steps may include defining data structures stored in memory 2703 and modifying the data structures as directed by the software. In some embodiments, an FPGA can store instructions for carrying out functionality as described in this disclosure (e.g., the methods of operating the switches and DC power supplies in FIGS. 29-36, 40, and 42-43). In other embodiments, firmware includes instructions for carrying out functionality as described in this disclosure (e.g., the methods of operating the switches and DC power supplies in FIGS. 29-36, 40, and 42-43).

The memory 2703 may include various components (e.g., non-transitory, tangible computer-readable storage media) including, but not limited to, a random access memory component (e.g., RAM 2704) (e.g., a static RAM "SRAM", a dynamic RAM "DRAM, etc.), a read-only component (e.g., ROM 2705), and any combinations thereof. ROM 2705 may act to communicate data and instructions unidirectionally to processor(s) 2701, and RAM 2704 may act to communicate data and instructions bidirectionally with processor(s) 2701. ROM 2705 and RAM 2704 may include any suitable non-transitory, tangible computer-readable storage media described below. In some instances, ROM 2705 and RAM 2704 include non-transitory, tangible computer-readable storage media for carrying out the methods of operating the switches and DC power supplies in FIGS. 29-36, 40, and 42-43. In one example, a basic input/output system 2706 (BIOS), including basic routines that help to transfer information between elements within computer system 2700, such as during start-up, may be stored in the memory 2703.

Fixed storage 2708 is connected bidirectionally to processor(s) 2701, optionally through storage control unit 2707. Fixed storage 2708 provides additional data storage capacity and may also include any suitable non-transitory, tangible computer-readable media described herein. Storage 2708 may be used to store operating system 2709, EXECs 2710 (executables), data 2711, API applications 2712 (application programs), and the like. For instance, the storage 2708 could be implemented for storage of thresholds used to trigger switching of the switch 4022 in FIG. 40. Often, although not always, storage 2708 is a secondary storage medium (such as a hard disk) that is slower than primary storage (e.g., memory 2703). Storage 2708 can also include an optical disk drive, a solid-state memory device (e.g., flash-based systems), or a combination of any of the above. Information in storage 2708 may, in appropriate cases, be incorporated as virtual memory in memory 2703.

In one example, storage device(s) 2735 may be removably interfaced with computer system 2700 (e.g., via an external port connector (not shown)) via a storage device interface 2725. Particularly, storage device(s) 2735 and an associated machine-readable medium may provide nonvolatile and/or volatile storage of machine-readable instructions, data structures, program modules, and/or other data for the computer system 2700. In one example, software may reside, completely or partially, within a machine-readable medium on storage device(s) 2735. In another example, software may reside, completely or partially, within processor(s) 2701.

Bus 2740 connects a wide variety of subsystems. Herein, reference to a bus may encompass one or more digital signal lines serving a common function, where appropriate. Bus 2740 may be any of several types of bus structures including, but not limited to, a memory bus, a memory controller, a peripheral bus, a local bus, and any combinations thereof, using any of a variety of bus architectures. As an example and not by way of limitation, such architectures include an Industry Standard Architecture (ISA) bus, an Enhanced ISA (EISA) bus, a Micro Channel Architecture (MCA) bus, a Video Electronics Standards Association local bus (VLB), a Peripheral Component Interconnect (PCI) bus, a PCI-Express (PCI-X) bus, an Accelerated Graphics Port (AGP) bus, HyperTransport (HTX) bus, serial advanced technology attachment (SATA) bus, and any combinations thereof.

Computer system 2700 may also include an input device 2733. In one example, a user of computer system 2700 may enter commands and/or other information into computer system 2700 via input device(s) 2733. Examples of an input device(s) 2733 include, but are not limited to, an alpha-numeric input device (e.g., a keyboard), a pointing device (e.g., a mouse or touchpad), a touchpad, a joystick, a gamepad, an audio input device (e.g., a microphone, a voice response system, etc.), an optical scanner, a video or still image capture device (e.g., a camera), and any combinations thereof. Input device(s) 2733 may be interfaced to bus 2740 via any of a variety of input interfaces 2723 (e.g., input interface 2723) including, but not limited to, serial, parallel, game port, USB, FIREWIRE, THUNDERBOLT, or any combination of the above.

In particular embodiments, when computer system 2700 is connected to network 2730, computer system 2700 may communicate with other devices, such as mobile devices and enterprise systems, connected to network 2730. Communications to and from computer system 2700 may be sent through network interface 2720. For example, network interface 2720 may receive incoming communications (such as requests or responses from other devices) in the form of one or more packets (such as Internet Protocol (IP) packets) from network 2730, and computer system 2700 may store the incoming communications in memory 2703 for processing. Computer system 2700 may similarly store outgoing communications (such as requests or responses to other devices) in the form of one or more packets in memory 2703 and communicated to network 2730 from network interface 2720. Processor(s) 2701 may access these communication packets stored in memory 2703 for processing.

Examples of the network interface 2720 include, but are not limited to, a network interface card, a modem, and any combination thereof. Examples of a network 2730 or network segment 2730 include, but are not limited to, a wide area network (WAN) (e.g., the Internet, an enterprise network), a local area network (LAN) (e.g., a network associated with an office, a building, a campus or other relatively small geographic space), a telephone network, a direct connection between two computing devices, and any combinations thereof. A network, such as network 2730, may employ a wired and/or a wireless mode of communication. In general, any network topology may be used.

Information and data can be displayed through a display 2732. Examples of a display 2732 include, but are not limited to, a liquid crystal display (LCD), an organic liquid crystal display (OLED), a cathode ray tube (CRT), a plasma display, and any combinations thereof. The display 2732 can interface to the processor(s) 2701, memory 2703, and fixed storage 2708, as well as other devices, such as input device(s) 2733, via the bus 2740. The display 2732 is linked to the bus 2740 via a video interface 2722, and transport of data between the display 2732 and the bus 2740 can be controlled via the graphics control 2721.

In addition to a display 2732, computer system 2700 may include one or more other peripheral output devices 2734 including, but not limited to, an audio speaker, a printer, and any combinations thereof. Such peripheral output devices may be connected to the bus 2740 via an output interface 2724. Examples of an output interface 2724 include, but are not limited to, a serial port, a parallel connection, a USB port, a FIREWIRE port, a THUNDERBOLT port, and any combinations thereof.

In addition or as an alternative, computer system 2700 may provide functionality as a result of logic hardwired or otherwise embodied in a circuit, which may operate in place of or together with software to execute one or more processes or one or more steps of one or more processes described or illustrated herein. Reference to software in this disclosure may encompass logic, and reference to logic may encompass software. Moreover, reference to a non-transitory, tangible computer-readable medium may encompass a circuit (such as an IC) storing software for execution, a circuit embodying logic for execution, or both, where appropriate. The present disclosure encompasses any suitable combination of hardware, software, or both.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Within this specification, the same reference characters are used to refer to terminals, signal lines, wires, etc. and their corresponding signals. In this regard, the terms "signal," "wire," "connection," "terminal," and "pin" may be used interchangeably, from time-to-time, within the this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, or microcontroller. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein (e.g., the methods of operating the switches and DC power supplies in FIGS. 29-36, 40, and 42-43) may be embodied directly in hardware, in a software module executed by a processor, a software module implemented as digital logic devices, or in a combination of these. A software module may reside in RAM memory, flash memory, ROM memory, EPROM memory, EEPROM memory, registers, hard disk, a removable disk, a CD-ROM, or any other form of non-transitory, tangible computer-readable storage medium known in the art. An exemplary non-transitory, tangible computer-readable storage medium is coupled to the processor such that the processor can read information from, and write information to, the non-transitory, tangible computer-readable storage medium. In the alternative, the non-transitory, tangible computer-readable storage medium may be integral to the processor. The processor and the non-transitory, tangible computer-readable storage medium may reside in an ASIC. The ASIC may reside in a user terminal. In the alternative, the processor and the non-transitory, tangible computer-readable storage medium may reside as discrete components in a user terminal. In some embodiments, a software module may be implemented as digital logic components such as those in an FPGA once programmed with the software module.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A pulsed DC power supply system configured to provide pulsed DC voltage between an anode and a cathode of a plasma processing chamber, the pulsed DC voltage including a first power delivery period of positive voltage separated from a second power delivery period by a charge removal period comprising a charge removal voltage having a negative polarity for removing charge from the cathode, the pulsed DC power supply system comprising:
a DC power supply coupled to and providing power to a first and second rail;
a switching circuit coupled to the first and second rails and switched so as to convert the power on the first and second rails to the pulsed DC voltage, where positive voltage is referenced from the anode to the cathode;
a voltage-boosting circuit coupled between the first and second rails and comprising:
a first unidirectional switch coupled between the first rail and a first electrical node and only allowing current to pass from the first rail to the first electrical node;
a voltage multiplier coupled between the second rail and the first electrical node and including an output that provides access to a charge removal voltage within the voltage multiplier;
a switch coupled between the first electrical node and a second electrical node;
a first current limiter coupled between the second electrical node and the first rail; and
a charge removal bias circuit coupled to the output of the voltage multiplier and providing the charge removal voltage to the switching circuit.

2. The pulsed DC power supply of claim 1, wherein the switching circuit includes first, second, third, and fourth switches of the switching circuit arranged in an h-bridge topology such that when the first and fourth switches of the switching circuit are closed the positive voltage is applied from the anode to the cathode, and when the second and third switches of the switching circuit are closed the negative charge removal voltage is applied from the anode to the cathode.

3. The pulsed DC power supply of claim 2, wherein the charge removal circuit couples the output of the voltage multiplier to the third switch of the switching circuit, thereby providing the charge removal voltage to the third switch of the switching circuit.

4. The pulsed DC power supply of claim 3, wherein the voltage multiplier comprises at least two capacitive elements arranged in series relative to current passing from the first rail through the first unidirectional switch and arranged in parallel relative to current discharged from the at least two capacitive elements.

5. The pulsed DC power supply of claim 4, wherein the first of the at least two capacitive elements is coupled so as to discharge via the first electrical node, the switch of the voltage-boosting circuit, and the first current limiter to the first rail, and wherein the second of the at least two capacitive elements is coupled so as to discharge via the output of the voltage multiplier to the third switch of the switching circuit, the output of the voltage multiplier providing a voltage across the second of these at least two capacitive elements.

6. The pulsed DC power supply of claim 1, further comprising a second current limiter coupled between the first rail and the first unidirectional switch.

7. The pulsed DC power supply of claim 5, further comprising a second unidirectional switch coupled between the first current limiter and the first rail, wherein the second unidirectional switch only allows current to pass from the first current limiter to the first rail.

8. The pulsed DC power supply of claim 1, wherein the switching circuit delivers positive voltage from the anode to the cathode for longer periods of time than the switching circuit delivers a negative voltage from the anode to the cathode.

9. The pulsed DC power supply of claim 1, wherein a magnitude of the charge removal voltage applied during the charge removal period is less than a magnitude of the positive voltage applied during the power delivery period.

10. The pulsed DC power supply of claim 1, wherein the pulsed DC voltage includes, at different times, a boosted voltage, a process voltage, and a charge removal voltage having an opposite polarity to the boosted voltage and the process voltage, where the boosted voltage is the process voltage plus a boost voltage.

11. The pulsed DC power supply of claim 1, wherein the switching circuit comprises one or more h-bridge cells coupled in parallel.

12. The pulsed DC power supply of claim 1, wherein the cathode is both an electrode and a sputtering target, and the anode is not a sputtering target.

13. A pulsed DC power supply system comprising:
a DC power supply coupled to and providing power to a first and second rail;
a switching circuit coupled to the first and second rails and switched so as to convert the power on the first and second rails to a pulsed DC voltage;
a voltage-boosting circuit coupled between the first and second rails and comprising:
a first unidirectional switch coupled between the first rail and a first electrical node and only allowing current to pass from the first rail to the first electrical node;
a voltage multiplier coupled between the second rail and the first electrical node and including an output that provides access to a negative charge removal voltage within the voltage multiplier;
a switch coupled between the first electrical node and a second electrical node;
a first current limiter coupled between the second electrical node and the first rail; and
a charge removal bias circuit coupled to at least the second rail and the switching circuit and providing the negative charge removal voltage to the switching circuit.

14. The pulsed DC power supply of claim 13, wherein the switching circuit includes first, second, third, and fourth switches of the switching circuit arranged in an h-bridge topology such that when the first and fourth switches of the switching circuit are closed, a positive voltage is applied across the first and second rails, and when the second and third switches of the switching circuit are closed, the negative charge removal voltage is applied across the first and second rails.

15. The pulsed DC power supply of claim 14, wherein the charge removal circuit couples the output of the voltage multiplier to the third switch of the switching circuit, thereby providing the negative charge removal voltage to the third switch of the switching circuit.

16. The pulsed DC power supply of claim 15, wherein the voltage multiplier comprises at least two capacitive elements arranged in series relative to current passing from the first rail through the first unidirectional switch and arranged in parallel relative to current discharged from the at least two capacitive elements.

17. The pulsed DC power supply of claim 16, wherein the first of the at least two capacitive elements is coupled so as to discharge via the first electrical node, the switch of the voltage-boosting circuit, and the first current limiter to the first rail, and wherein the second of the at least two capacitive elements is coupled so as to discharge via the output of the voltage multiplier to the third switch of the switching circuit, the output of the voltage multiplier providing a voltage across the second of these at least two capacitive elements.

18. The pulsed DC power supply of claim 13, further comprising a second current limiter coupled between the first rail and the first unidirectional switch.

19. The pulsed DC power supply of claim 17, further comprising a second unidirectional switch coupled between the first current limiter and the first rail, wherein the second unidirectional switch only allows current to pass from the first current limiter to the first rail.

20. The pulsed DC power supply of claim 13, wherein the switching circuit delivers positive voltage across the first and second rails for longer periods of time than the switching circuit delivers a negative voltage across the first and second rails.

21. The pulsed DC power supply of claim 13, wherein the switching circuit comprises one or more h-bridge cells coupled in parallel.

* * * * *